(12) United States Patent
Tokiwa

(10) Patent No.: US 11,942,158 B2
(45) Date of Patent: *Mar. 26, 2024

(54) SEMICONDUCTOR MEMORY DEVICE

(71) Applicant: KIOXIA CORPORATION, Tokyo (JP)

(72) Inventor: Naoya Tokiwa, Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/071,470

(22) Filed: Nov. 29, 2022

(65) Prior Publication Data

US 2023/0118624 A1    Apr. 20, 2023

Related U.S. Application Data

(63) Continuation of application No. 17/181,998, filed on Feb. 22, 2021, now Pat. No. 11,551,760, which is a continuation of application No. 16/802,446, filed on Feb. 26, 2020, now Pat. No. 10,950,307.

(30) Foreign Application Priority Data

Apr. 24, 2019   (JP) .................. 2019-083092

(51) Int. Cl.
| | | |
|---|---|---|
| *G11C 16/10* | (2006.01) | |
| *G11C 16/08* | (2006.01) | |
| *G11C 16/26* | (2006.01) | |
| *G11C 16/34* | (2006.01) | |
| *G11C 7/06* | (2006.01) | |

(52) U.S. Cl.
CPC .............. *G11C 16/10* (2013.01); *G11C 16/08* (2013.01); *G11C 16/26* (2013.01); *G11C 16/3459* (2013.01); *G11C 7/06* (2013.01)

(58) Field of Classification Search
None
See application file for complete search history.

(56) References Cited

U.S. PATENT DOCUMENTS

| | | | | |
|---|---|---|---|---|
| 6,806,740 | B1 * | 10/2004 | Tan ...................... | H03D 13/004 327/12 |
| 6,859,400 | B2 * | 2/2005 | Arakawa ................ | G11C 7/106 365/233.17 |
| 7,313,028 | B2 | 12/2007 | Ju | |
| 7,535,772 | B1 * | 5/2009 | Parameswaran ..... | G11C 7/1051 365/189.12 |
| 7,567,463 | B2 | 7/2009 | Hosono et al. | |

(Continued)

FOREIGN PATENT DOCUMENTS

TW    201812750 A    4/2018

*Primary Examiner* — Tan T. Nguyen
(74) *Attorney, Agent, or Firm* — Kim & Stewart LLP

(57) ABSTRACT

A semiconductor memory device includes memory cells, a first circuit that includes a first latch group including first and second data latch circuits and a second latch group including third and fourth data latch circuits, and a control circuit configured to control a write operation during which first and second data to be written into the memory cells are stored in the first and second data latch circuits, respectively, wherein the first and second data are also stored in the third and fourth data latch circuits, respectively, while the first and second data stored in the first and second data latch circuits, respectively, are being written in the memory cells.

20 Claims, 40 Drawing Sheets

(56) References Cited

U.S. PATENT DOCUMENTS

| | | |
|---|---|---|
| 8,270,215 B2 | 9/2012 | You et al. |
| 9,558,837 B2 | 1/2017 | Harada et al. |
| 9,558,945 B2 | 1/2017 | Fukuzumi et al. |
| 10,026,491 B2 | 7/2018 | Utsunomiya et al. |
| 10,950,307 B2 * | 3/2021 | Tokiwa ............... G11C 11/5642 |
| 11,349,481 B1 * | 5/2022 | Sivarajah ............ H03K 19/1737 |
| 11,551,760 B2 * | 1/2023 | Tokiwa .................. G11C 16/26 |
| 2003/0076719 A1 | 4/2003 | Byeon et al. |
| 2003/0117856 A1 | 6/2003 | Lee et al. |
| 2008/0080262 A1 * | 4/2008 | Kang ................... G11C 7/1078 |
| | | 365/189.05 |
| 2008/0228951 A1 * | 9/2008 | Chow ............... H03K 19/1733 |
| | | 710/10 |
| 2010/0172181 A1 * | 7/2010 | Murakami ............. G11C 16/06 |
| | | 365/185.12 |
| 2010/0329030 A1 | 12/2010 | You et al. |
| 2011/0142162 A1 * | 6/2011 | Shih ....................... H04L 25/05 |
| | | 375/295 |
| 2014/0304459 A1 | 10/2014 | Kim et al. |
| 2015/0039809 A1 | 2/2015 | Kim et al. |
| 2016/0172012 A1 * | 6/2016 | Lim ..................... G11C 7/1048 |
| | | 365/189.05 |
| 2019/0081069 A1 | 3/2019 | Lu et al. |
| 2022/0199050 A1 * | 6/2022 | Shigeta ................ G09G 3/3648 |

* cited by examiner

FIG. 8
| Prefix COMMAND "X" | NORMAL READ | DLA READ | HS READ·SB READ |
|---|---|---|---|
| NO "X" | ADL,XDL | ADL,BDL,XDL | ADL,BDL,XDL |
| 0x01 | BDL,XDL | BDL,CDL,XDL | BDL,CDL,XDL |
| 0x02 | CDL,XDL | CDL,TDL,XDL | CDL,TDL,XDL |
| 0x04 | TDL,XDL | TDL,XDL | TDL,XDL |
| 0x08 | N/A | N/A | N/A |
FIG. 9
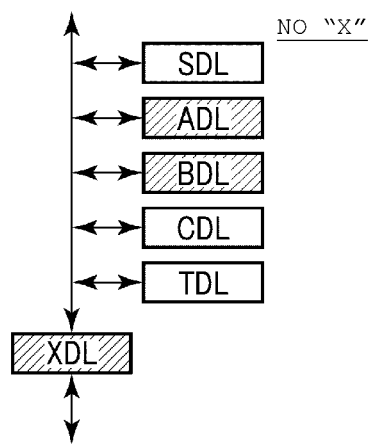
NO "X"
FIG. 10
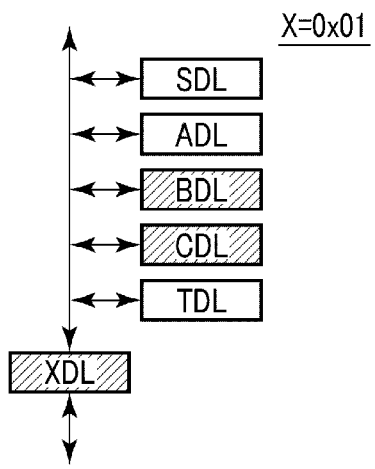
X=0x01

| Prefix COMMAND "X" | NORMAL READ | DLA READ | HB READ·SB READ |
|---|---|---|---|
| NO "X" | ADL,XDL | ADL,BDL,XDL | ADL,BDL,XDL |
| 0x01 | BDL,XDL | BDL,CDL,XDL | BDL,CDL,XDL |
| 0x02 | CDL,XDL | CDL,TDL,XDL | CDL,TDL,XDL |
| 0x04 | TDL,NDL | TDL,NDL,XDL | TDL,NDL,XDL |
| 0x08 | NDL,XDL | NDL,UDL,XDL | NDL,UDL,XDL |

FIG. 62

HARD BIT READ

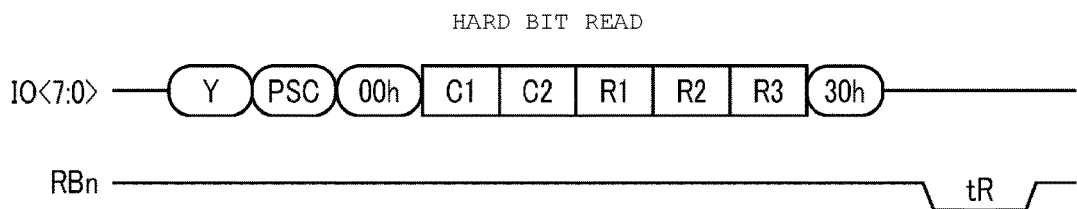

FIG. 63

SOFT BIT READ

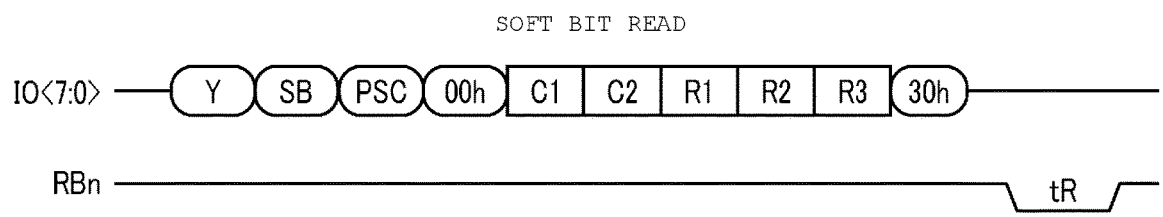

FIG. 64

|     | Case 1 | Case 2 | Case 3 | Case 4 | Case 5 |
|-----|--------|--------|--------|--------|--------|
|     | HB (NO "Y") | Y(=08h)+HB | SB (NO "Y") | Y(=08h)+SB | Y(=09h)+SB |
| NDL | — | HB | — | SB | (HB) |
| UDL | — | — | — | — | SB |
| ADL | Program(lower) | Program(lower) | Program(lower) | Program(lower) | Program(lower) |
| BDL | Program(middle) | Program(middle) | Program(middle) | Program(middle) | Program(middle) |
| CDL | Program(upper) | Program(upper) | Program(upper) | Program(upper) | Program(upper) |
| TDL | Program(internal) | Program(internal) | Program(internal) | Program(internal) | Program(internal) |

SEMICONDUCTOR MEMORY DEVICE

CROSS-REFERENCE TO RELATED APPLICATION

This application is a continuation of U.S. patent application Ser. No. 17/181,998, filed Feb. 22, 2021, which is a continuation of U.S. patent application Ser. No. 16/802,446, filed Feb. 26, 2020, now U.S. Pat. No. 10,950,307, issued Mar. 16, 2021, which is based upon and claims the benefit of priority from Japanese Patent Application No. 2019-083092, filed Apr. 24, 2019, the entire contents of which are incorporated herein by reference.

FIELD

Embodiments described herein relate generally to a semiconductor memory device and a memory system.

BACKGROUND

A NAND flash memory is known as a type of semiconductor memory device. A NAND flash memory including a plurality of memory cells stacked three-dimensionally is known.

DESCRIPTION OF THE DRAWINGS

FIG. 8 is a table for showing a relationship between contents of a command and a data latch circuit.

FIGS. 9-12 are each a diagram for showing data latch circuits used during execution of a command.

FIG. 62 is a diagram for showing a command sequence of hard bit read.

FIG. 63 is a diagram for showing a command sequence of soft bit read.

FIG. 64 is a schematic diagram for showing the operation of the data latch circuit.

DETAILED DESCRIPTION

Figure 1:
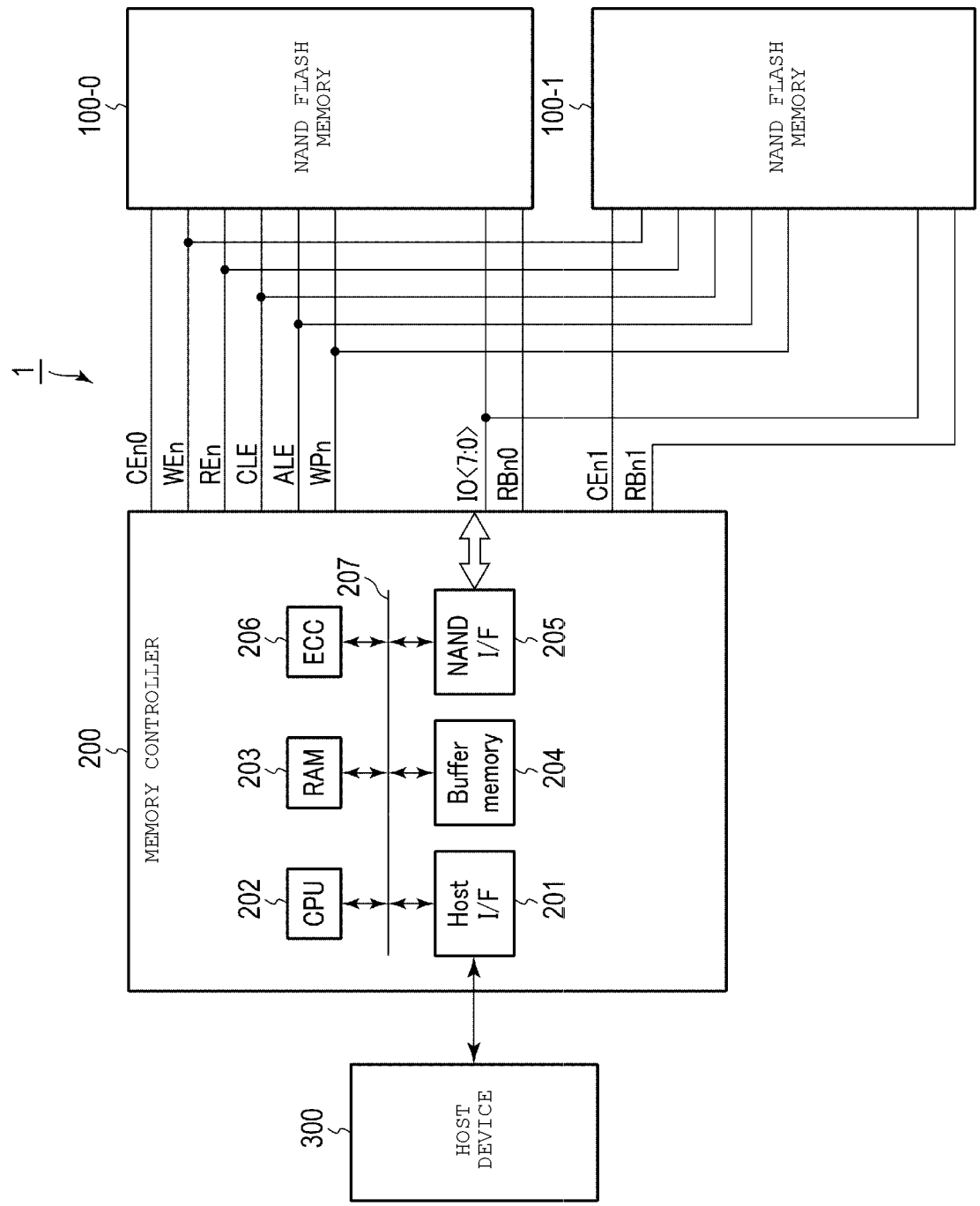
FIG. 1 is a block diagram of a memory system according to a first embodiment.

Embodiments provide a semiconductor memory device capable of improving performance.

In general, according to one embodiment, there is provided a semiconductor memory device including memory cells, a first circuit that includes a first latch group including first and second data latch circuits and a second latch group including third and fourth data latch circuits, and a control circuit configured to control a write operation during which first and second data to be written into the memory cells are stored in the first and second data latch circuits, respectively, wherein the first and second data are also stored in the third and fourth data latch circuits, respectively, while the first and second data stored in the first and second data latch circuits, respectively, are being written in the memory cells.

Hereinafter, embodiments will be described with reference to the accompanying drawings. Several embodiments described below illustrate an apparatus and a method for embodying technical idea of the present disclosure, and the technical idea of the present disclosure is not specified by the shape, structure, arrangement, or the like of constitutional components thereof. Each functional block may be implemented as one of hardware and software, or a combination of both hardware and software. It is not essential that each functional block is distinguished as in the following example. For example, some functions may be executed by a functional block different from illustrated functional blocks. Furthermore, the illustrated functional blocks may be divided into smaller functional sub-blocks. In the following description, constitutional elements having the same function and configuration are denoted by the same reference numerals, and redundant description thereof will be made only when necessary.

A semiconductor memory device according to the embodiments is a nonvolatile semiconductor memory in which data can be electrically rewritten. In the following embodiments, a NAND flash memory will be described as an example of the semiconductor memory device.

1. First Embodiment 1-1. Configuration of Memory System

FIG. 1 is a block diagram of a memory system 1 according to a first embodiment. The memory system 1 includes one or more nonvolatile semiconductor memory devices (NAND flash memories) 100 and a memory controller 200. FIG. 1 illustrates two NAND flash memories 100-0 and 100-1.

The memory system 1 may be formed by mounting a plurality of chips of the memory system 1 on a motherboard on which a host device 300 is mounted, or configured as a system large-scale integrated circuit (LSI) or system on chip (SoC) that forms the memory system 1 with one module. Examples of the memory system 1 include a memory card such as an SD™ card, a solid state drive (SSD), an embedded multimedia card (eMMC), and the like.

The NAND flash memory 100 includes a plurality of memory cells and stores data in a nonvolatile manner. Details regarding the configuration of the NAND flash memory 100 will be described later.

In response to a command from the host device 300, the memory controller 200 commands the NAND flash memory 100 to write (also referred to as program), read, and erase data. The memory controller 200 manages a memory space of the NAND flash memory 100. The memory controller 200 includes a host interface circuit 201 (denoted as "host I/F" in FIG. 1), a central processing unit (CPU) 202, a random access memory (RAM) 203, a buffer memory 204, a NAND interface circuit 205 (denoted as "NAND I/F" in FIG. 1), and an error checking and correcting (ECC) circuit 206, and the like. These modules are connected to each other via a bus 207.

The host interface circuit 201 is connected to the host device 300 via a bus and performs interface processing with the host device 300. The host interface circuit 201 transmits and receives a command and data to and from the host device 300.

The CPU 202 controls the overall operation of the memory controller 200. For example, when receiving a write command from the host device 300, the CPU 202 issues a write command based on the NAND interface standard to the NAND flash memory 100 in response to the received write command. The same applies to reading and erasing. The CPU 202 executes various processing for managing the NAND flash memory 100 such as wear leveling.

The RAM 203 is used as a work area of the CPU 202, and stores firmware loaded from the NAND flash memory 100 and various tables created by the CPU 202. The RAM 203 may be, for example, a DRAM. The buffer memory 204 temporarily stores data sent from the host device 300 and temporarily stores data sent from the NAND flash memory 100.

When data is written, the ECC circuit 206 generates an error correction code for write data, adds the error correction code to the write data, and sends the write data to the NAND interface circuit 205. When reading data, the ECC circuit 206 performs error detection and error correction on the read data by using an error correction code included in the read data. The ECC circuit 206 may be provided in the NAND interface circuit 205.

The NAND interface circuit 205 is connected to the NAND flash memory 100 via a bus, and performs interface processing with the NAND flash memory 100. The NAND interface circuit 205 transmits and receives a command and data to and from the NAND flash memory 100.

The NAND flash memory 100 is connected to the memory controller 200 via a control signal line group, an input/output bus, and the like. The NAND flash memory 100 is configured to receive a command, address, and write data issued by the memory controller 200 and to transmit read data to the memory controller 200.

Signals between the memory controller 200 and the NAND flash memory 100 include a chip enable signal CEn, a write enable signal WEn, a read enable signal REn, a command latch enable signal CLE, an address latch enable signal ALE, and a write protect signal WPn, an input/output signal IO<7:0>, and a ready/busy signal RBn. "n" appended to a signal name indicates active low. The write enable signal WEn, the read enable signal REn, the command latch enable signal CLE, the address latch enable signal ALE, the write protect signal WPn, and the input/output signal IO<7:0> are common to the plurality of NAND flash memories 100, while the chip enable signal CEn and the ready/busy signal RBn are individually provided per each NAND flash memory 100. Regarding these signals, a signal form and a connection method are appropriately changed as necessary.

In the example of FIG. 1, the memory controller 200 and the NAND flash memory 100-0 are connected by signal lines for a chip enable signal CEn0, the write enable signal WEn, the read enable signal REn, the command latch enable signal CLE, the address latch enable signal ALE, the write protect signal WPn, the input/output signal IO<7:0>, and the ready/busy signal RBn0. The memory controller 200 and the NAND flash memory 100-1 are connected by signal lines for a chip enable signal CEn1, the write enable signal WEn, the read enable signal REn, the command latch enable signal CLE, the address latch enable signal ALE, the write protect signal WPn, and the input/output signal IO<7:0> and a ready/busy signal RBn1.

1-1-1. Configuration of NAND Flash Memory 100

Figure 2:
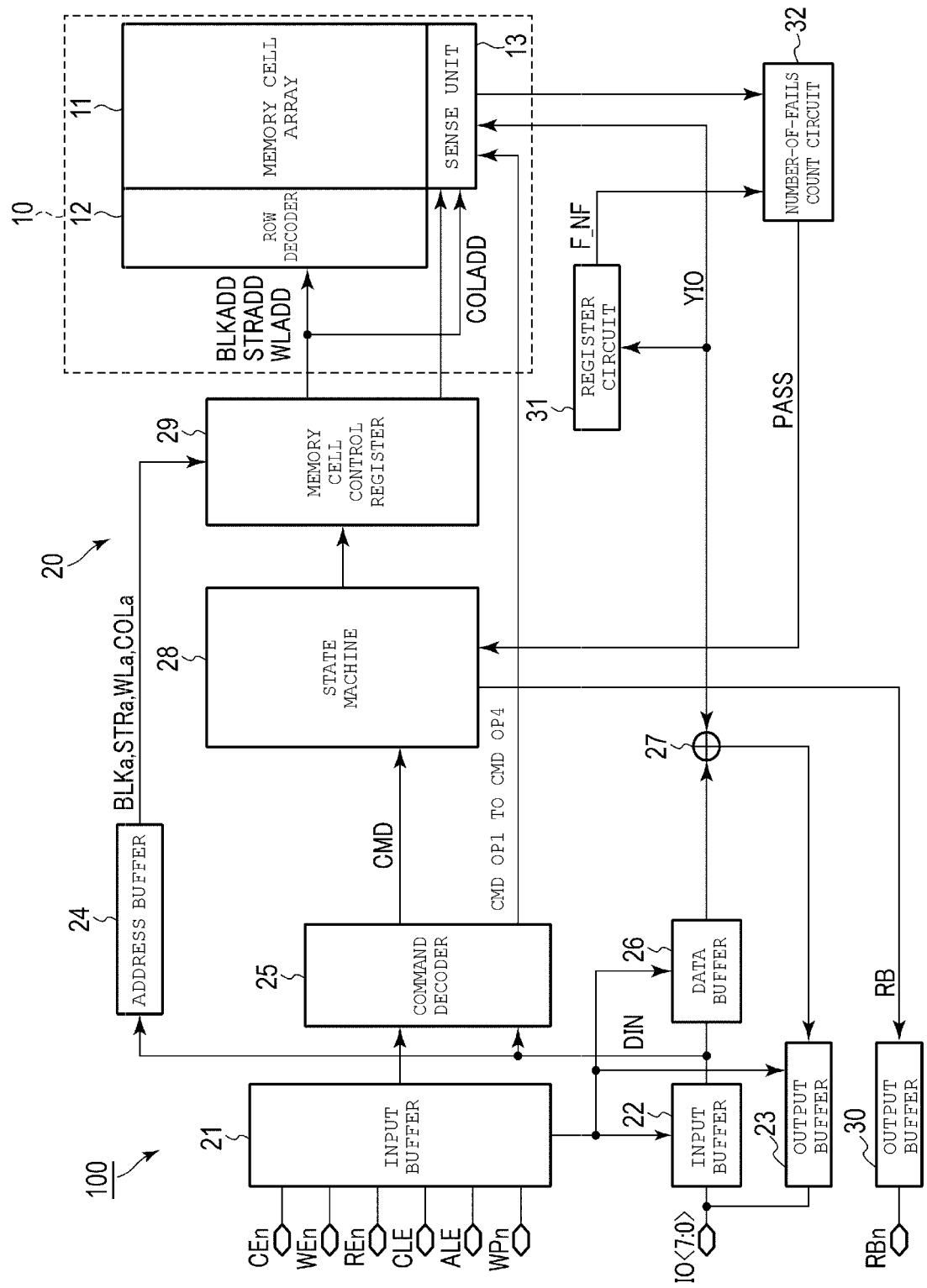
FIG. 2 is a block diagram of a NAND flash memory.

FIG. 2 is a block diagram of the NAND flash memory 100. An internal block structure of the NAND flash memory 100 is roughly divided into a core unit 10 and a peripheral circuit 20 other than the core unit 10.

The core unit 10 includes a memory cell array 11 having a plurality of memory cells, a row decoder 12, and a sense unit 13.

The row decoder 12 selects the memory cell array 11 in units of blocks and applies a desired voltage to a word line. That is, the row decoder 12 receives various voltages from a voltage generation circuit (not illustrated) and applies various voltages to a plurality of word lines according to operations being carried out.

When data is read, the sense unit 13 detects and amplifies data read from the memory cell to the bit line. The sense unit 13 transfers write data to the memory cell when data is written. Reading data from the memory cell array 11 and writing data to the memory cell array 11 are performed in units of pages, which are a collection of data of a plurality of bits. A specific configuration of the sense unit 13 will be described later.

The peripheral circuit 20 includes input buffers 21 and 22, an output buffer 23, an address buffer 24, a command decoder 25, a data buffer 26, a selection circuit 27, a state machine (which is a control circuit) 28, a memory cell control register 29, an output buffer 30, a register circuit 31, and a number-of-fails count circuit 32.

The input buffer 21 is connected to a plurality of terminals (e.g., pins) for receiving the chip enable signal CEn, the write enable signal WEn, the read enable signal REn, the command latch enable signal CLE, the address latch enable signal ALE, and the write protect signal WPn. The input buffer 21 recognizes a command input, an address input, a data input, a write-protect state, and a chip selection/non-selection state according to logic states of a plurality of pins, and notifies the command decoder 25, the input buffer 22, the output buffer 23, and the like of the state.

The input buffer 22 is connected to the bidirectional bus IO<7:0>. The input buffer 22 outputs data input from the memory controller 200 via the bidirectional bus IO<7:0> as DIN, according to an instruction from the input buffer 21.

The output buffer 23 receives an output of the selection circuit 27, and outputs read data to the bidirectional bus IO<7:0> at a predetermined timing.

The address buffer 24 receives address data included in the data signal DIN from the input buffer 22 and temporarily stores the address data. The address data is separated into a block address BLKa, a string address STRa, a word line address WLa, and a column address COLa according to an input order and input bit position.

In response to an instruction from the input buffer 21, the command decoder 25 receives the data signal DIN from the input buffer 22, and outputs a command signal CMD included in the data signal DIN. The command decoder 25 outputs signals CMD_OP1 to CMD_OP4 for controlling the sense unit 13. Details of the signals CMD_OP1 to CMD_OP4 will be described later.

In response to an instruction from the input buffer 21, the data buffer 26 receives the data signal DIN from the input buffer 22, and temporarily stores the write data included in the data signal DIN. The data buffer 26 transfers data to the sense unit 13 via the selection circuit 27.

The selection circuit 27 selects whether to transfer data from the data buffer 26 to the sense unit 13 or to transfer data from the sense unit 13 to the output buffer 23.

The state machine 28 performs operations such as reading, writing, and erasing of the NAND flash memory 100. In this embodiment, the state machine 28 receives the output of the command decoder 25 and mainly controls the memory cell control register 29. Specifically, the state machine 28 performs operations such as selecting an appropriate address of the memory cell and applying a desired voltage to a desired node. The state machine 28 executes selection of an appropriate register of the register circuit 31 and calculation and output of an output F_NF from the register circuit 31.

The memory cell control register 29 outputs signals for controlling detailed operations of writing, reading and erasing of the memory cells according to the addresses BLKa, STRa, WLa, and COLa from the address buffer 24 and an operation instruction signal of the state machine 28. Signals output from the memory cell control register 29 include a block address BLKADD, a string address STRADD, a word line address WLADD, and a column address COLADD.

The block address BLKADD indicates a selected block. The string address STRADD indicates a voltage of a selection gate signal for selecting one of a plurality of strings that make up a block of a memory cell. The word line address WLADD is an instruction to apply a selection voltage to a selected word line and to apply a non-selection voltage to an unselected word line. The column address COLADD indicates a cache position at the time of writing or reading.

The output buffer 30 is connected to an output pin that outputs the ready/busy signal RBn. The output buffer 30 receives a ready/busy signal RB from the state machine 28. The ready/busy signal RB indicates that the NAND flash memory 100 is in a ready state or a busy state. The output buffer 30 outputs the received ready/busy signal RB from the output pin as the ready/busy signal RBn.

The register circuit 31 stores fuse data. The fuse data is read from a fuse region (not illustrated) in the memory cell array 11 when the NAND flash memory 100 is supplied with power. The fuse data includes a number-of-fails reference value F_NF and the like. The number-of-fails reference value F_NF is a reference value for checking whether or not writing or erasing is completed.

The number-of-fails count circuit 32 monitors the read data stored in a cache in the sense unit 13 and counts the number of bits and bytes that do not coincide with expected values at a predetermined timing. The number-of-fails count circuit 32 compares the count result with the fail bit reference value F_NF output from the register circuit 31. As a result of the comparison, if the comparison result is below the reference value, the number-of-fails count circuit 32 sets a signal PASS to a high level and notifies the state machine 28 of the set information, and if the comparison result exceeds the reference value, the number-of-fails count circuit 32 sets the signal PASS to a low level and notifies the state machine 28 of the set information.

1-1-2. Configuration of Memory Cell Array 11

Figure 3:
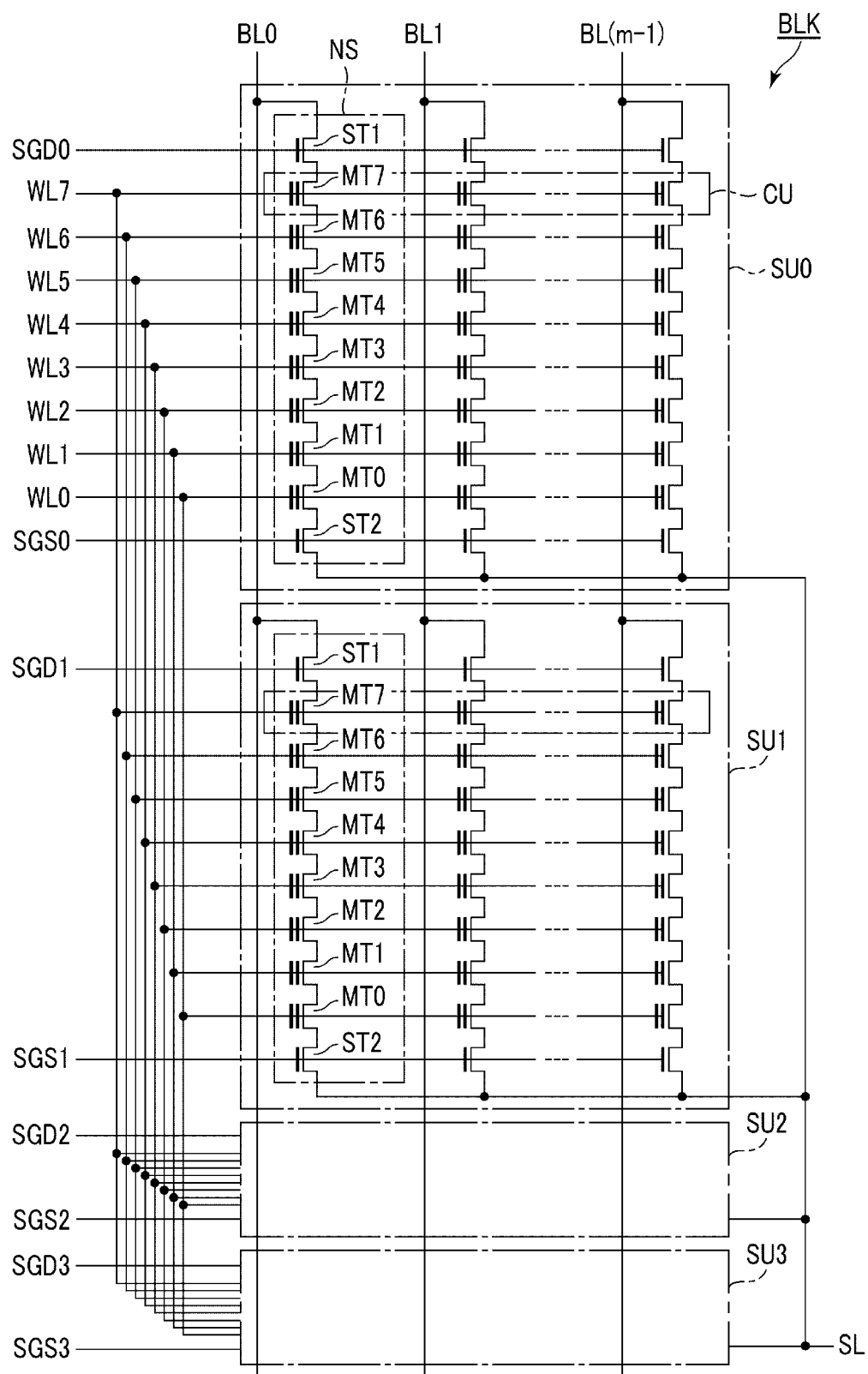
FIG. 3 is a circuit diagram of a memory cell array illustrated in FIG. 2.

FIG. 3 is a circuit diagram of the memory cell array 11 illustrated in FIG. 2. The memory cell array 11 includes a plurality of blocks BLKs. In FIG. 3, one block BLKin the memory cell array 11 is extracted and illustrated.

Each of the plurality of blocks BLK includes a plurality of string units SU. FIG. 3 illustrates four string units SU0 to SU3. The number of string units SU in one block BLK may be set as desired.

Each of the plurality of string units SU includes a plurality of NAND strings (more generally, memory strings) NS. The number of NAND strings NS in one string unit SU may be set as desired.

Each of the plurality of NAND strings NS includes a plurality of memory cell transistors MT and two select transistors ST1 and ST2. The plurality of memory cell transistors MT are connected in series between a source of the select transistor ST1 and a drain of the select transistor ST2. In this specification, a memory cell transistor may be referred to as a memory cell or a cell. Although FIG. 3 illustrates a configuration example in which the NAND string NS includes eight memory cell transistors MT (MT0 to MT7) for simplification, the number of memory cell transistors MT in the NAND string NS is actually larger than eight and may be set as desired. The memory cell transistor MT includes a control gate electrode and a charge storage layer, and stores data in a nonvolatile manner. The memory cell transistor MT may store data of one bit or data of two bits or more.

Gates of the plurality of select transistors ST1 in the string unit SU0 are commonly connected to a select gate line SGD0, and similarly, select gate lines SGD1 to SGD3 are connected to the string units SU1 to SU3, respectively. Gates of the plurality of select transistors ST2 in the string unit SU0 are commonly connected to the select gate line SGS0, and similarly, the select gate lines SGS1 to SGS3 are connected to the string units SU1 to SU3, respectively. A common select gate line SGS may be connected to the string units SU0 to SU3 in each block BLK. Control gates of memory cell transistors MT0 to MT7 in each block BLK are connected to word lines WL0 to WL7, respectively.

Among the NAND strings NS arranged in a matrix configuration in each block BLK, drains of the select transistors ST1 of the plurality of NAND strings NS in the same column are commonly connected to one of bit lines BL0 to BL(m−1). "m" is an integer of more than or equal to 1. Furthermore, each bit line BL is commonly connected to a plurality of blocks BLK, and is connected to one NAND string NS in each string unit SU in each of the plurality of blocks BLK. Sources of the plurality of select transistors ST2 in each block BLK are commonly connected to the source line SL. For example, the source line SL is commonly connected to a plurality of blocks BLK.

Data of a plurality of memory cell transistors MT in each block BLK is collectively erased, for example. Reading and writing are collectively performed on the plurality of memory cell transistors MT commonly connected to one word line WL arranged in one string unit SU. A set of memory cell transistors MT sharing a word line WL in one string unit SU is referred to as a cell unit CU. A collection of 1-bit data stored in each of the plurality of memory cell transistors MT in the cell unit CU is referred to as a page. That is, a write operation and a read operation for the cell unit CU are performed in units of pages.

The memory cell array 11 has, for example, a three-dimensionally stacked structure. That is, the memory cell array 11 includes a plurality of memory cell transistors MT that are three-dimensionally stacked. The NAND strings NS in each block BLK are stacked and connected in series in the stacking direction in the order of the select transistor ST2, the plurality of memory cell transistors MT, and the select transistor ST1.

1-1-3. Threshold Voltage Distribution of Memory Cell Transistor

Figure 4:
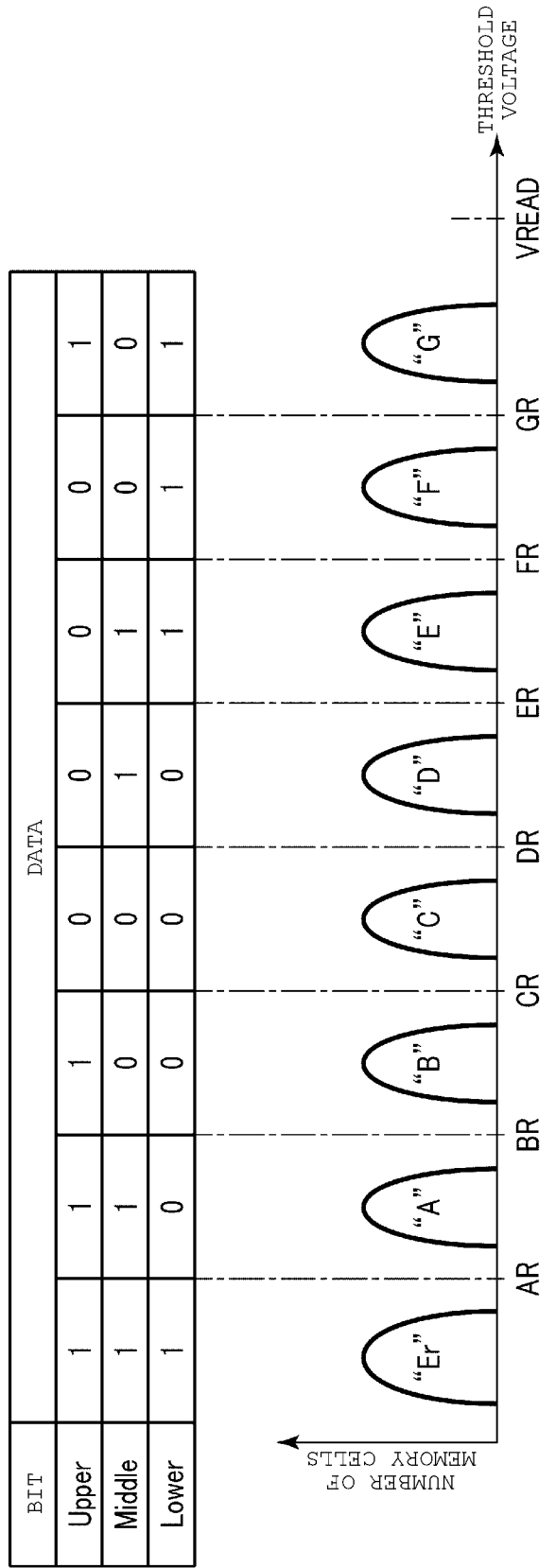
FIG. 4 is a schematic diagram illustrating an example of threshold voltage distribution of memory cell transistors.

Next, a distribution of threshold voltage Vth that can be set in the memory cell transistor MT will be described. FIG. 4 is a schematic diagram illustrating an example of the threshold voltage distribution of the memory cell transistor MT. The memory cell transistor MT may store data of two bits or more. In this embodiment, when the memory cell transistor MT stores data of three bits, a so-called triple level cell (TLC) method will be described as an example.

The 3-bit data is defined by a lower bit, a middle bit, and an upper bit. When the memory cell transistor MT stores three bits, the memory cell transistor MT may take any of eight states according to a plurality of threshold voltages. The eight states are referred to as states "Er", "A", "B", "C", "D", "E", "F", and "G" in order from the lowest. A plurality of memory cell transistors MT belonging to each of the states "Er", "A", "B", "C" "D", "E", "F", and "G" form a distribution.

For example, data "111", "110", "100", "000", "010", "011", "001", and "101" are assigned to the states "Er", "A", "B", "C", "D", "E", "F", and "G", respectively. The order of the bits is "L, M, and U", where the lower bit is "L", the middle bit is "M", and the upper bit is "U". The assignment of the threshold voltage distribution and the data may be set as desired.

In order to read the data stored in the memory cell transistor MT which is a read target, the state in which the threshold voltage of the memory cell transistor MT belongs is determined. For the determination of the state, read voltages AR, BR, CR, DR, ER, FR, and GR are used, and the read voltages AR, BR, CR, DR, ER, FR, and GR increase in this order.

The state "Er" corresponds to, for example, a state where data is erased. The threshold voltage of the memory cell transistor MT belonging to the state "Er" is lower than the voltage AR, and has a negative value, for example.

States "A" to "G" correspond to states in which charges are injected into a charge storage layer to write data into the memory cell transistors MT, and the threshold voltage of the memory cell transistors MT belonging to the states "A" to "G" has a positive value, for example. The threshold voltage of the memory cell transistor MT belonging to the state "A" is higher than the read voltage AR and lower than the read voltage BR. The threshold voltage of the memory cell transistor MT belonging to the state "B" is higher than the read voltage BR and lower than the read voltage CR. The threshold voltage of the memory cell transistor MT belonging to the state "C" is higher than the read voltage CR and lower than or equal to the read voltage DR. The threshold voltage of the memory cell transistor MT belonging to the state "D" is higher than the read voltage DR and lower than or equal to the read voltage ER. The threshold voltage of the memory cell transistor MT belonging to the state "E" is higher than the read voltage ER and lower than or equal to the read voltage FR. The threshold voltage of the memory cell transistor MT belonging to the state "F" is higher than the read voltage FR and lower than the read voltage GR. The threshold voltage of the memory cell transistor MT belonging to the state "G" is higher than the read voltage GR and lower than a voltage VREAD.

The voltage VREAD is a voltage applied to the word line WL connected to the memory cell transistor MT of the cell unit CU which is a non-read target, and is higher than the threshold voltage of the memory cell transistor MT in any state. That is, the memory cell transistor MT to which the voltage VREAD is applied to the control gate enters an ON state regardless of data stored therein.

As described above, each memory cell transistor MT is set to one of eight states and may store 3-bit data. Writing and reading are performed in units of pages in one cell unit CU. When the memory cell transistor MT stores 3-bit data, a lower bit, a middle bit, and an upper bit are assigned to three pages in one cell unit CU, respectively. Pages that are collectively written or read with respect to the lower bit, the middle bit, and the upper bit are referred to as a lower page, a middle page, and an upper page, respectively.

1-1-4. Configuration of Sense Unit 13

Figure 5:
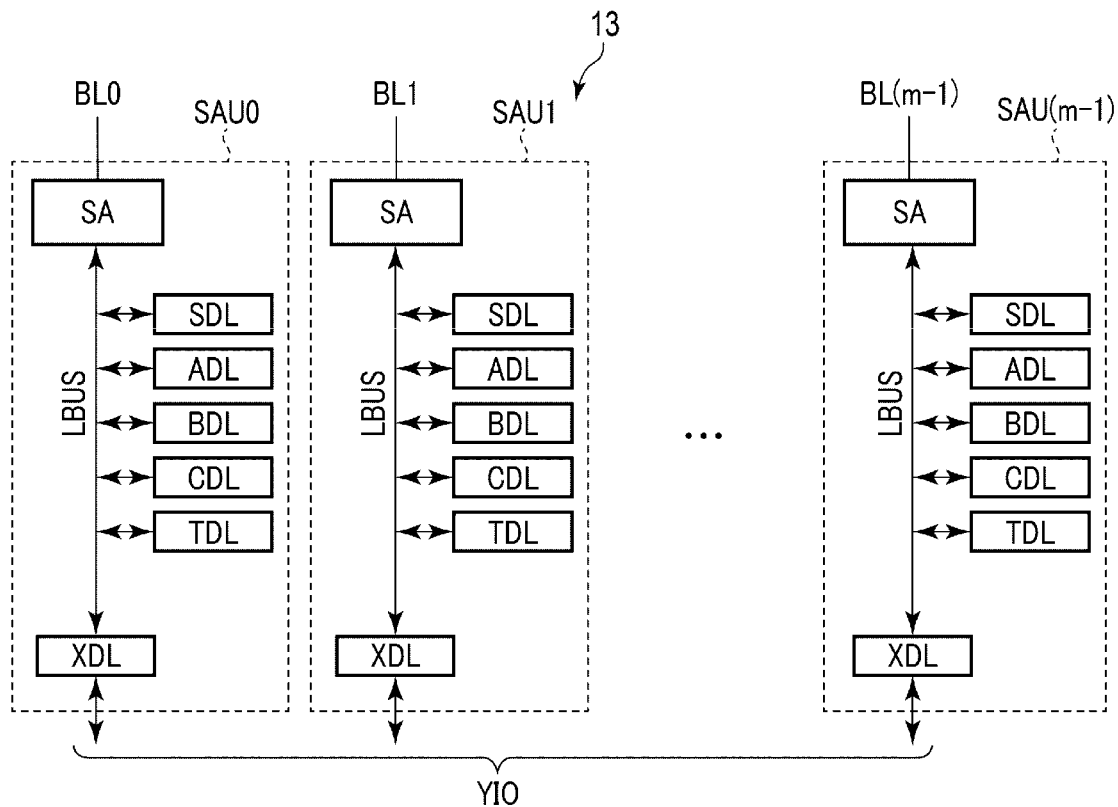
FIG. 5 is a block diagram of a sense unit illustrated in FIG. 2.

FIG. 5 is a block diagram of the sense unit 13 illustrated in FIG. 2. The sense unit 13 includes sense amplifier units SAU0 to SAU (m−1) corresponding to the bit lines BL0 to BL (m−1).

Each sense amplifier unit SAU includes a sense amplifier SA, and six data latch circuits ADL, BDL, CDL, SDL, TDL, and XDL, for example. The sense amplifier SA and the data latch circuits ADL, BDL, CDL, SDL, TDL, and XDL are connected via a bus LBUS so that data may be transferred to each other. The bus LBUS of one sense amplifier unit SAU shown in FIG. 5 corresponds to one data line. For example, if the sense unit 13 includes a data latch circuit ADL for 16 kB (bytes), the bus LBUS is made up of data lines for 16 kB.

During the read operation, the sense amplifier SA detects data read to the corresponding bit line BL, and determines whether the data is "0" or "1". The sense amplifier SA applies a voltage to the bit line BL based on the write data during the write operation.

The data latch circuits ADL, BDL, CDL, SDL, TDL, and XDL temporarily store data. For example, the data latch circuit SDL stores a sense result in the read operation and stores a sense result in a verification operation. The data latch circuit ADL stores a lower page and stores a verification result. The data latch circuit BDL stores a middle page and stores a verification result. The data latch circuit CDL stores an upper page and stores a verification result. The data latch circuit TDL stores data (for internal use data) for performing an operation in the sense amplifier unit SAU, and stores a verification result.

The data latch circuit XDL is connected to a bidirectional bus YIO. The data latch circuit XDL temporarily stores write data sent from the bidirectional bus YIO, and temporarily stores read data sent from the bus LBUS.

1-2. Operation of Memory System 1

Next, an operation of the memory system 1 will be described. In this embodiment, a data latch circuit used in the read operation among a plurality of data latch circuits in the sense amplifier unit SAU may be changed as desired.

Figure 6:
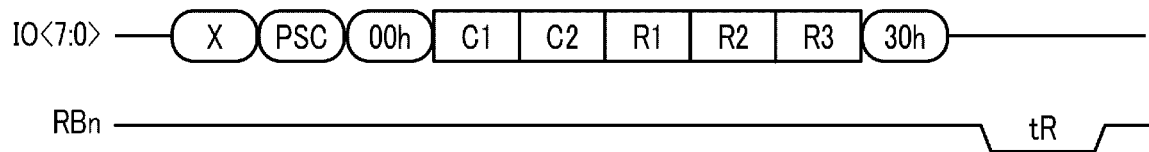
FIG. 6 is a diagram for showing a command sequence of a read operation.

FIG. 6 is a diagram illustrating a command sequence of a read operation according to this embodiment. To instruct the read operation, the memory controller 200 issues a prefix command "X", a preset command "PSC", a read command "00h", an address set, and an execution command "30h" to the NAND flash memory 100.

The prefix command "X" is a command for designating a data latch circuit to be used among a plurality of data latch circuits in the sense unit 13. The preset command "PSC" is a command for designating any of the lower page, the middle page, and the upper page. A read page in the current read operation is thus designated by the preset command "PSC". The address set is composed of, for example, column addresses C1 and C2 and row addresses R1 to R3. Each of "X", "PSC", "00h", "C1", "C2", "R1", "R2", "R3" and "30h" are transmitted from the controller 200 to the NAND flash memory 100 as concurrently-transmitted 8 bits of the input/output signal IO<7:0>.

After receiving the execution command "30h", the state machine 28 sets the ready/busy signal RBn to a low level (representing a busy state). Then, the state machine 28 executes the read operation. The "tR" in FIG. 6 means the time period for a read operation.

Figure 7:
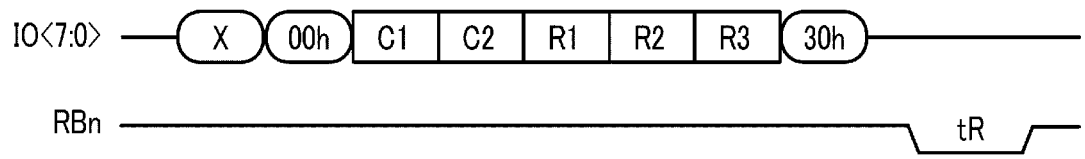
FIG. 7 is a diagram for showing another command sequence of the read operation.

Alternatively, according to an assignment of address, the preset command "PSC" may be omitted. The preset command "PSC" can be omitted as long as the selection information as to lower, middle, upper page is included in 8×5 bits of the address set "C1, C2, and R1 to R3". FIG. 7 is a diagram illustrating the above-mentioned alternative command sequence of the read operation. FIG. 7 illustrates an example in which the read page is designated by an address set, and in which the preset command "PSC" is omitted.

To instruct the read operation, the memory controller 200 issues the prefix command "X", the read command "00h", an address set "C1, C2, and R1 to R3", and the execution command "30h" to the NAND flash memory 100, but does not issue the preset command "PSC". In the example of FIG. 7, the preset command "PSC" is omitted, and the read page is designated also by the address set "C1, C2, and R1 to R3". The designation of the address set "C1, C2, and R1 to R3" included in the command sequence of FIG. 7 may be different from the designation of the address set "C1, C2, and R1 to R3" included in the command sequence of FIG. 6.

FIG. 8 is a table for showing a relationship between contents of the prefix command "X" and the data latch circuit. In FIG. 8, normal read and direct look ahead (DLA) read as a read operation, and a combination of hard bit read and soft bit read (also referred to as HB read/SB read) when performing soft decision decoding as one means of error correction are illustrated. The normal read is a normal read operation.

The DLA read is an operation of reading data from a memory cell connected to the word line WLn+1 adjacent to the selected word line WLn before reading data of the selected memory cell connected to the selected word line WLn. Thereafter, a read operation of the selected word line WLn is performed according to the result of the DLA read. Specifically, in the read operation of the selected word line WLn, the level of the read voltage is corrected according to the result of the DLA read, and data of the selected memory cell connected to the selected word line WLn is read using the corrected read voltage.

DLA read is described in further detail, for example, in U.S. patent application Ser. No. 16/352,094, filed Mar. 13, 2019, entitled "MEMORY DEVICE." This patent application is hereby incorporated by reference in its entirety.

In the read operation, hard bit read and soft bit read are performed in order to improve the accuracy of error correction. The result of the hard bit read is used for hard decision decoding. The result of the soft bit read is used for soft decision decoding. In hard decision decoding, data is determined using binary information of "0" and "1". In soft decision decoding, data is determined using a probability, likelihood, or log likelihood ratio (LLR) indicating the likelihood of data. Soft decision decoding has higher error correction capability than hard decision decoding.

In the hard bit read, a read operation is performed using one type of read voltage corresponding to a boundary between threshold voltage distributions, and it is determined whether or not the threshold voltage of the memory cell is higher than the boundary. That is, the hard bit read is the same as a normal read operation (normal read). In the soft bit read, the read operation is performed using a plurality of read voltages with respect to the boundary dividing the threshold voltage distribution. Data is determined using a plurality of read results corresponding to a plurality of read voltages. For example, when a read error occurs in the hard bit read, the soft bit read is performed. Then, based on the result of the hard bit read and soft bit read, the bits that need error correction are extracted and error correction is performed.

Soft bit read is described in further detail, for example, in U.S. patent application Ser. No. 14/621,894, filed Feb. 13, 2015, of which the title is "NONVOLATILE MEMORY AND WRITING METHOD." This patent application is hereby incorporated by reference in its entirety.

As illustrated in FIG. 8, the prefix command "X" may designate five states. In the normal read, the following data latch circuits are designated. That is, when there is no prefix command "X", the data latch circuits ADL and XDL are designated. When the prefix command "X=0x01", the data latch circuits BDL and XDL are designated. The "0x" means a hexadecimal number. When the prefix command is "X=0x02", the data latch circuits CDL and XDL are designated. When the prefix command is "X=0x04", the data latch circuits TDL and XDL are designated. The prefix command "X=0x08" corresponds to N/A (not applicable).

Of the read operations, the normal read may be operated if there is one data latch circuit in principle. However, due to the physical arrangement in the sense amplifier unit, there is a concern that when the read operation is performed using the data latch circuit XDL positioned farthest from the sense amplifier SA, the time required for the read operation increases. Here, although a configuration in which the data latch circuit ADL and the like are mainly used without using the data latch circuit XDL which is far from the sense amplifier SA is described, but the embodiment is not limited thereto.

In the DLA read, the following data latch circuits are designated. That is, when there is no prefix command "X", the data latch circuits ADL, BDL, and XDL are designated. When the prefix command is "X=0x01", the data latch circuits BDL, CDL, and XDL are designated. When the prefix command is "X=0x02", the data latch circuits CDL, TDL, and XDL are designated. When the prefix command is "X=0x04", the data latch circuits TDL and XDL are designated. In the DLA read, there are cases where reading may be performed by two data latch circuits depending on a read method.

The designation operation of the data latch circuit in the soft bit read is the same as the designation operation of the data latch circuit in the DLA read.

Figure 11:
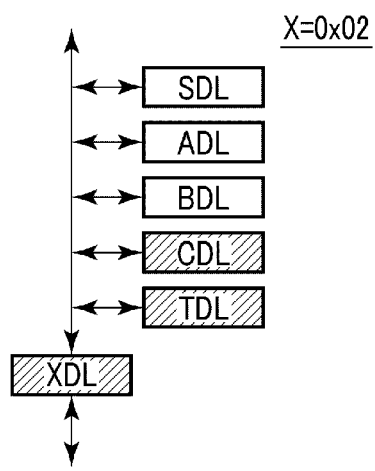
Figure 12:
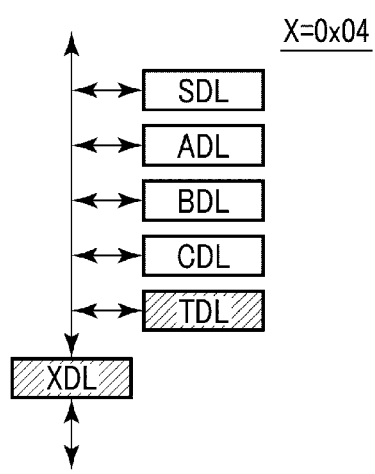

FIG. 9 is a diagram for showing a data latch circuit used when the reading method is the DLA read and there is no prefix command "X". FIG. 10 is a diagram for showing the data latch circuit used when the reading method is the DLA read and the prefix command "X=0x01". FIG. 11 is a diagram for showing the data latch used when the reading method is the DLA read and the prefix command "X=0x02". FIG. 12 is a diagram for showing the data latch circuit used when the reading method is the DLA read and the prefix command "X=0x04". In FIGS. 9 to 12, the data latch circuit used is hatched. FIGS. 9 to 12 correspond to the description of FIG. 8. This example is merely an example, and which data latch circuit is used may be determined as desired. A prefix command corresponding to the data latch circuit may be prepared in the same way.

1-3. Another Configuration Example of Sense Unit 13

Figures 13, 14:
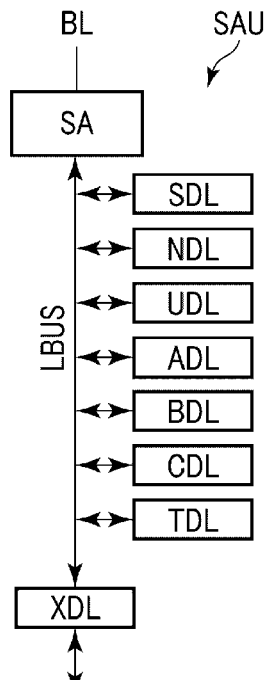
FIG. 13 is a block diagram illustrating another configuration example of the sense unit.
FIG. 14 is a table for showing a relationship between contents of a command and a data latch circuit.

FIG. 13 is a block diagram illustrating another configuration example of the sense unit 13. In FIG. 13, one sense amplifier unit SAU connected to any bit line BL is extracted and illustrated. All the sense amplifier units SAU in the sense unit 13 have the configuration illustrated in FIG. 13.

The sense amplifier unit SAU includes a sense amplifier SA and eight data latch circuits ADL, BDL, CDL, SDL, TDL, NDL, UDL, and XDL. The sense amplifier SA and the data latch circuits ADL, BDL, CDL, SDL, TDL, NDL, UDL, and XDL are connected via a bus LBUS so that data may be transferred to each other.

FIG. 14 is a table for showing the relationship between contents of the prefix command "X" and data latch circuits according to another configuration example. FIG. 14 illustrates normal read, DLA read, and HB read/SB read as the form of the read operation.

In the normal read, the following data latch circuits are designated. That is, when there is no prefix command "X", the data latch circuits ADL and XDL are designated. When the prefix command is "X=0x01", the data latch circuits BDL and XDL are designated. When the prefix command is "X=0x02", the data latch circuits CDL and XDL are designated. When the prefix command is "X=0x04", the data latch circuits TDL and XDL are designated. When the prefix command is "X=0x08", the data latch circuits NDL and XDL are designated.

In the DLA read, the following data latch circuits are designated. That is, when there is no prefix command "X", the data latch circuits ADL, BDL, and XDL are designated. When the prefix command is "X=0x01", the data latch circuits BDL, CDL, and XDL are designated. When the prefix command is "X=0x02", the data latch circuits CDL, TDL, and XDL are designated. When the prefix command is "X=0x04", the data latch circuits TDL, NDL, and XDL are designated. When the prefix command is "X=0x08", the data latch circuits NDL, UDL, and XDL are designated.

The designation operation of the data latch circuit in the soft bit read is the same as the designation operation of the data latch circuit in the DLA read.

Figure 15:
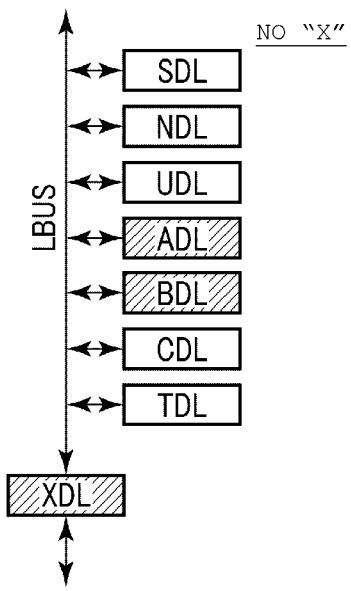
FIGS. 15-19 are each a diagram for showing data latch circuits used during execution of a command.
Figure 16:
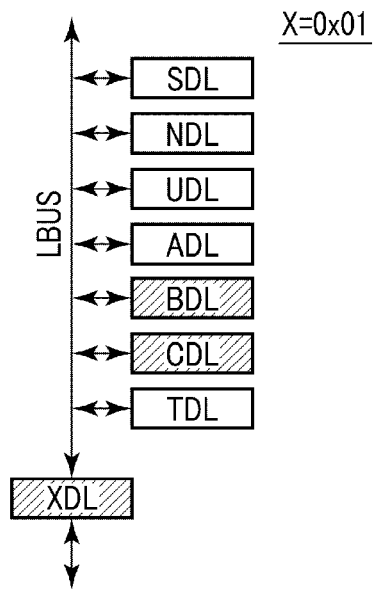
Figure 17:
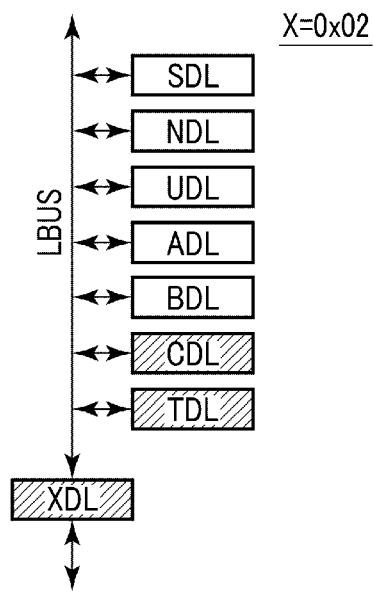
Figure 18:
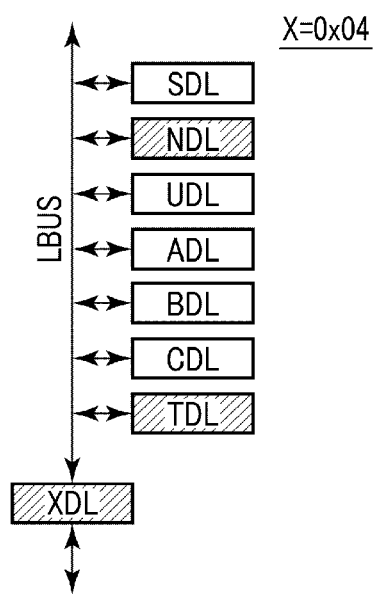
Figure 19:
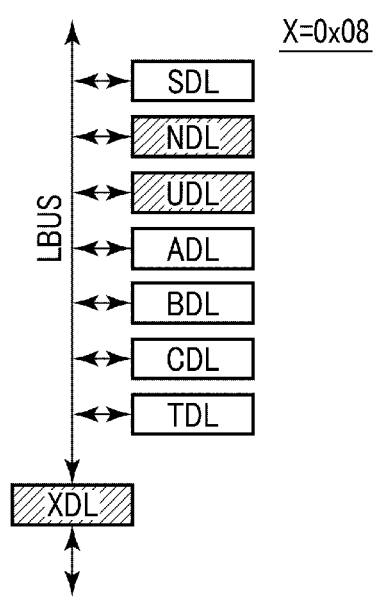

FIG. 15 is a diagram for showing a data latch circuit used when the form of the read operation is the DLA read and there is no prefix command "X". FIG. 16 is a diagram for showing a data latch circuit used when the form of the read operation is the DLA read and the prefix command is "X=0x01". FIG. 17 is a diagram for showing a data latch circuit used when the form of the read operation is the DLA read and the prefix command is "X=0x02". FIG. 18 is a diagram for showing a data latch circuit used when the form of the read operation is the DLA read and the prefix command is "X=0x04". FIG. 19 is a diagram for showing a data latch circuit used when the form of the read operation is the DLA read and the prefix command is "X=0x08". In FIG. 15 to FIG. 19, the data latch circuit used is hatched. FIGS. 15 to 19 correspond to the description of FIG. 14.

When the configuration of FIG. 19 is applied, DLA read and soft bit read can be performed without hindering the data latch circuits ADL, BDL, and CDL occupied in the write operation.

1-4. Specific Example of Sense Amplifier Unit SAU

Figure 20:
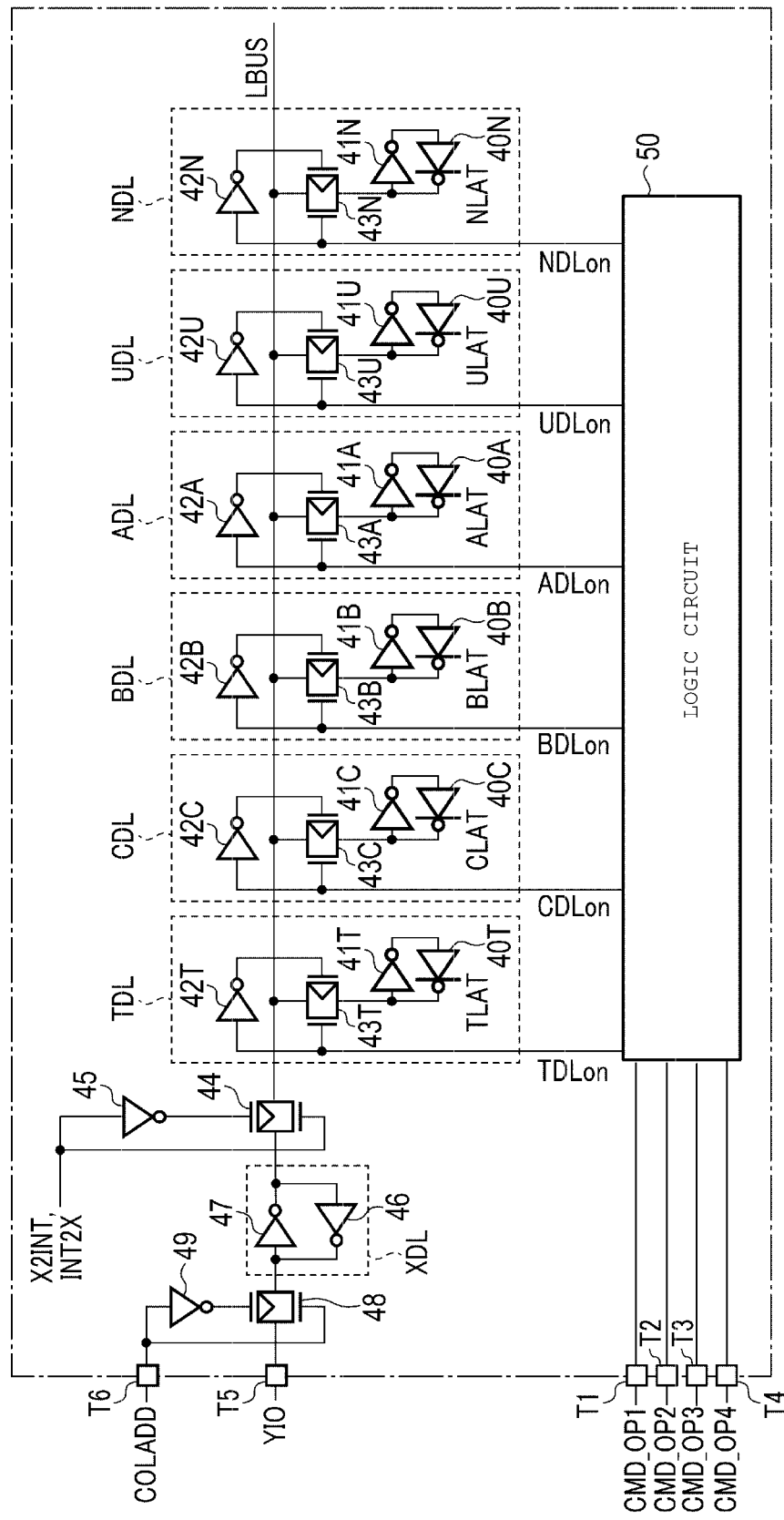
FIG. 20 is a circuit diagram of a part of a sense amplifier unit.

Next, a specific example of the sense amplifier unit SAU will be described. FIG. 20 is a circuit diagram of a part of the sense amplifier unit SAU. In FIG. 20, the data latch circuits in the sense amplifier unit SAU are mainly illustrated.

The sense amplifier unit SAU includes data latch circuits ADL, BDL, CDL, TDL, NDL, UDL, XDL, transfer gates 44 and 48, and inverter circuits 45 and 49. The sense unit 13 includes a logic circuit 50 and terminals T1 to T6. In FIG. 20, the data latch circuit SDL is not illustrated.

The data latch circuit ADL includes a clocked inverter circuit 40A, inverter circuits 41A and 42A, and a transfer gate 43A. An input terminal of the clocked inverter circuit 40A is connected to an output terminal of the inverter circuit 41A, an output terminal of the clocked inverter circuit 40A is connected to an input terminal of the inverter circuit 41A, and a signal ALAT is input from the logic circuit 50 to the clock terminal of the clocked inverter circuit 40A. The clocked inverter circuit 40A is activated when the signal ALAT is at a high level.

A first terminal of the transfer gate 43A is connected to the bus LBUS, and a second terminal of the transfer gate 43A is connected to the output terminal of the clocked inverter circuit 40A. The signal ADLon is input from the logic circuit 50 to the first gate terminal of the transfer gate 43A and the input terminal of the inverter circuit 42A. An output terminal of the inverter circuit 42A is connected to the second gate terminal of the transfer gate 43A. The transfer gate 43A is turned ON when the signal ADLon is at the high level.

The data latch circuit BDL includes a clocked inverter circuit 40B, inverter circuits 41B and 42B, and a transfer gate 43B. Signals BLAT and BDLon are input from the logic circuit 50 to the data latch circuit BDL.

The data latch circuit CDL includes a clocked inverter circuit 40C, inverter circuits 41C and 42C, and a transfer gate 43C. Signals CLAT and CDLon are input from the logic circuit 50 to the data latch circuit CDL.

The data latch circuit TDL includes a clocked inverter circuit 40T, inverter circuits 41T and 42T, and a transfer gate 43T. Signals TLAT and TDLon are input from the logic circuit 50 to the data latch circuit TDL.

The data latch circuit UDL includes a clocked inverter circuit 40U, inverter circuits 41U and 42U, and a transfer gate 43U. Signals ULAT and UDLon are input from the logic circuit 50 to the data latch circuit UDL.

The data latch circuit NDL includes a clocked inverter circuit 40N, inverter circuits 41N and 42N, and a transfer gate 43N. Signals NLAT and NDLon are input from the logic circuit 50 to the data latch circuit NDL.

The connection relationship of the elements of each of the data latch circuits BDL, CDL, TDL, NDL, and UDL is the same as that of the data latch circuit ADL described above.

A first terminal of the transfer gate 44 is connected to the bus LBUS, and a second terminal of the transfer gate 44 is connected to the data latch circuit XDL. Signals X2INT and INT2X are input from the logic circuit 50 to a first gate terminal of the transfer gate 44 and an input terminal of the inverter circuit 45. An output terminal of the inverter circuit 45 is connected to the second gate terminal of the transfer gate 44. The transfer gate 44 is turned ON when the signal X2INT or the signal INT2X is at the high level.

The data latch circuit XDL includes two inverter circuits 46 and 47. An input terminal of the inverter circuit 46 is connected to an output terminal of the inverter circuit 47, and an output terminal of the inverter circuit 46 is connected to an input terminal of the inverter circuit 47.

A first terminal of the transfer gate 48 is connected to the data latch circuit XDL, and a second terminal of the transfer gate 48 is connected to the bus YIO via the terminal T5. The column address COLADD is input from the memory cell control register 29 to the first gate terminal of the transfer gate 48 and the input terminal of the inverter circuit 49 via the terminal T6. The output terminal of the inverter circuit 49 is connected to the second gate terminal of the transfer gate 48. The transfer gate 48 is turned ON when the column address COLADD is at the high level.

The logic circuit 50 is connected to the terminals T1 to T4. Signals CMD_OP1 to CMD_OP4 are input from the command decoder 25 to the terminals T1 to T4, respectively. The logic circuit 50 generates the control signal described above using the signals CMD_OP1 to CMD_OP4.

Operation

Next, an operation of designating the data latch circuit in the read operation will be described.

Figure 21:
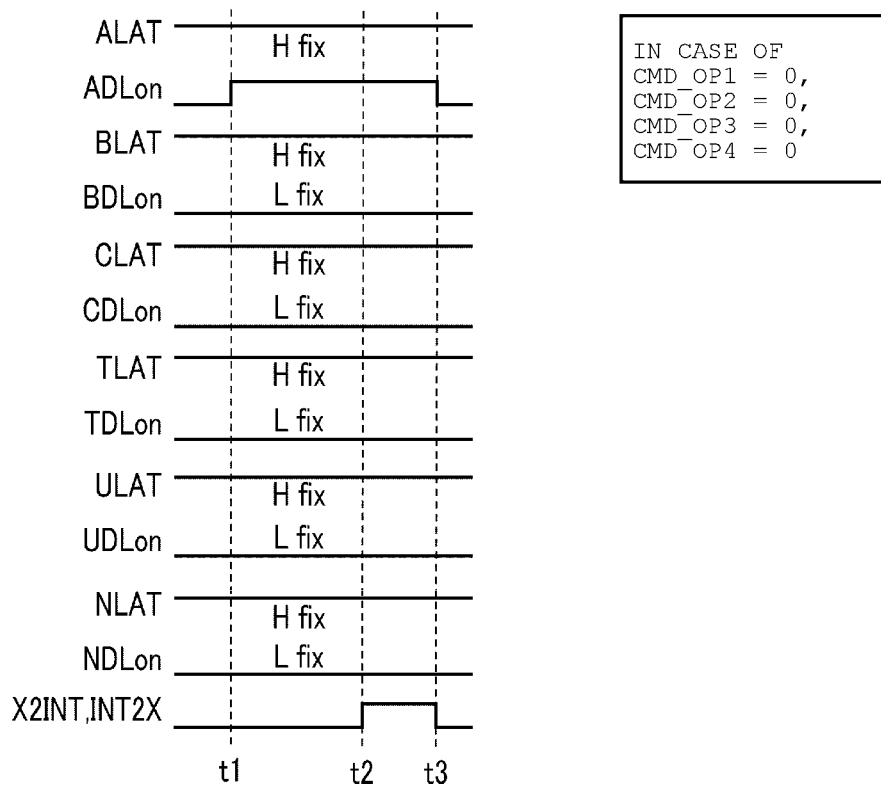
FIGS. 21-25 are each a timing diagram for showing an operation of designating a data latch circuit.

FIG. 21 is a timing diagram illustrating an operation of designating data latch circuit ADL. As can be understood from FIG. 20, the data latch circuit XDL may always be used. In FIG. 21, the case where the signal is fixed at a high level is denoted as "H fix", and the case where the signal is fixed at a low level is denoted as "L fix".

When designating the data latch circuit ADL, the command decoder 25 sets the signals CMD_OP1=0, CMD_OP2=0, CMD_OP3=0, and CMD_OP4=0. At time t1, the logic circuit 50 sets the signal ADLon to the high level. With this configuration, the transfer gate 43A is turned ON. At time t2, the logic circuit 50 sets the signal INT2X to the high level. With this configuration, the data latch circuit XDL may receive data of the bus LBUS.

At time t3, the logic circuit 50 sets the signal ADLon to the low level and the signal INT2X to the low level, thereby latching the data in the data latch circuit.

Figure 22:
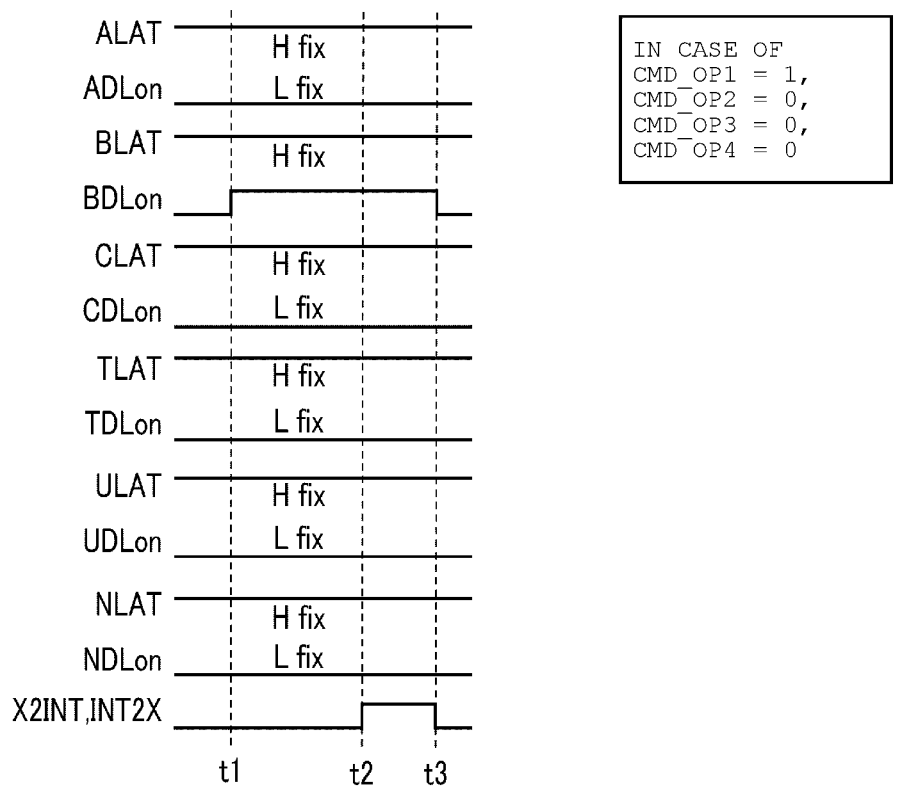

FIG. 22 is a timing diagram illustrating an operation of designating data latch circuit BDL. When designating the data latch circuit BDL, the command decoder 25 sets the signals CMD_OP1=1, CMD_OP2=0, CMD_OP3=0, and CMD_OP4=0. At time t1, the logic circuit 50 sets the signal BDLon to the high level. With this configuration, the transfer gate 43B is turned ON. At time t2, the logic circuit 50 sets the signal INT2X to the high level. With this configuration, the data latch circuit BDL may receive the data of the bus LBUS.

At time t3, the logic circuit 50 sets the signal BDLon to the low level and sets the signal INT2X to the low level, thereby latching data in the data latch circuit.

Figure 23:
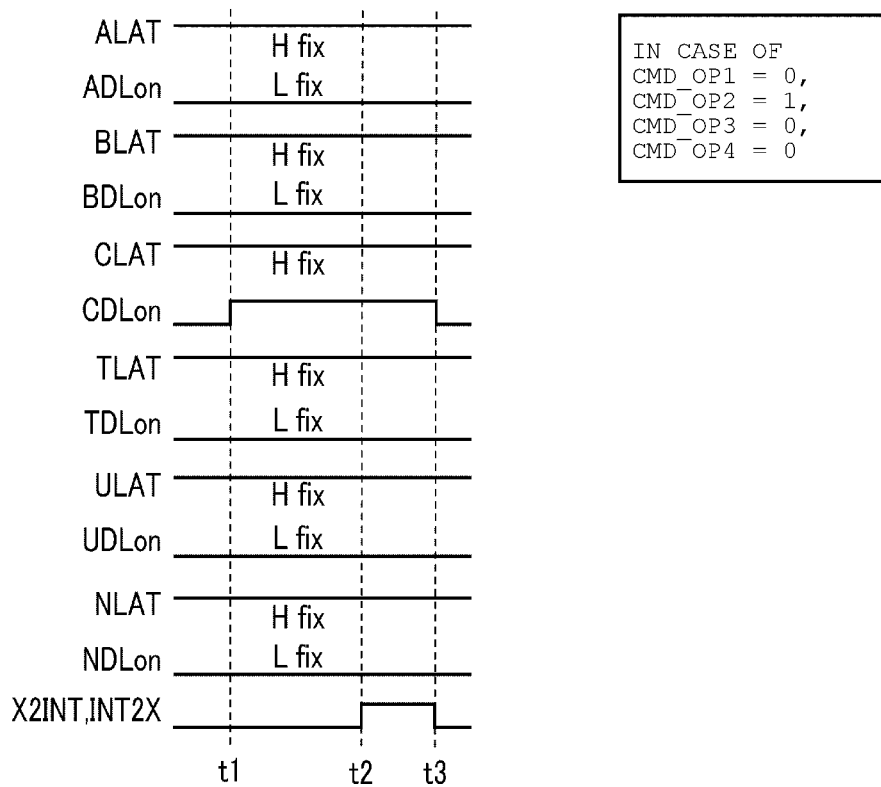

FIG. 23 is a timing diagram illustrating an operation of designating the data latch circuit CDL. When designating the data latch circuit CDL, the command decoder 25 sets the signals CMD_OP1=0, CMD_OP2=1, CMD_OP3=0, and CMD_OP4=0. At time t1, the logic circuit 50 sets the signal CDLon to the high level. With this configuration, the transfer gate 43C is turned ON. At time t2, the logic circuit 50 sets the signal INT2X to high level. With this configuration, the data latch circuit CDL may receive the data of the bus LBUS.

At time t3, the logic circuit 50 sets the signal CDLon to the low level and sets the signal INT2X to the low level, thereby latching data in the data latch circuit.

Figure 24:
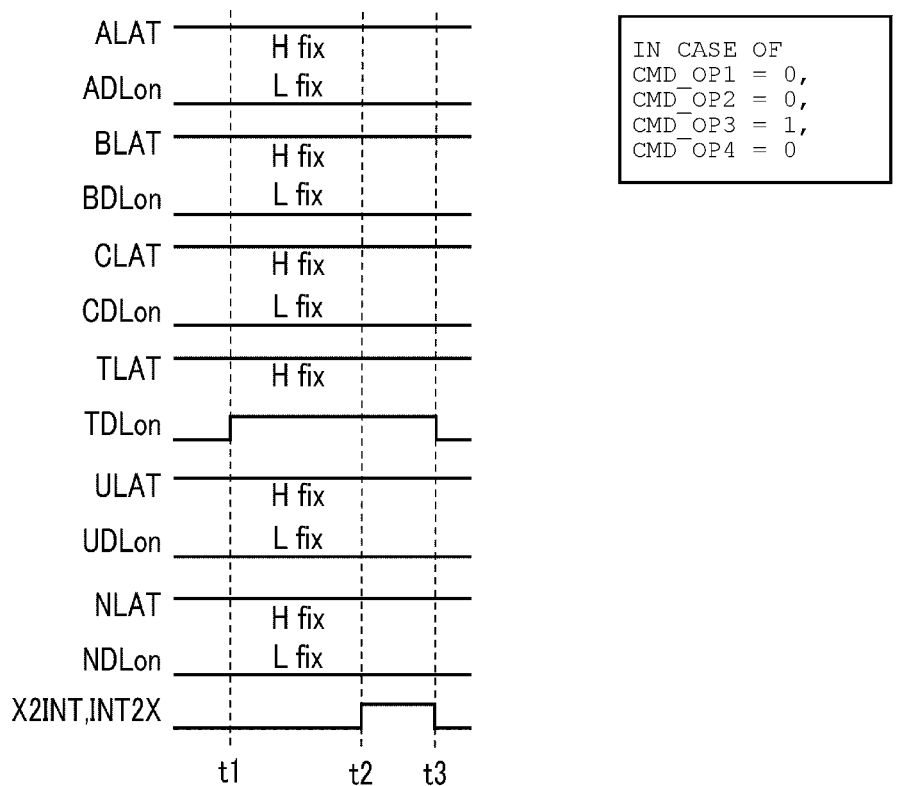

FIG. 24 is a timing diagram illustrating an operation of designating the data latch circuit TDL. When designating the data latch circuit TDL, the command decoder 25 sets the signals CMD_OP1=0, CMD_OP2=0, CMD_OP3=1, and CMD_OP4=0. At time t1, the logic circuit 50 sets the signal TDLon to the high level. With this configuration, the transfer gate 43T is turned ON. At time t2, the logic circuit 50 sets the signal INT2X to the high level. With this configuration, the data latch circuit TDL may receive the data of the bus LBUS.

At time t3, the logic circuit 50 sets the signal TDLon to the low level and the signal INT2X to the low level, thereby latching data in the data latch circuit.

Figure 25:
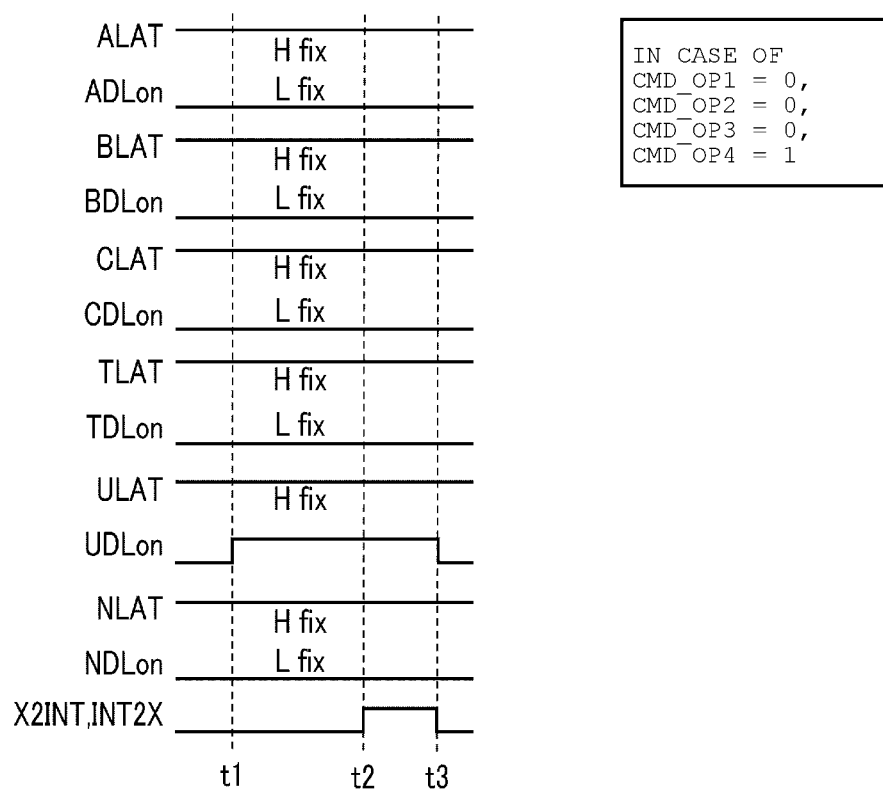

FIG. 25 is a timing diagram illustrating an operation of designating the data latch circuit UDL. When designating the data latch circuit UDL, the command decoder 25 sets the signals CMD_OP1=0, CMD_OP2=0, CMD_OP3=0, and CMD_OP4=1. At time t1, the logic circuit 50 sets the signal UDLon to the high level. With this configuration, the transfer gate 43U is turned ON. At time t2, the logic circuit 50 sets the signal INT2X to the high level. With this configuration, the data latch circuit UDL may receive the data of the bus LBUS.

At time t3, the logic circuit 50 sets the signal UDLon to the low level and the signal INT2X to the low level, thereby latching data in the data latch circuit. Similarly to designations of the data latch circuits ADL, BDL, CDL, TDL and UDL, the data latch circuit NDL may be designated as a result of setting the signals CMD_OP1=0, CMD_OP2=0, CMD_OP3=0, and CMD_OP4=1 by the command decoder 25, and controlling the corresponding transfer gate and the corresponding control signal.

1-5. Effects of First Embodiment

In the write operation, the data latch circuit for storing write data is fixed, and the lower page is stored in the data latch circuit ADL, the middle page is stored in the data latch circuit BDL, and the upper page is stored in the data latch circuit CDL, for example. In the read operation, for example, read data is stored in the data latch circuit ADL.

There is a suspend read that inserts a read operation in the middle of a write operation. When performing the suspend read, the data latch circuit ADL is occupied by the write data, and thus it is necessary to use the data latch circuit XDL which takes time for data transfer, or to temporarily save data of the data latch circuit ADL somewhere or replace the data. Read latency (read waiting time) becomes longer by the time required for saving data. In addition, the current required for data saving or additional data transfer increases, and so the average operating current is increased, which adversely affects battery consumption of a battery device.

Further, in the DLA read and soft bit read, since the data latch circuit is insufficient in the first place, the suspend read cannot be performed. Accordingly, when performing the DLA read or soft bit read, it is necessary to perform the DLA read or soft bit read after waiting for the write operation to be completed. A decrease in response at this time leads to a significant decrease in quality of service (QoS).

Generally, since which data latch circuit is used for which operation is determined in terms of circuit, even if the data latch circuit is available, it is necessary to save data and replace data, which leads to deterioration in read latency.

Therefore, in the first embodiment, in the read operation, the memory controller 200 issues the prefix command "X" for designating a data latch circuit to be used to the NAND flash memory 100. The NAND flash memory 100 performs a read operation using the data latch circuit designated by the prefix command With this configuration, in the suspend read in which the write operation is interrupted, read data can be stored in the data latch circuit while write data is stored in the data latch circuit without being saved or moved. When the write operation is resumed after the interruption, for example, the write operation can be resumed and executed using the write data stored in the data latch circuits ADL, BDL, and CDL.

The suspend read can be speeded up and the write operation can be speeded up. Power consumption can be reduced. With this configuration, performance of the NAND flash memory 100 and the memory system 1 can be improved.

In a state where the data latch circuits ADL, BDL, and CDL store the write data, a read operation (including DLA read and soft bit read) can be performed using the data latch circuits NDL and UDL.

2. Second Embodiment

The second embodiment includes a first latch group that stores write data and a second latch group that stores backup data of the first latch group. When two types of write operations are performed using the same write data, these two types of write operations are performed without inputting the write data again in the NAND flash memory 100.

2-1. Configuration of Sense Unit 13

Figure 26:
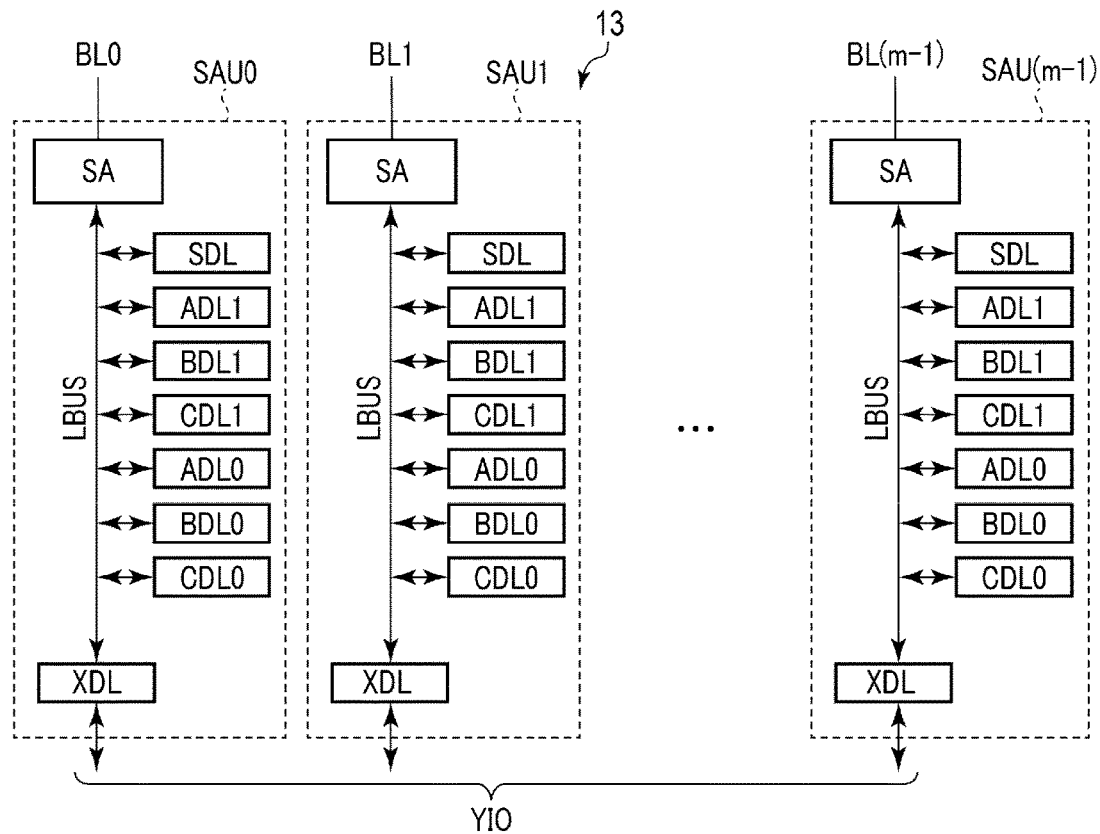
FIG. 26 is a block diagram of a sense unit according to a second embodiment.

A configuration of the sense unit 13 according to the second embodiment will be described. FIG. 26 is a block diagram of the sense unit 13 according to the second embodiment. The sense unit 13 includes sense amplifier units SAU0 to SAU(m−1) corresponding to the bit lines BL0 to BL(m−1).

Each sense amplifier unit SAU includes a sense amplifier SA and, for example, eight data latch circuits ADL0, BDL0, and CDL0, ADL1, BDL1, and CDL1, SDL, and XDL. The sense amplifier SA and the data latch circuits ADL0, BDL0, and CDL0, ADL1, BDL1, and CDL1, SDL, and XDL are connected via the bus LBUS so that data may be transferred to each other.

The data latch circuits ADL0, BDL0, and CDL0, ADL1, BDL1, and CDL1, SDL, and XDL temporarily store data. The data latch circuit SDL stores, for example, data read from the memory cell during the read operation, and stores a verification result. The data latch circuit ADL0 stores the lower page and stores the verification result. The data latch circuit BDL0 stores the middle page and stores the verification result. The data latch circuit CDL0 stores the upper page and stores the verification result.

The data latch circuits ADL1, BDL1, and CDL1 are used for data backup, for example. The data latch circuit ADL1 is used for data backup of the data latch circuit ADL0 and stores the lower page. The data latch circuit BDL1 is used for data backup of the data latch circuit BDL0 and stores the middle page. The data latch circuit CDL1 is used for data backup of the data latch circuit CDL0 and stores the upper page.

2-2. Write Method

First, the overall flow of a write operation will be described. A write operation (also referred to as a write sequence) is composed of a plurality of program loops repeated in order. Each of the plurality of program loops includes a program operation and a verification operation.

The program operation is an operation of increasing the threshold voltage of the memory cell transistor MT by injecting charges (electrons) into the charge storage layer of the memory cell transistor MT, or maintaining the threshold voltage of the memory cell transistor MT by inhibiting the injection of electrons into the charge storage layer. A program voltage VPGM is applied to the selected word line.

The verification operation is an operation of reading data of the memory cell transistor MT after the program operation and determining whether or not the threshold voltage of the memory cell transistor MT reaches a target level. A desired verification voltage is applied to the selected word line. The case where the threshold voltage of the memory cell transistor MT reaches the target level is expressed as "verification is passed", and the case where the threshold voltage does not reach the target level is referred to as "verification is failed". Details of the verification operation are the same as the read operation.

Next, the writing method according to the second embodiment will be described. In this embodiment, three pages of data are executed in two steps, a first write operation and a second write operation. The first write operation is referred to as a foggy program. The second write operation is referred to as a fine program. The first write operation is a coarse write operation, and a width in the threshold voltage distribution width of each state after the first write operation is completed is relatively wide. The second write operation is a fine write operation, and the threshold voltage of the memory cell is finally set by the second write operation.

Figure 27:
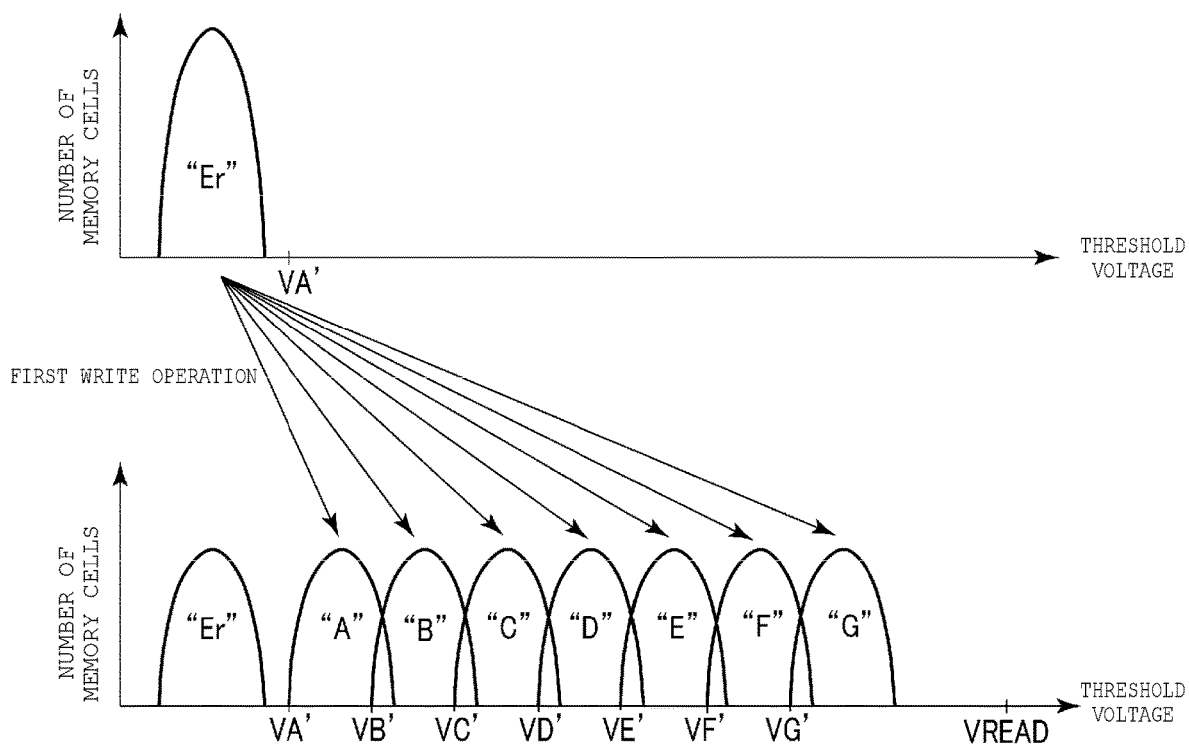
FIG. 27 is a schematic diagram illustrating an example of a threshold voltage distribution of memory cell transistors in a first write operation.

First, the first write operation will be described. FIG. 27 is a schematic diagram illustrating an example of the threshold voltage distribution of the memory cell transistor MT in the first write operation.

The threshold voltage of the memory cell transistor MT before executing the first write operation corresponds to the state "Er". The threshold voltage of the memory cell transistor MT belonging to the state "Er" is lower than the verification voltage VA' and has a negative value, for example.

The state machine 28 performs the first write operation using three pages of write data received from the memory controller 200. In the first write operation, the state machine 28 uses verification voltages VA', VB', VC', VD', VE', VF', and VG'. The relationship between verification voltages is "VA'<VB'<VC'<VD'<VE'<VF'<VG'<VREAD".

When the first write operation is executed, the threshold voltage of the memory cell transistor MT is appropriately changed based on the write data, and eight threshold voltage distributions are formed. As illustrated in FIG. 27, in the threshold voltage distribution after the first write operation, a width of the verification voltage is wide, and adjacent threshold voltage distributions may partially overlap.

Figure 28:
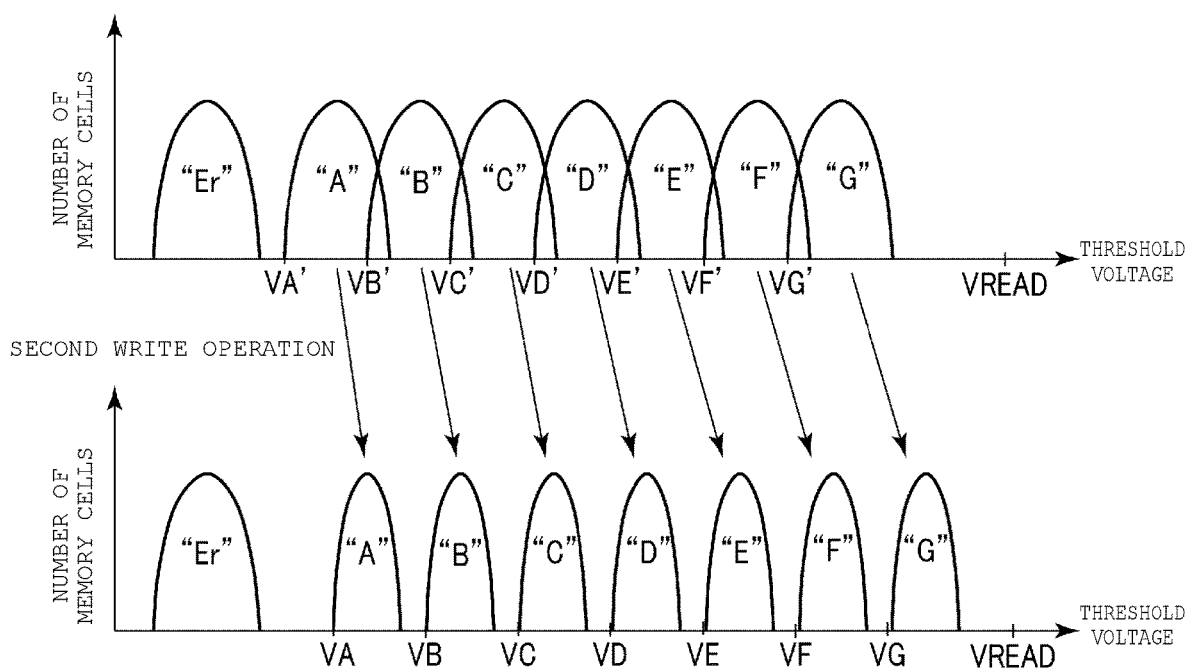
FIG. 28 is a schematic diagram illustrating an example of a threshold voltage distribution of memory cell transistors in a second write operation.

Next, the second write operation will be described. FIG. 28 is a schematic diagram illustrating an example of the threshold voltage distribution of the memory cell transistor MT in the second write operation.

The state machine 28 performs the second write operation using the same three pages of write data as in the first write operation. In the second write operation, the state machine 28 uses the verification voltages VA, VB, VC, VD, VE, VF, and VG. For example, the relationships between the verification voltages are "VA'<VA, VB'<VB, VC'<VC, VD'<VD, VE'<VE, VF'<VF, VG'<VG", and "VA<VB<VC<VD<VE<VF<VG<VREAD".

When the second write operation is executed, the threshold voltage of the memory cell transistor MT is appropriately changed based on the write data, and eight threshold voltage distributions are formed. As illustrated in FIG. 28, the width of threshold voltage in the threshold voltage distribution after the second write operation is narrower than that of the threshold voltage distribution after the first write operation.

2-3. Write Operation

Figure 29:
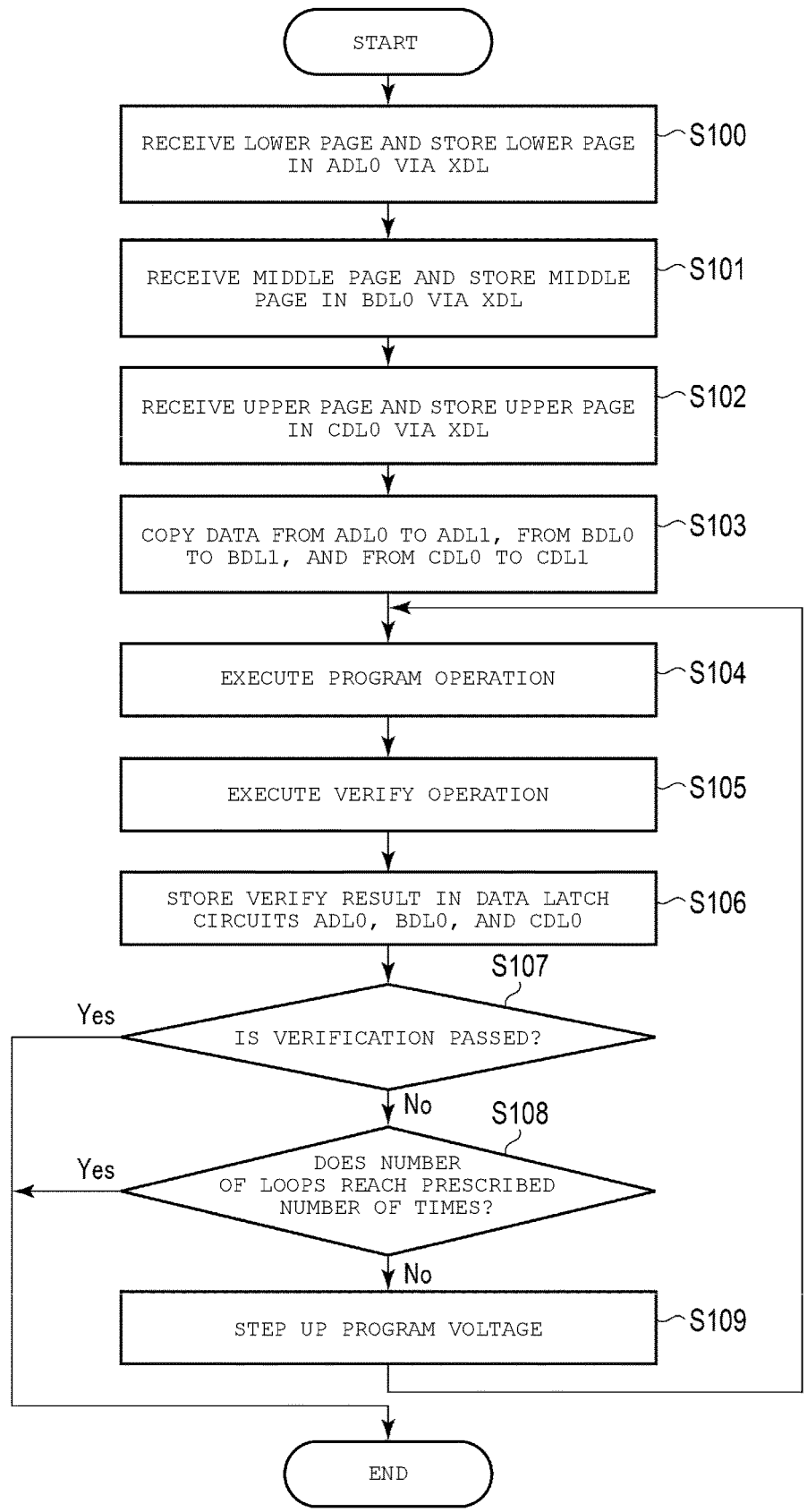
FIG. 29 is a flowchart for showing a write operation according to the second embodiment.

Next, a write operation according to the second embodiment will be described. FIG. 29 is a flowchart for showing the write operation according to the second embodiment. The write operation described here is the first write operation of the first write operation and the second write operation described above.

The NAND flash memory 100 receives a lower page together with a command and an address from the memory controller 200. The state machine 28 stores the lower page in the data latch circuit ADL0 via the data latch circuit XDL (step S100).

Subsequently, the NAND flash memory 100 receives a middle page together with the command and the address from the memory controller 200. The state machine 28 stores the middle page in the data latch circuit BDL0 via the data latch circuit XDL (step S101).

Subsequently, the NAND flash memory 100 receives an upper page from the memory controller 200 together with the command and the address. The state machine 28 stores the upper page in the data latch circuit CDL0 via the data latch circuit XDL (step S102).

Subsequently, the state machine 28 performs a data copy operation of copying data from the first latch group (data latch circuits ADL0, BDL0, and CDL0) to the second latch group (data latch circuits ADL1, BDL1, and CDL1) (Step S103). That is, the state machine 28 copies data from the data latch circuit ADL0 to the data latch circuit ADL1, copies data from the data latch circuit BDL0 to the data latch circuit BDL1, and copies data from the data latch circuit CDL0 to the data latch circuit CDL1. With this configuration, the write data for three pages stored in the data latch circuits ADL0, BDL0, and CDL0 are backed up in the data latch circuits ADL1, BDL1, and CDL1.

Subsequently, the state machine 28 executes a program operation of applying a program voltage to the selected word line WL (step S104). Subsequently, the state machine 28 executes a verification operation (step S105).

Subsequently, the state machine 28 stores the verification result in the data latch circuits ADL0, BDL0, and CDL0 (step S106).

Subsequently, the state machine 28 determines whether or not the verification is passed (step S107). When it is determined that the verification is passed (Yes in step S107), the state machine 28 ends the write operation.

When it is determined that the verification is failed (No in step S107), the state machine 28 determines whether or not the number of times of program loops (also referred to as the number of loops) reaches a specified number of times (step S108). When it is determined that the number of times of program loops reaches the specified number of times (Yes in step S108), the state machine 28 ends the write operation. Then, the state machine 28 notifies the memory controller 200 that, for example, the write operation is not completed normally.

When it is determined that the number of times of program loops does not reach the specified number of times (No in step S108), the state machine 28 steps up a program voltage by a predetermined step-up voltage (step S109). Then, the state machine 28 repeats the operations of step S104 and subsequent steps.

2.4 Details of Write Operation

Figure 30:
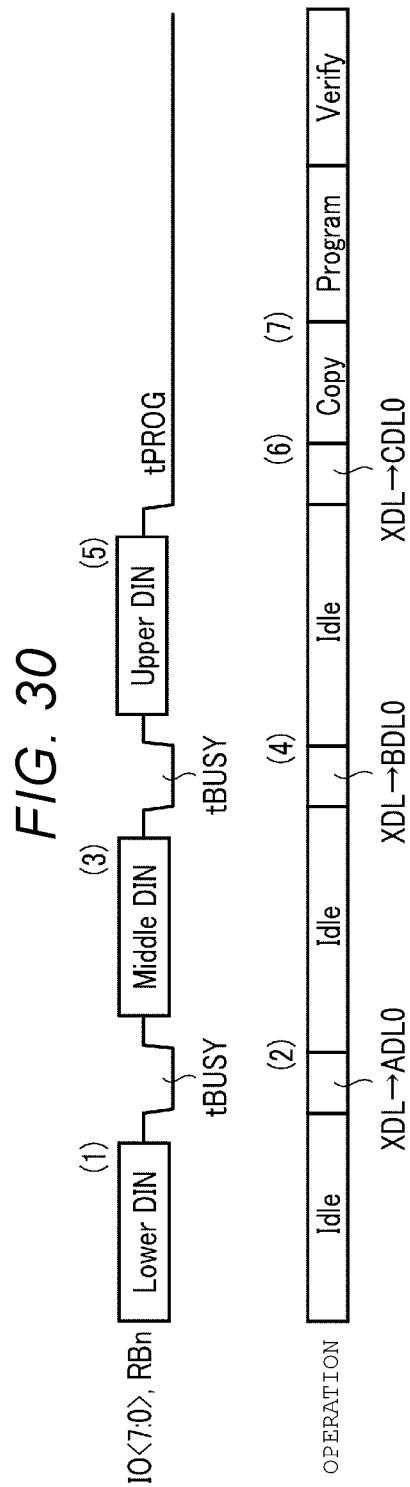
FIG. 30 is a timing diagram for showing the write operation according to the second embodiment.
Figure 31:
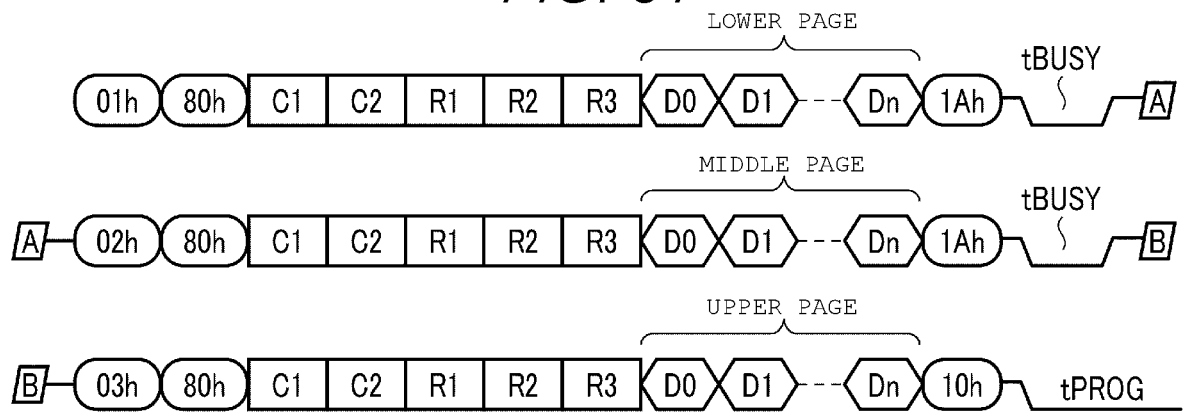
FIG. 31 is a timing diagram illustrating a command sequence corresponding to FIG. 30.

FIG. 30 is a timing diagram for showing the write operation according to the second embodiment. FIG. 31 is a timing diagram illustrating a command sequence corresponding to FIG. 30.

The memory controller 200 issues a command sequence ("Lower DIN" in FIG. 30) including a lower page to the NAND flash memory 100. The state machine 28 is in an idle state. The command sequence "Lower DIN" is composed of a preset command "01h", a write command "80h", an address set (column addresses C1 and C2, and row addresses R1 to R3), a lower page D0 to Dn, and a transfer command "1Ah". The preset command "01h" is a command for designating that subsequent write data is a lower page. The write command "80h" is a command for instructing a write operation. The transfer command "1Ah" is a command for instructing transfer of the write data transmitted immediately before from the data latch circuit XDL to one of the data latch circuits ADL, BDL, and CDL.

Figure 32:
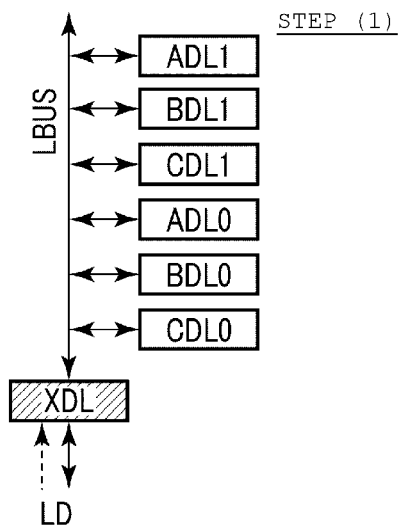
FIG. 32 is a diagram for showing a state of a data latch circuit in step (1) of FIG. 30.

FIG. 32 is a diagram for showing the state of the data latch circuit in step (1) of FIG. 30. In FIG. 32, the data latch circuit that is storing data is hatched (the same applies to FIGS. 33 to 38). In step (1) of FIG. 30, the data latch circuit XDL stores a lower page LD.

Figure 33:
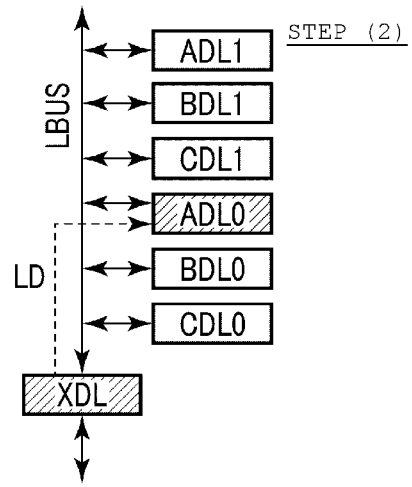
FIG. 33 is a diagram for showing a state of the data latch circuit in step (2) of FIG. 30.

When the state machine 28 receives the command "1Ah", the state machine 28 sets the ready/busy signal RBn to the low level for the time tBUSY and notifies the memory controller 200 that the NAND flash memory is in a busy state. Then, the state machine 28 transfers the lower page from the data latch circuit XDL to the data latch circuit ADL0. In FIG. 30, this transfer operation is denoted as "XDL→ADL0". FIG. 33 is a diagram for showing the state of the data latch circuit in step (2) of FIG. 30. The data latch circuit ADL0 stores a lower page LD.

Subsequently, the memory controller 200 issues a command sequence including the middle page ("Middle DIN" in FIG. 30) to the NAND flash memory 100. The state machine 28 is in an idle state. The command sequence "Middle DIN" is composed of a preset command "02h", the write command "80h", the address set (column addresses C1 and C2, and row addresses R1 to R3), a middle page D0 to Dn, and the transfer command "1Ah". The preset command "02h" is a command for designating that subsequent write data is a middle page.

Figure 34:
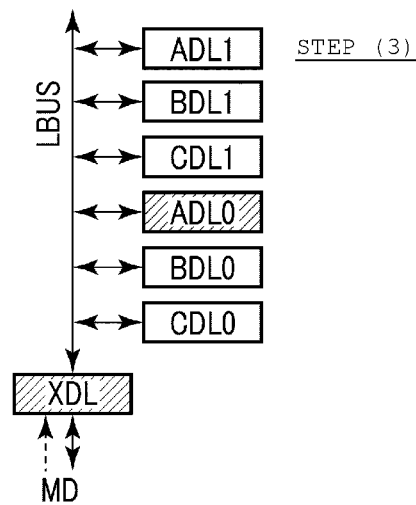
FIG. 34 is a diagram for showing an operation of the data latch circuit in step (3) of FIG. 30.

FIG. 34 is a diagram for showing the operation of the data latch circuit in step (3) of FIG. 30. In step (1) of FIG. 30, the data latch circuit XDL stores a middle page MD.

Figure 35:
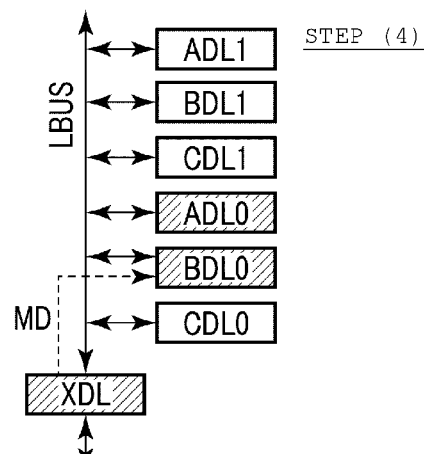
FIG. 35 is a diagram for showing a state of the data latch circuit in step (4) of FIG. 30.

When the state machine 28 receives the command "1Ah", the state machine 28 sets the ready/busy signal RBn to the low level for the time tBUSY and notifies the memory controller 200 that the NAND flash memory is in a busy state. Then, the state machine 28 transfers the middle page from the data latch circuit XDL to the data latch circuit BDL0. In FIG. 30, this transfer operation is denoted as "XDL→BDL0". FIG. 35 is a diagram for showing the state of the data latch circuit in step (4) of FIG. 30. The data latch circuit BDL0 stores the middle page MD.

Subsequently, the memory controller 200 issues a command sequence including the upper page ("Upper DIN" in FIG. 30) to the NAND flash memory 100. The state machine 28 is in an idle state. The command sequence "Upper DIN" is composed of a preset command "03h", the write command "80h", the address set (column addresses C1 and C2, and row addresses R1 to R3), an upper page D0 to Dn, and an execution command "10h". The preset command "03h" is a command for designating that subsequent write data is an upper page.

Figure 36:
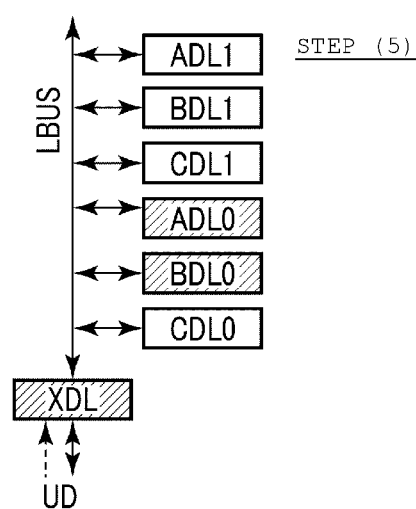
FIG. 36 is a diagram for showing an operation of the data latch circuit in step (5) of FIG. 30.

FIG. 36 is a diagram for showing the operation of the data latch circuit in step (5) of FIG. 30. In step (5) of FIG. 30, the data latch circuit XDL stores an upper page UD.

Figure 37:
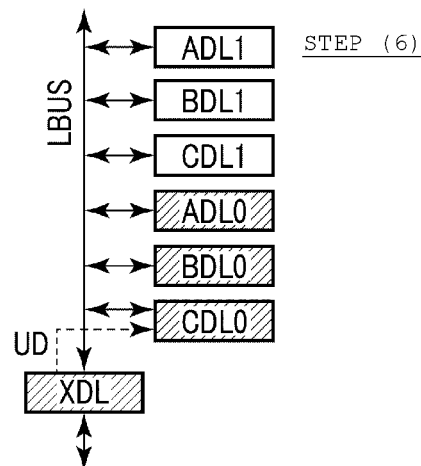
FIG. 37 is a diagram for showing a state of the data latch circuit in step (6) of FIG. 30.

When the state machine 28 receives the command "10h", the state machine 28 sets the ready/busy signal RBn to the low level for the time tPROG and notifies the memory controller 200 that the NAND flash memory is in a busy state. Then, the state machine 28 transfers the upper page from the data latch circuit XDL to the data latch circuit CDL0. In FIG. 30, this transfer operation is denoted as "XDL→CDL0". FIG. 37 is a diagram for showing the state of the data latch circuit in step (6) of FIG. 30. The data latch circuit CDL0 stores the upper page UD.

Figure 38:
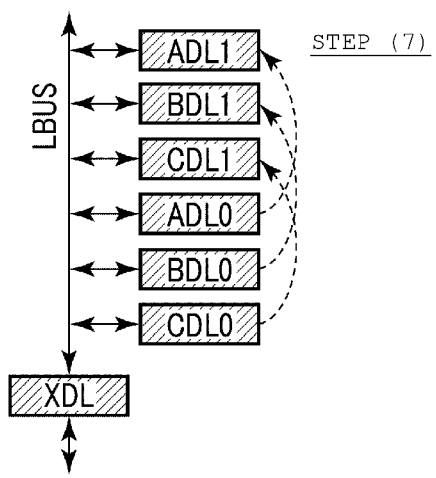
FIG. 38 is a diagram for showing a state of the data latch circuit in step (7) of FIG. 30.

Subsequently, the state machine 28 performs a data copy operation. That is, the state machine 28 copies data of the data latch circuits ADL0, BDL0, and CDL0 to the data latch circuits ADL1, BDL1, and CDL1 via the bus LBUS, respectively. FIG. 38 is a diagram for showing the state of the data latch circuit in step (7) of FIG. 30. The data latch circuits ADL0 and ADL1 store the lower page, the data latch circuits BDL0 and BDL1 store the middle page, and the data latch circuits CDL0 and CDL1 store the upper page. The order of data copy may be set as desired, and data copy may be executed in the order of the data latch circuits ADL0, BDL0, and CDL0, for example.

Subsequently, the state machine 28 executes a program operation. Subsequently, the state machine 28 executes a verification operation. In the program operation, write data stored in the data latch circuits ADL0, BDL0, and CDL0 is used. The verification result is stored in the data latch circuits ADL0, BDL0, and CDL0.

After completing the write operation, the state machine 28 returns the ready/busy signal RBn to the high level.

In the fine program after the foggy program, backup data stored in the data latch circuits ADL1, BDL1, and CDL1 may be used. That is, in the fine program, there is no need to input write data to the NAND flash memory 100 again. Details of the fine program will be described in a sixth embodiment to be described later.

The value of original write data (also referred to as backup data) stored in the data latch circuits ADL1, BDL1, and CDL1 is not changed or erased at least until the write operation is completed. The write data stored in the data latch circuits ADL1, BDL1, and CDL1 may be output to the outside of the NAND flash memory by a known method.

A method for forming the threshold voltage distributions of FIGS. 27 and 28 is not limited to this method, and may be formed by a necessary method as appropriate.

2-5. Effects of Second Embodiment

When the memory cell transistor MT stores 3-bit data, in the case of a so-called triple level cell (TLC) system, the data latch circuits ADL, BDL, and CDL store write data (lower page, middle page, and upper page). In the write operation, since the data latch circuits ADL, BDL, and CDL store the verification results, the write data stored in the data latch circuits ADL, BDL, and CDL is destroyed when the write operation is completed.

When the fine program is executed after the foggy program, it is necessary to input the write data to the NAND flash memory 100 again. When a write error occurs and data is written to another cell unit CU, it is necessary to input write data to the NAND flash memory 100 again. In this case, the IO bus is occupied and performance deteriorates.

In the second embodiment, the NAND flash memory 100 includes a first latch group (data latch circuits ADL0, BDL0, and CDL0) and a second latch group (data latch circuits ADL1, BDL1, and CDL1) as data latch circuits for storing write data. Then, the write data stored in the first latch group is copied to the second latch group. Thereafter, a write operation is performed using the write data of the first latch group.

Accordingly, according to the second embodiment, backup data of the write data remains in the data latch circuit. Therefore, when the fine program is executed after the foggy program, it is not necessary to input the write data to the NAND flash memory 100 again. With this configuration, the write operation can be speeded up. Power consumption can be reduced. With this configuration, performance of the NAND flash memory 100 and the memory system 1 can be improved.

Even when a write error occurs, it is not necessary to input write data to the NAND flash memory 100 again. With this configuration, a rewrite operation can be speeded up.

3. Third Embodiment

In the third embodiment, a copy command for copying data from the data latch circuits ADL0, BDL0, and CDL0 to the data latch circuits ADL1, BDL1, and CDL1 is newly defined. The NAND flash memory 100 performs a data copy operation when receiving a copy command from the memory controller 200.

3-1. Operation of Memory System 1

Figure 39:
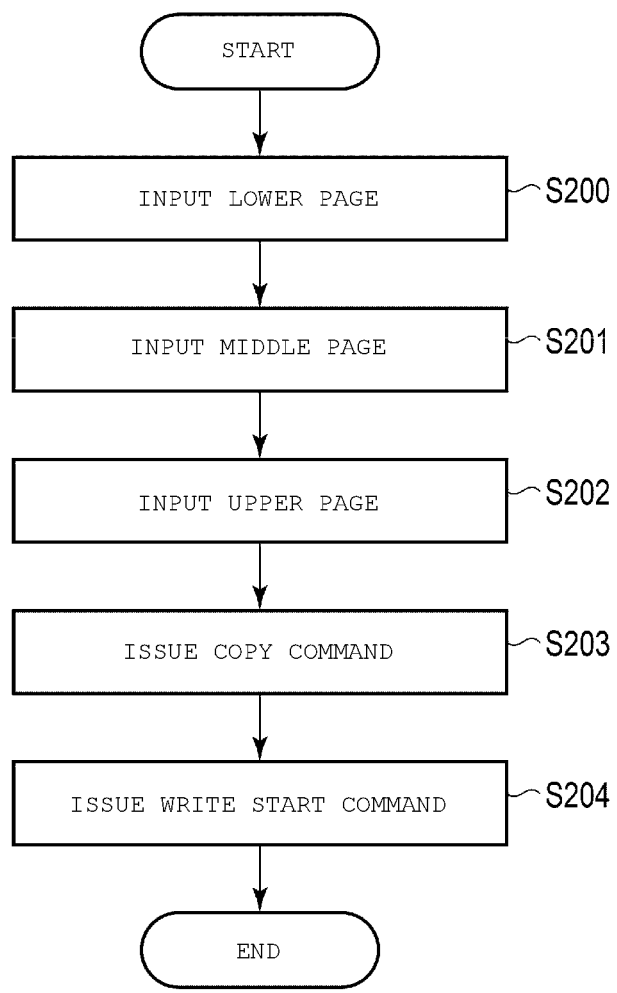
FIG. 39 is a flowchart for showing an operation of a memory controller according to a third embodiment.
Figure 40:
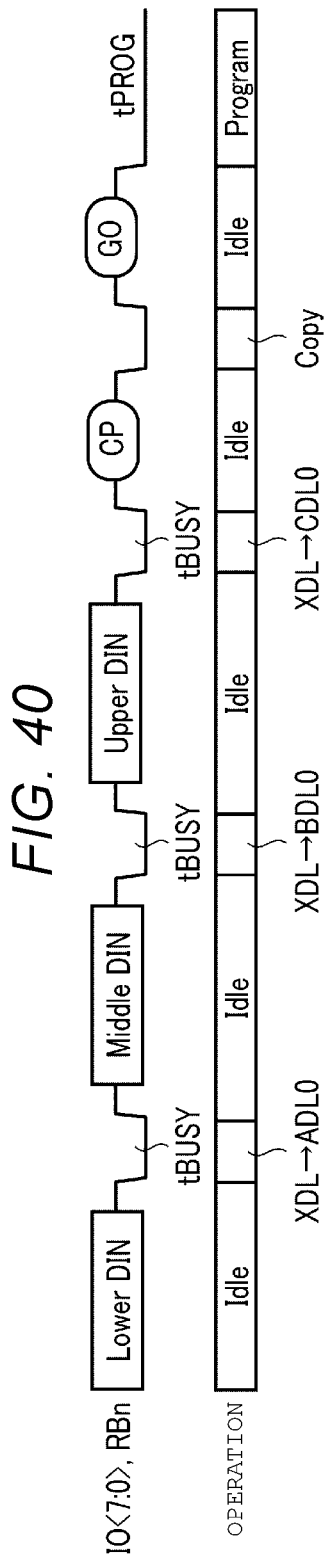
FIG. 40 is a timing diagram for showing a write operation according to the third embodiment.
Figure 41:
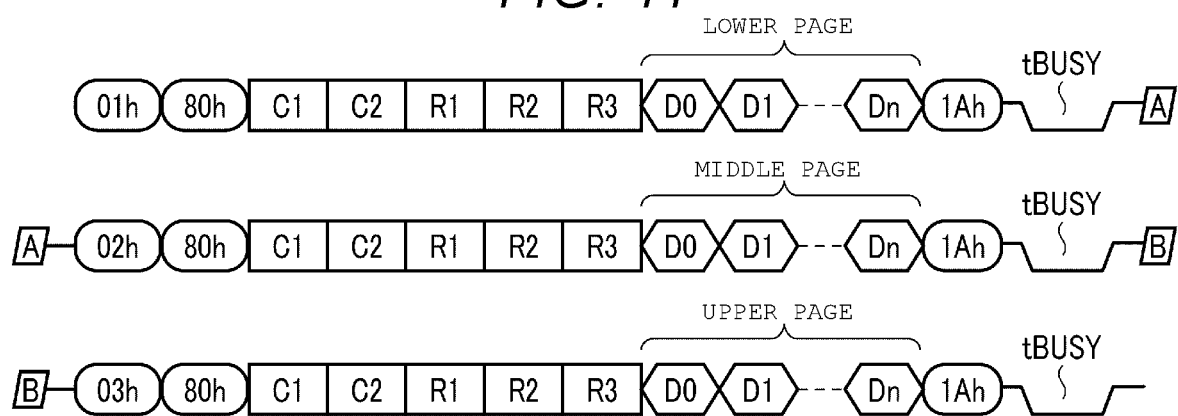
FIG. 41 is a timing diagram illustrating a command sequence corresponding to FIG. 40.

FIG. 39 is a flowchart for showing the operation of the memory controller 200 according to the third embodiment. FIG. 40 is a timing diagram illustrating a write operation according to the third embodiment. FIG. 41 is a timing diagram illustrating a command sequence corresponding to FIG. 40.

The memory controller 200 issues a command sequence "Lower DIN" and inputs a lower page to the NAND flash memory 100 (step S200) The command sequence "Lower DIN" includes a preset command "01h", a write command "80h", an address set (column addresses C1 and C2, and row addresses R1 to R3), a lower page D0 to Dn, and a transfer command "1Ah". The state machine 28 transfers the lower page to the data latch circuit ADL0.

Subsequently, the memory controller 200 issues a command sequence "Middle DIN" and inputs a middle page to the NAND flash memory 100 (step S201). The command sequence "Middle DIN" is composed of a preset command "02h", the write command "80h", the address set (column addresses C1 and C2, and row addresses R1 to R3), a middle page D0 to Dn, and the transfer command "1Ah". The state machine 28 transfers the middle page to the data latch circuit BDL0.

Subsequently, the memory controller 200 issues a command sequence "Upper DIN" and inputs an upper page to the NAND flash memory 100 (step S202). The command sequence "Upper DIN" is composed of a preset command "03h", the write command "80h", the address set (column addresses C1 and C2, and row addresses R1 to R3), an upper page D0 to Dn, and the transfer command "1Ah". The state machine 28 transfers the upper page to the data latch circuit CDL0.

Subsequently, the memory controller 200 issues a copy command "CP" to the NAND flash memory 100 (step S203). When the copy command "CP" is received, the state machine 28 sets the ready/busy signal RBn to the low level for a predetermined time. Then, the state machine 28 executes a data copy operation. That is, the state machine 28 copies data of the data latch circuits ADL0, BDL0, and CDL0 to the data latch circuits ADL1, BDL1, and CDL1 via the bus LBUS, respectively.

Subsequently, the memory controller 200 issues a write start command "GO" to the NAND flash memory 100 (step S204). When the state machine 28 receives the write start command "GO", the state machine 28 sets the ready/busy signal RBn to the low level for the time tPROG. The state machine 28 executes a write operation (including a program operation and a verification operation). In the program operation, write data stored in the data latch circuits ADL0, BDL0, and CDL0 is used. The verification result is stored in the data latch circuits ADL0, BDL0, and CDL0.

In the block diagram of the NAND flash memory 100 illustrated in FIG. 2, a signal (not illustrated) corresponding to the copy command "CP" is newly provided from the command decoder 25 to the state machine 28.

3-2. Effects of Third Embodiment

In the third embodiment, the NAND flash memory 100 can generate backup data based on a command from the memory controller 200. The data backed up in this way can be reused without being subjected to data-in again at the time of the second write operation after the first write operation and the rewrite after the program fail, similarly as in the second embodiment. With this configuration, the performance of the NAND flash memory 100 and the memory system 1 can be improved.

The memory controller 200 may issue a copy command "CP" in any manner. Specifically, the memory controller 200 does not need to issue the copy command "CP" for each write operation, and issues the copy command "CP" only when necessary. With this configuration, when the data copy operation is not performed, the time required for the operation can be reduced.

4. Fourth Embodiment

In the fourth embodiment, write data is stored in the data latch circuits ADL0, BDL0, and CDL0, and a verification result is stored in the data latch circuits ADL1, BDL1, and CDL1. The write data stored in the data latch circuits ADL0, BDL0, and CDL0 are used as backup data without being rewritten.

4-1. Operation of Memory System 1

Figure 42:
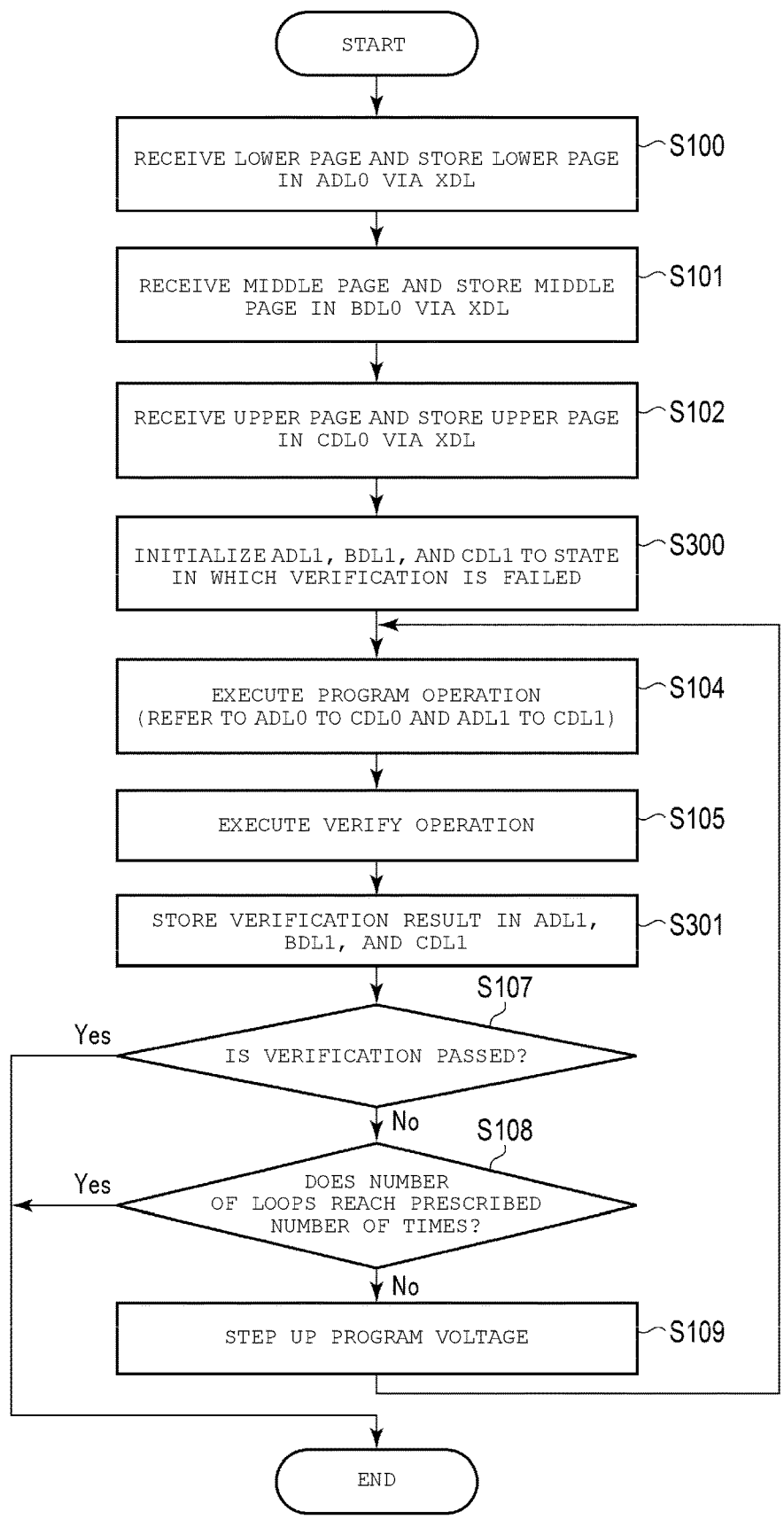
FIG. 42 is a flowchart for showing a write operation according to a fourth embodiment.
Figure 43:
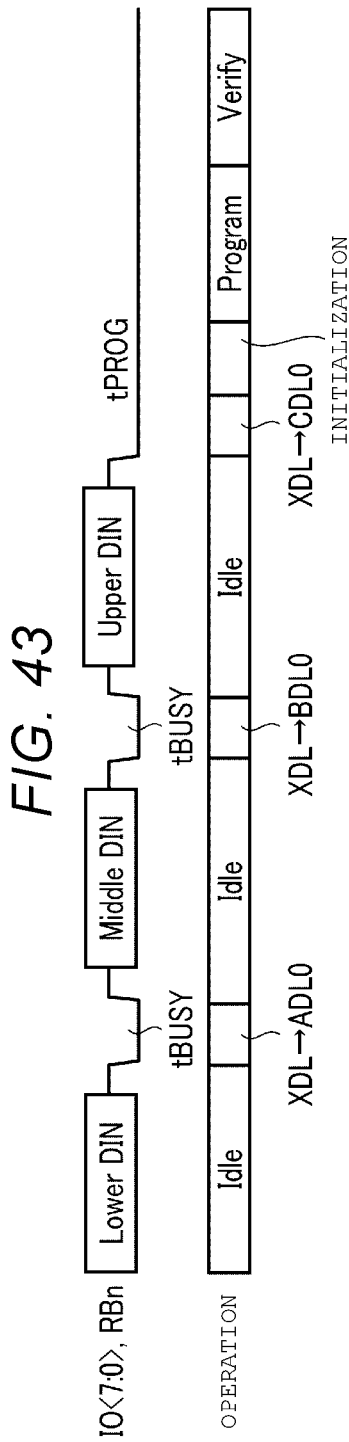
FIG. 43 is a timing diagram for showing the write operation according to the fourth embodiment.

FIG. 42 is a flowchart for showing a write operation according to a fourth embodiment. FIG. 43 is a timing diagram illustrating the write operation according to the fourth embodiment.

The operations in steps S100 to S102 in FIG. 42 are the same as those in FIG. 29. Subsequently, the state machine 28 initializes the data latch circuits ADL1, BDL1, and CDL1 to a state in which the verification is failed (step S300). When the verify state corresponds to, for example, data "0", the data latch circuits ADL1, BDL1, and CDL1 are initialized to store data "0".

Subsequently, the state machine 28 executes the program operation (step S104). The state machine 28 generates write data used in the program operation with reference to the data latch circuits ADL0 to CDL0 and the data latch circuits ADL1 to CDL1.

Figure 44:
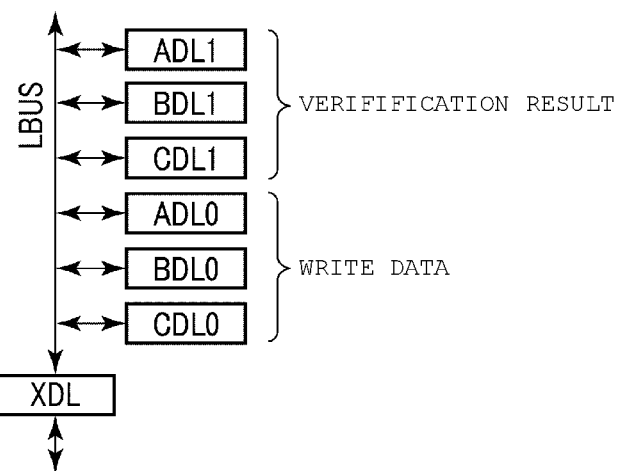
FIG. 44 is a diagram for showing a state of a data latch circuit after a verification operation.

Subsequently, the state machine 28 executes a verification operation (step S105). Subsequently, the state machine 28 stores the verification result in the data latch circuits ADL1, BDL1, and CDL1 (step S301). FIG. 44 is a diagram for showing the state of the data latch circuit after the verification operation. The subsequent operation is the same as in FIG. 29.

The original write data stored in the data latch circuits ADL0, BDL0, and CDL0 as backup data is not changed or erased at least until the write operation is completed. The write data stored in the data latch circuits ADL0, BDL0, and CDL0 can be output to the outside of the NAND flash memory by a known method.

In this embodiment, although the verification result is stored in the three data latch circuits ADL1, BDL1, and CDL1, but in principle, it suffices to store whether verification is passed or failed, that is, the verification result may be stored in at least one data latch circuit.

4-2. Effects of Fourth Embodiment

In the fourth embodiment, backup data can be stored in the data latch circuits ADL0, BDL0, and CDL0. The verification result can be stored and updated in the data latch circuits ADL1, BDL1, and CDL1.

The data remaining in the data latch circuits ADL0, BDL0, and CDL0 in this way can be reused without being subjected to data-in again at the time of the second write operation after the first write operation and the rewrite after the program fail, and the performance of the NAND flash memory 100 and the memory system 1 can be improved.

As compared with the second and third embodiments, it is possible to reduce the time for the write operation in that an operation of copying lower data, middle data, and higher data is not required.

5. Fifth Embodiment

The fifth embodiment is another configuration example of the connection relationship between the data latch circuits. In the fifth embodiment, the data latch circuit ADL0 and the data latch circuit ADL1 are connected in parallel not through the bus LBUS. Data copy from the data latch circuit ADL0 to the data latch circuit ADL1 is performed not through the bus LBUS.

5-1. Configuration of Sense Unit 13

Figure 45:
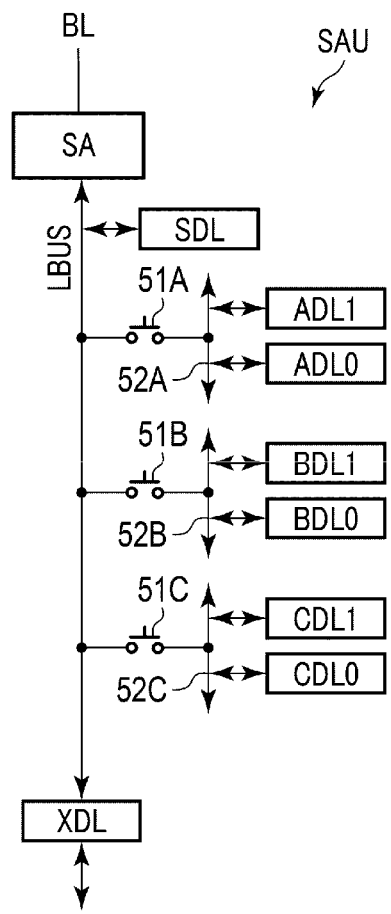
FIG. 45 is a block diagram of a sense unit according to a fifth embodiment.

FIG. 45 is a block diagram of the sense unit 13 according to the fifth embodiment. In FIG. 45, one sense amplifier unit SAU connected to any bit line BL is extracted and illustrated. All the sense amplifier units SAU in the sense unit 13 have the configuration illustrated in FIG. 45.

The sense amplifier unit SAU further includes switch elements 51A to 51C and data lines 52A to 52C.

The data latch circuit ADL0 and data latch circuit ADL1 are connected to the data line 52A. One end of the switch element 51A is connected to the bus LBUS (specifically, one data line in the bus LBUS), and the other end is connected to the data line 52A.

The data latch circuit BDL0 and data latch circuit BDL1 are connected to the data line 52B. One end of the switch element 51B is connected to the bus LBUS and the other end is connected to the data line 52B.

The data latch circuit CDL0 and data latch circuit CDL1 are connected to the data line 52C. One end of the switch element 51C is connected to the bus LBUS and the other end is connected to the data line 52C.

The operation of the switch elements 51A-51C is controlled by the state machine 28.

5-2. Effects of Fifth Embodiment

In the fifth embodiment, data copy between the data latch circuits is not performed. Instead, data is written to the data latch circuit ADL0 and the data latch circuit ADL1 in parallel, to the data latch circuit BDL0 and the data latch circuit BDL1 in parallel, and to the data latch circuit CDL0 and the data latch circuit CDL1 in parallel. With this configuration, the time required for the write operation can be shortened because the data copy operation is not performed.

In this way, the data remaining in the data latch circuits ADL1, BDL1, and CDL1 can be reused without being subjected to data-in again at the time of the second write operation after the first write operation and the rewrite after the program fail, and the performance of the NAND flash memory 100 and the memory system 1 can be improved.

A bus to which a large number of data latch circuits are connected has a large capacity load, and there is a concern that data transfer through that bus takes time. However, in this embodiment, the bus LBUS and the data line 52A, for example, are electrically separated by the switch element 51A, and thus there is an advantage that the data copy operation can be performed at a high speed.

6. Sixth Embodiment

In the sixth embodiment, the memory system 1 employs separate commands to designate that a write operation is to be performed using write data (backup data) stored in the first latch group (data latch circuits ADL0, BDL0, and CDL0) and a command designating that a write operation is to be performed using the write data (backup data) stored in the second latch group (data latch circuits ADL1, BDL1, and CDL1).

6-1. Configuration of NAND Flash Memory 100

Figure 46:
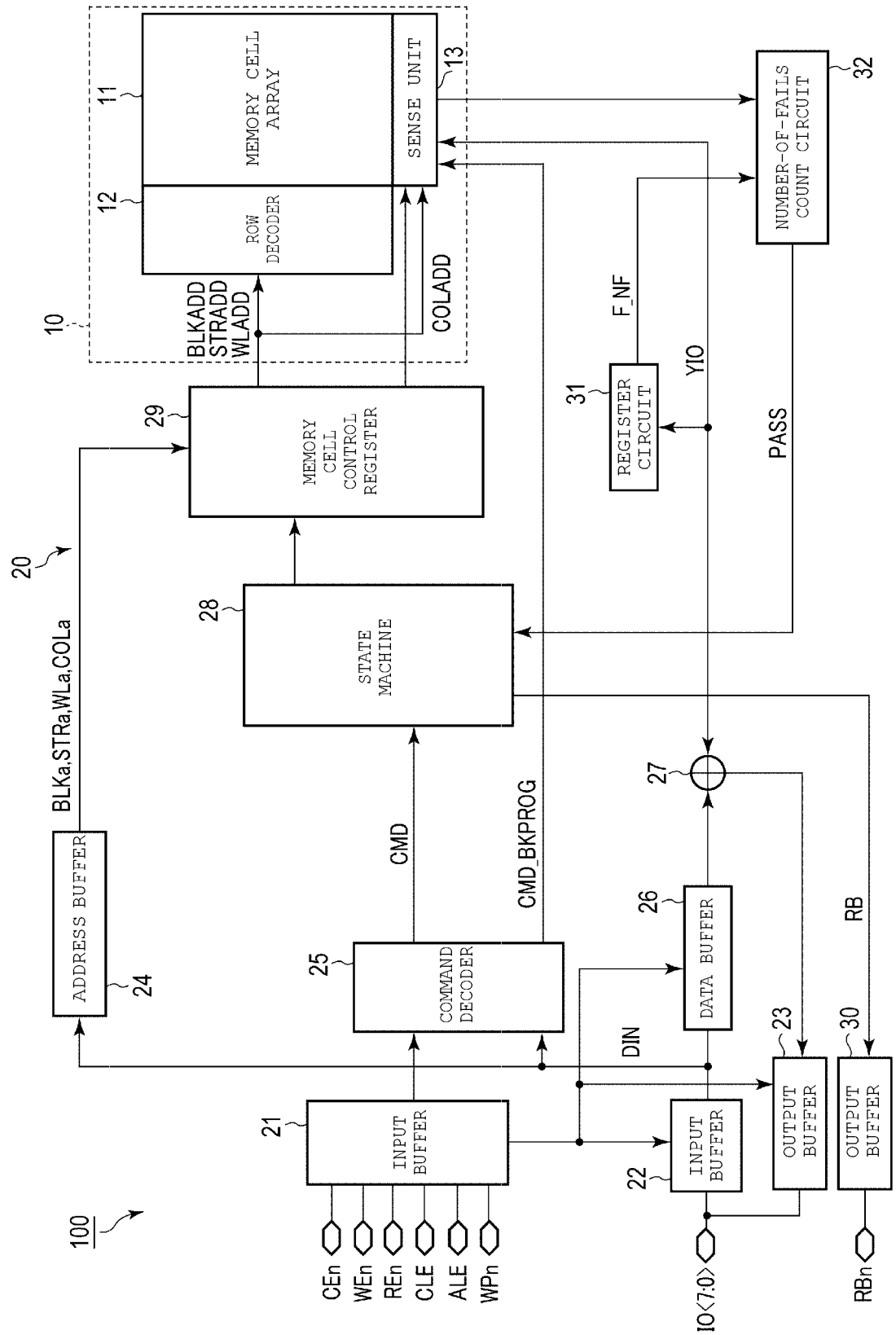
FIG. 46 is a block diagram of a NAND flash memory according to a sixth embodiment.

FIG. 46 is a block diagram of the NAND flash memory 100 according to the sixth embodiment.

The memory controller 200 may issue a first write command and a second write command. The first write command is a command designating that the write operation is performed using the write data stored in the first latch group (data latch circuits ADL0, BDL0, and CDL0). The second write command is a command designating that the write operation is performed using the write data stored in the second latch group (data latch circuits ADL1, BDL1, and CDL1). Specific examples of the first write command and the second write command will be described later.

When the second write command is received, the command decoder 25 generates a signal CMD_BKPROG. The signal CMD_BKPROG is sent to the sense unit 13. For example, the command decoder 25 sets the signal CMD_BKPROG to the low level when the first write command is received, and sets the signal CMD_BKPROG to the high level when the second write command is received.

6-2. Configuration of Sense Amplifier Unit SAU

Figure 47:
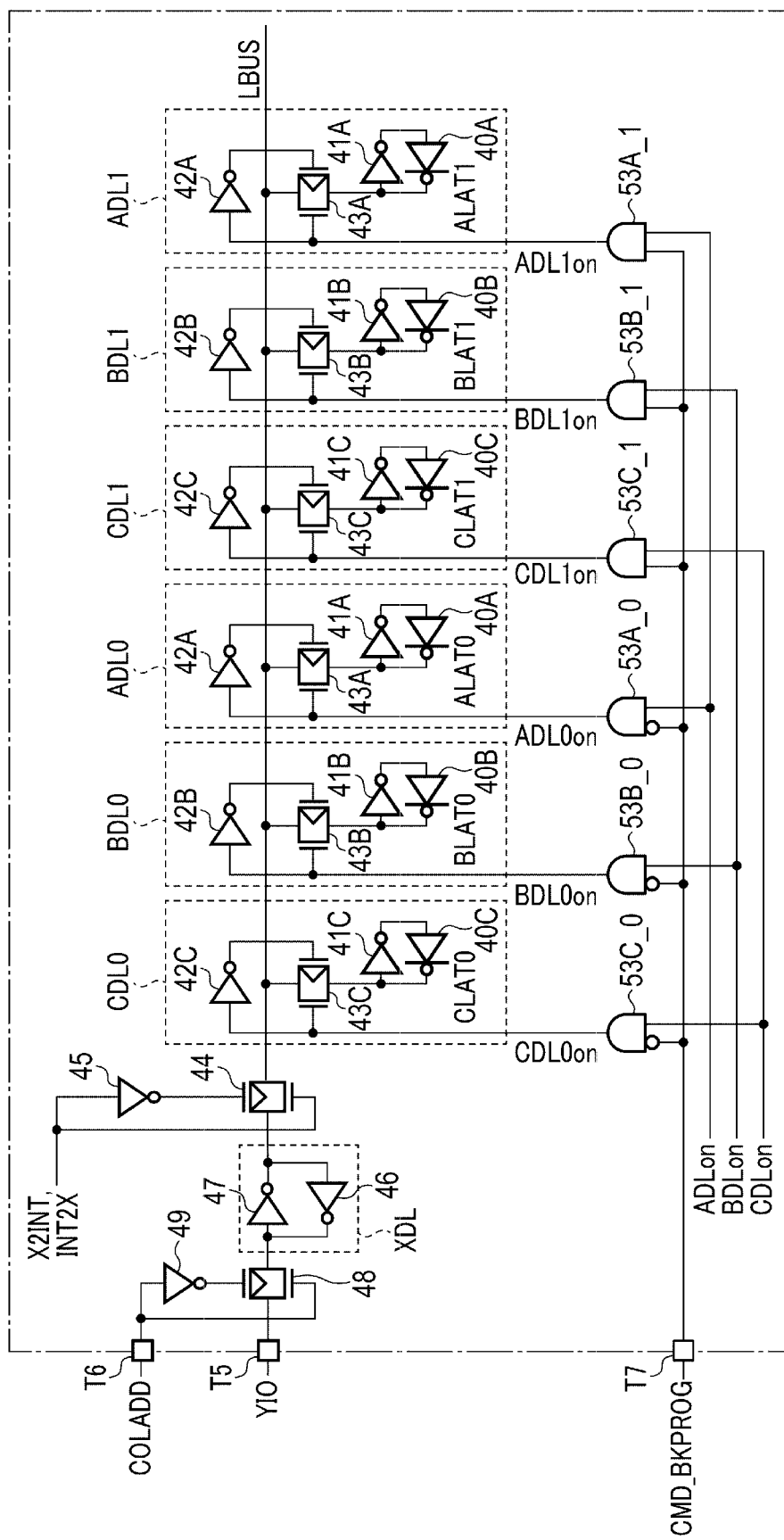
FIG. 47 is a circuit diagram of a part of a sense amplifier unit SAU according to a sixth embodiment.

Next, the configuration of the sense amplifier unit SAU will be described. FIG. 47 is a circuit diagram of a part of the sense amplifier unit SAU.

The sense amplifier unit SAU includes data latch circuits ADL0, BDL0, and CDL0, ADL1, BDL1, and CDL1. In FIG. 47, the data latch circuit SDL is not illustrated.

The configuration of the data latch circuits ADL0, BDL0, and CDL0, ADL1, BDL1, and CDL1 is the same as that of the data latch circuits ADL, BDL, CDL in FIG. 20. For simplicity, the elements of the data latch circuits ADL0 and ADL1 are denoted by the same reference numerals. The same applies to the data latch circuits BDL0 and BDL1 and the data latch circuits CDL0 and CDL1.

Signals ALAT0, BLAT0, CLAT0, ALAT1, BLAT1, and CLAT1 are input to the data latch circuits ADL0, BDL0, and CDL0, ADL1, BDL1, and CDL1, respectively, from the logic circuit 50 (not illustrated). The signals ALAT0, BLAT0, CLAT0, ALAT1, BLAT1, and CLAT1 are input to clock terminals of the corresponding clocked inverter circuit 40, respectively.

The sense unit 13 includes six AND gates 53A_0, 53A_1, 53B_0, 53B_1, 53C_0, and 53C_1, and a terminal T7. The signal CMD_BKPROG is input to the terminal T7.

An inverted signal of the signal CMD_BKPROG is input to the first input terminal of the AND gate 53A_0, and the signal ADLon is input from the logic circuit 50 to the second input terminal thereof. The AND gate 53A_0 outputs a signal ADL0on. The signal ADL0on is input to the data latch circuit ADL0.

An inverted signal of the signal CMD_BKPROG is input to the first input terminal of the AND gate 53B_0, and the signal BDLon is input from the logic circuit 50 to the second input terminal thereof. The AND gate 53B_0 outputs a signal BDL0on. The signal BDL0on is input to the data latch circuit BDL0.

An inverted signal of the signal CMD_BKPROG is input to the first input terminal of the AND gate 53C_0, and the signal CDLon is input from the logic circuit 50 to the second input terminal thereof. The AND gate 53C_0 outputs a signal CDL0on. The signal CDL0on is input to the data latch circuit CDL0.

The signal CMD_BKPROG is input to the first input terminal of the AND gate 53A_1, and the signal ADLon is input from the logic circuit 50 to the second input terminal thereof. The AND gate 53A_1 outputs a signal ADL1on. The signal ADL1on is input to the data latch circuit ADL1.

The signal CMD_BKPROG is input to the first input terminal of the AND gate 53B_1, and the signal BDLon is input from the logic circuit 50 to the second input terminal thereof. The AND gate 53B_1 outputs a signal BDL1on. The signal BDL1on is input to the data latch circuit BDL1.

The signal CMD_BKPROG is input to the first input terminal of the AND gate 53C_1, and the signal CDLon is input from the logic circuit 50 to the second input terminal thereof. The AND gate 53C_1 outputs a signal CDL1on. The signal CDL1on is input to the data latch circuit CDL1.

In the sense unit 13 configured as described above, when the signal ADLon is activated (high level) and the signal CMD_BKPROG is at a low level, the data latch circuit ADL0 is used. When the signal ADLon is activated and the signal CMD_BKPROG is at a high level, the data latch circuit ADL1 is used. Similarly, the data latch circuits BDL0 and BDL1 are controlled by the signal BDLon and the signal CMD_BKPROG, and the data latch circuits CDL0 and CDL1 are controlled by the signal CDLon and the signal CMD_BKPROG.

6-3. Operation of Memory System 1

The write operation using the first latch group (data latch circuits ADL0, BDL0, and CDL0) is the same as in FIGS. 29 to 31 of the second embodiment. In the sense unit 13, the signals ADL0on, BDL0on, and CDL0on go into the high level, and data transfer to the data latch circuits ADL0, BDL0, and CDL0 becomes possible. At that time, the second latch group (data latch circuits ADL1, BDL1, and CDL1) stores write data.

Next, a write operation using the second latch group will be described.

Figure 48:
FIG. 48 is a timing diagram illustrating a command sequence in a write operation according to the sixth embodiment.

FIG. 48 is a timing diagram illustrating a command sequence in a write operation according to the sixth embodiment. In the write operation using the second latch group, a write command different from the write command "80h" of the write operation using the first latch group, for example, "82h" is used. When the command "82h" is received, the command decoder 25 illustrated in FIG. 46 is configured such that the signal CMD_BKPROG is activated. The signal CMD_BKPROG is configured to maintain the activated state at least during execution of the write operation.

The memory controller 200 issues a preset command "01h", a write command "82h", an address set (column addresses C1 and C2, and row addresses R1 to R3), and the transfer command "1Ah" as a command sequence for instructing data-in of the lower page. The command sequence does not include write data ("No DataIn" in FIG. 48).

Subsequently, the memory controller 200 issues a preset command "02h", the write command "82h", the address set (column addresses C1 and C2, and row addresses R1 to R3), and the transfer command "1Ah" as a command sequence for instructing data-in of the middle page. The command sequence also does not include write data.

Subsequently, the memory controller 200 issues a preset command "03h", the write command "82h", the address set (column addresses C1 and C2, and row addresses R1 to R3), and a transfer command "10h" as a command sequence for instructing upper-page data-in. The command sequence also does not include write data.

Subsequently, the NAND flash memory 100 performs a write operation using the write data stored in the second latch group. In the sense unit 13, the signals ADL1on, BDL1on, and CDL1on go into a high level, and data transfer to the data latch circuits ADL1, BDL1, and CDL1 becomes possible.

6-4. Effects of Sixth Embodiment

In the sixth embodiment, in response to the write command "82h", the write operation can be executed using the backup data stored in the second latch group (data latch circuits ADL1, BDL1, and CDL1). In this case, re-input of write data is not necessary.

With this configuration, when the fine program is executed after the foggy program, the write operation can be speeded up. When a write error occurs, the rewrite operation can be speeded up.

7. Seventh Embodiment

The seventh embodiment is another configuration example of the connection relationships between the data latch circuits. In the seventh embodiment, the data latch circuit ADL0 and the data latch circuit ADL1 are connected in series not through the bus LBUS. Data copy from the data latch circuit ADL0 to the data latch circuit ADL1 is performed without going through the bus LBUS.

7-1. Configuration of Sense Unit 13

Figure 49:
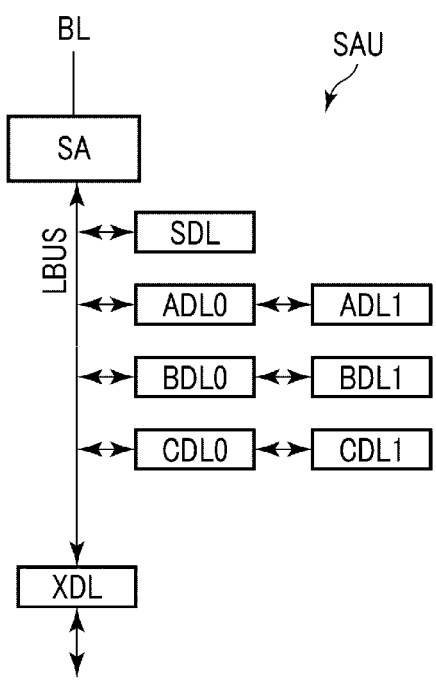
FIG. 49 is a block diagram of a sense unit according to a seventh embodiment.

FIG. 49 is a block diagram of the sense unit 13 according to the seventh embodiment. In FIG. 49, one sense amplifier unit SAU connected to any bit line BL is extracted and illustrated. All the sense amplifier units SAU in the sense unit 13 have the configuration illustrated in FIG. 49.

The data latch circuit ADL0 is connected to the bus LBUS. The data latch circuit ADL1 is connected in series to the data latch circuit ADL0 without going through the bus LBUS.

The data latch circuit BDL0 is connected to the bus LBUS. The data latch circuit BDL1 is connected in series to the data latch circuit BDL0 without going through the bus LBUS.

The data latch circuit CDL0 is connected to the bus LBUS. The data latch circuit CDL1 is connected in series to the data latch circuit CDL0 without going through the bus LBUS.

Figure 50:
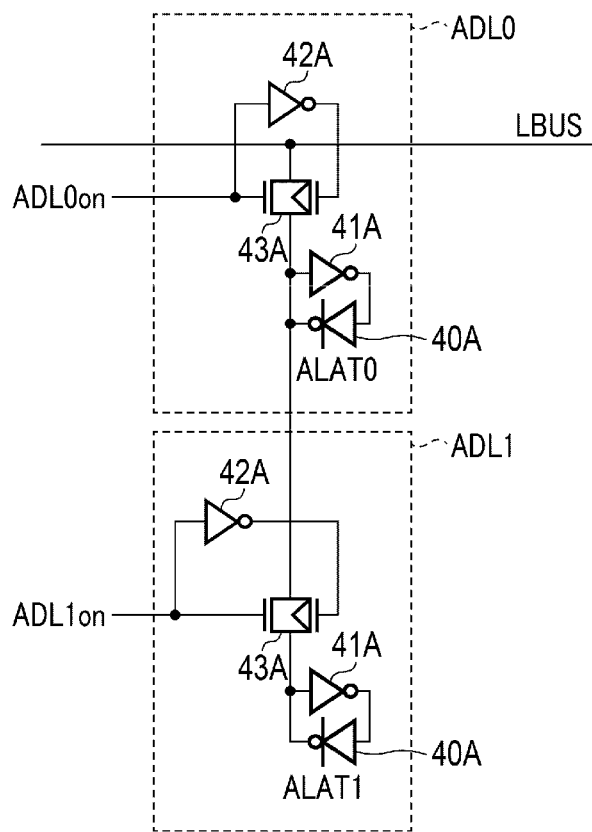
FIG. 50 is a circuit diagram of data latch circuits illustrated in FIG. 49.

FIG. 50 is a circuit diagram of data latch circuits ADL0 and ADL1 illustrated in FIG. 49. The data latch circuits BDL0 and BDL1 and the data latch circuits CDL0 and CDL1 have the same configuration as that in FIG. 50.

The circuit configurations of the data latch circuits ADL0 and ADL1 are the same as those in FIG. 47. The output terminal of the clocked inverter circuit 40A of the data latch circuit ADL0 is connected to the first terminal of the transfer gate 43A of the data latch circuit ADL1.

The data latch circuit ADL0 can latch data of the bus LBUS by appropriately controlling the signal ADL0on and the signal ALAT0. The data latch circuit ADL1 can latch the data stored in the data latch circuit ADL0 by appropriately controlling the signal ADL1on and the signal ALAT1.

7-2. Effects of Seventh Embodiment

According to the seventh embodiment, data copy from the data latch circuit ADL0 to the data latch circuit ADL1 can be performed while data stored in the data latch circuit ADL0 is being used (for example, while data is being transferred from the data latch circuit ADL0 to the bus LBUS). The same applies to the data latch circuits BDL0 and CDL0. With this configuration, the data copy operation between the data latch circuits can be hidden, for example, in the write operation. As a result, it is possible to prevent deterioration in write performance.

Data copy from the data latch circuit ADL0 to the data latch circuit ADL1, data copy from the data latch circuit BDL0 to the data latch circuit BDL1, and data copy from the data latch circuit CDL0 to the data latch circuit CDL1 can be performed in parallel. With this configuration, the time required for data copy between the data latch circuits can be shortened.

8. Eighth Embodiment

In the eighth embodiment, the sense unit 13 includes a first latch group, a second latch group, and a third latch group. The foggy/fine program is optimally executed while transferring data in the order of the bus LBUS, the first latch group, the second latch group, the third latch group, and the bus LBUS.

8-1. Configuration of Sense Unit 13

Figure 51:
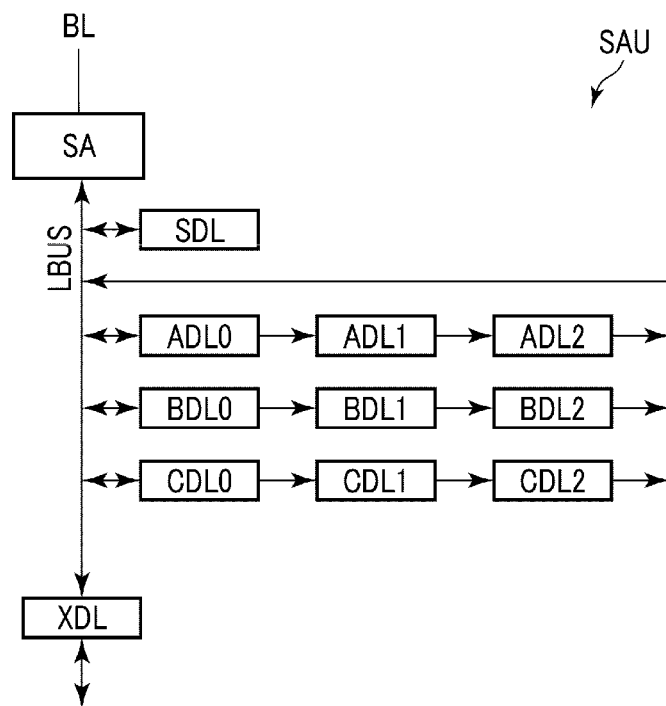
FIG. 51 is a block diagram of a sense unit according to an eighth embodiment.

FIG. 51 is a block diagram of the sense unit 13 according to an eighth embodiment. In FIG. 51, one sense amplifier unit SAU connected to any bit line BL is extracted and illustrated. All the sense amplifier units SAU in the sense unit 13 have the configuration illustrated in FIG. 51.

The sense amplifier unit SAU includes data latch circuits ADL0 to ADL2, data latch circuits BDL0 to BDL2, data latch circuits CDL0 to CDL2, and a data latch circuit SDL. The data latch circuits ADL0, BDL0, and CDL0 are also referred to as the first latch group, the data latch circuits ADL1, BDL1, and CDL1 are also referred to as the second latch group, and the data latch circuits ADL2, BDL2, and CDL2 are also referred to as the third latch group.

The data latch circuits ADL0 to ADL2 have a first-in first-out (FIFO) structure. The data latch circuit ADL0 is connected to the bus LBUS. Data on the bus LBUS is transferred in the order of the data latch circuit ADL0, the data latch circuit ADL1, and the data latch circuit ADL2. The data latch circuit ADL2 is connected to the bus LBUS, and the data stored in data latch circuit ADL2 is transferred to bus LBUS.

Similarly, each of the data latch circuits BDL0 to BDL2 and the data latch circuits CDL0 to CDL2 has the FIFO structure. In other words, the first latch group, the second latch group, and the third latch group have the first-in first-out (FIFO) structure.

Figure 52:
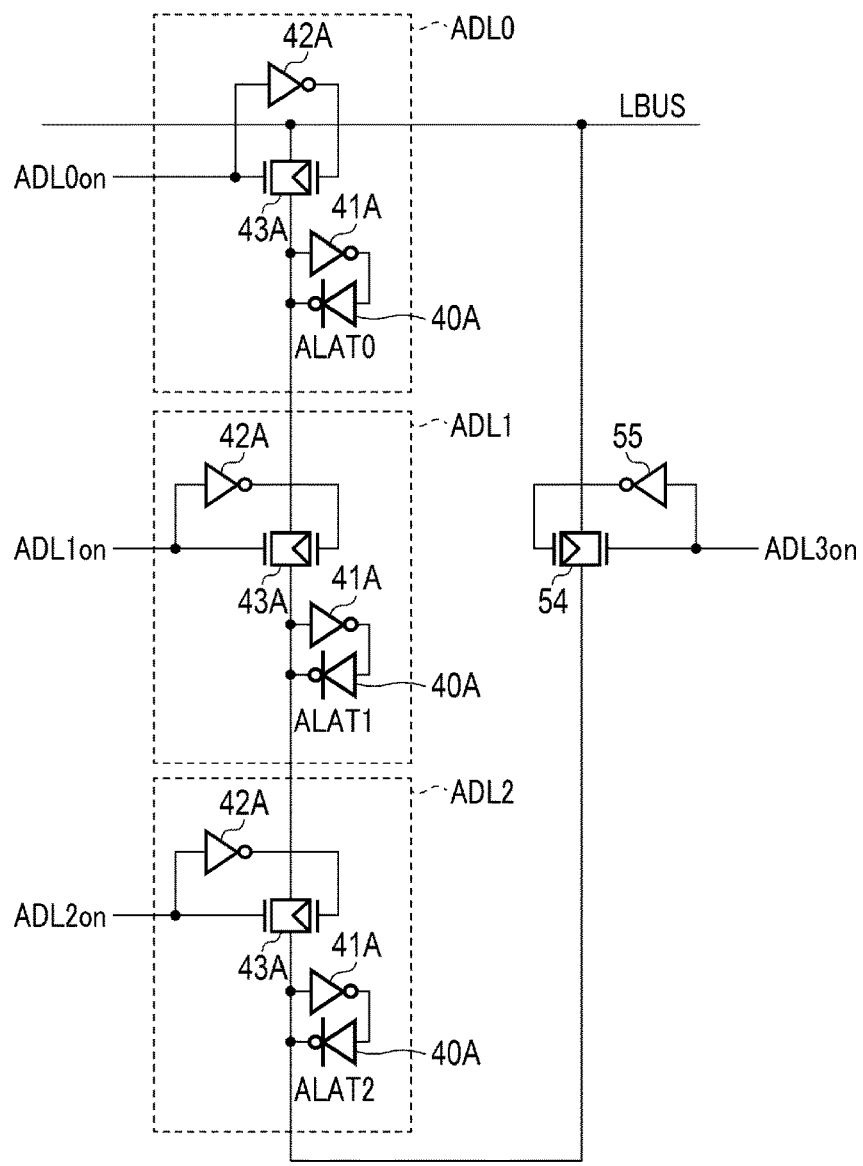
FIG. 52 is a circuit diagram of data latch circuits illustrated in FIG. 51.

FIG. 52 is a circuit diagram of the data latch circuits ADL0 to ADL2 illustrated in FIG. 51. The data latch circuits BDL0 to BDL2 and the data latch circuits CDL0 to CDL2 have the same configuration as that of FIG. 52.

The circuit configuration of the data latch circuits ADL0 and ADL1 is the same as that of FIG. 50. The circuit configuration of the data latch circuit ADL2 is the same as that of the data latch circuit ADL0. The output terminal of the clocked inverter circuit 40A of the data latch circuit ADL1 is connected to the first terminal of the transfer gate 43A of the data latch circuit ADL2. The signal ADL2on is input from the logic circuit 50 to the first clock terminal of the transfer gate 43A of the data latch circuit ADL2. The signal ALAT2 is input from the logic circuit 50 to the clock terminal of the clocked inverter circuit 40A of the data latch circuit ADL2.

The output terminal of the clocked inverter circuit 40A of the data latch circuit ADL2 is connected to the first terminal of the transfer gate 54. The second terminal of the transfer gate 54 is connected to the bus LBUS. The signal ADL3on is input from the logic circuit 50 to the first gate terminal of the transfer gate 54 and the input terminal of the inverter circuit 55. The output terminal of the inverter circuit 55 is connected to the second gate terminal of the transfer gate 54. The transfer gate 54 is turned ON when the signal ADL3on is at the high level.

The data latch circuits ADL0 to ADL2 configured in this way may transfer data in the order of the bus LBUS, the data latch circuit ADL0, the data latch circuit ADL1, the data latch circuit ADL2, and the bus LBUS by appropriately controlling the signals ALAT0, ALAT1, ALAT2, ADL0on, ADL1on, ADL2on, and ADL3on.

8-2. Operation of Memory System 1

Figure 53:
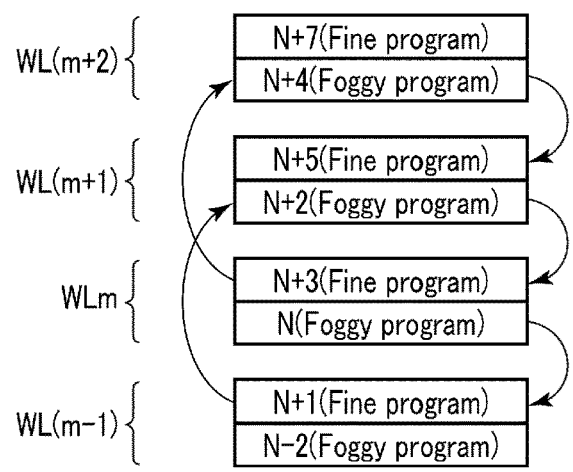
FIG. 53 is a schematic diagram for showing a writing order of a foggy/fine program.

First, a writing order of the foggy/fine program will be described. FIG. 53 is a schematic diagram for showing the writing order of the foggy/fine program. FIG. 53 illustrates the writing order of the word lines WL(m−1) to WL(m+2). In each word line WL in FIG. 53, the lower square represents the foggy program and the upper square represents the fine program. The numerical value including "N" in FIG. 53 represents the writing order.

Basically, after performing the foggy program of the first word line, the state machine 28 performs the fine program of the second word line adjacent to the first word line. Specifically, as illustrated in FIG. 53, the state machine 28 executes the write operation in the order of (1) the N-th program (foggy) of the word line WLm, (2) the (N+1)-th program (fine) of the word line WL(m−1), (3) the (N+2)-th program (foggy) of the word line WL (m+1), (4) the (N+3)-th program (fine) of the word line WLm, and (5) the (N+4)-th program (foggy) of the word line WL (m+2), and (6) the (N+5)-th program (fine) of the word line WL(m+1).

Figure 54:
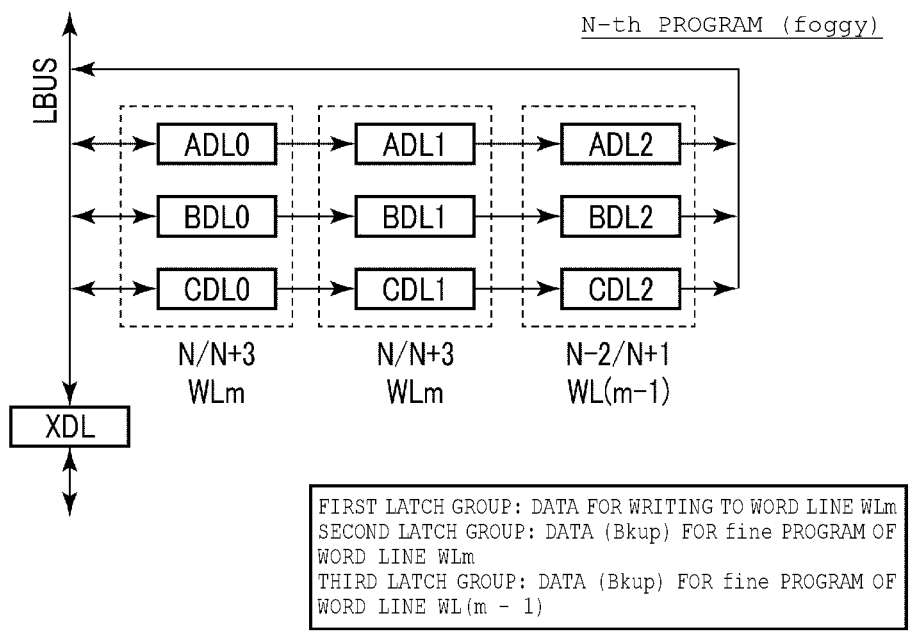
FIG. 54 is a diagram for showing an operation of a data latch circuit in an N-th program.

FIG. 54 is a diagram for showing the operation of the data latch circuit in the N-th program (foggy). The first latch group stores data for writing to the word line WLm, which is temporarily stored in the data latch circuit XDL via the bidirectional bus IO from the memory controller 200 and then transferred via the bus LBUS. The state machine 28 executes the N-th program using the data stored in the first latch group. The second latch group stores data for the fine program (backup data (indicated as "Bkup" in FIG. 54)) of the word line WLm. The third latch group stores data for the fine program (backup data) of the word line WL(m−1). Here, the data of the third latch group is sent from the memory controller 200 in the process before the operation described in this embodiment, and is stored and transferred to the third latch group at the time of starting the N-th program.

Figure 55:
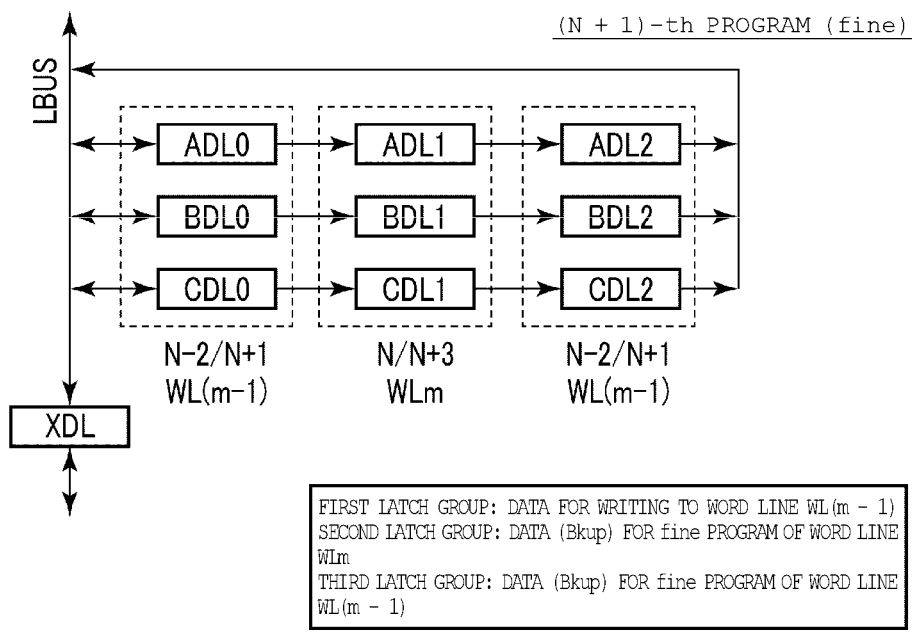
FIG. 55 is a diagram for showing the operation of the data latch circuit in an (N+1)-th program.

FIG. 55 is a diagram for showing the operation of the data latch circuit in the (N+1)-th program (fine). The first latch group stores data for writing to the word line WL(m−1) transferred from the third latch group. The state machine 28 executes the (N+1)-th program using the data stored in the first latch group. The second latch group stores data (backup data) for the fine program of the word line WLm. The third latch group stores data (backup data) for the fine program of the word line WL(m−1).

Figure 56:
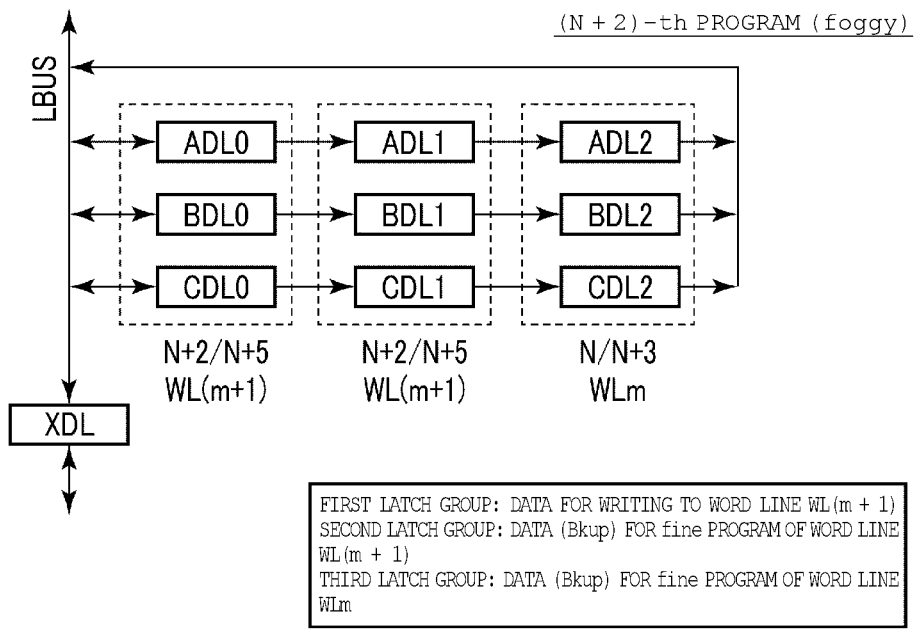
FIG. 56 is a diagram for showing the operation of the data latch circuit in an (N+2)-th program.

FIG. 56 is a diagram for showing the operation of the data latch circuit in the (N+2)-th program (foggy). The first latch group stores data for writing to the word line WL(m+1), which is temporarily stored in the data latch circuit XDL via the bidirectional bus IO from the memory controller 200 and then transferred via the bus LBUS. The state machine 28 executes the (N+2)-th program using the data stored in the first latch group. The second latch group stores data for the fine program (backup data) of the word line WL(m+1). The third latch group stores data for the fine program (backup data) of the word line WLm.

Figure 57:
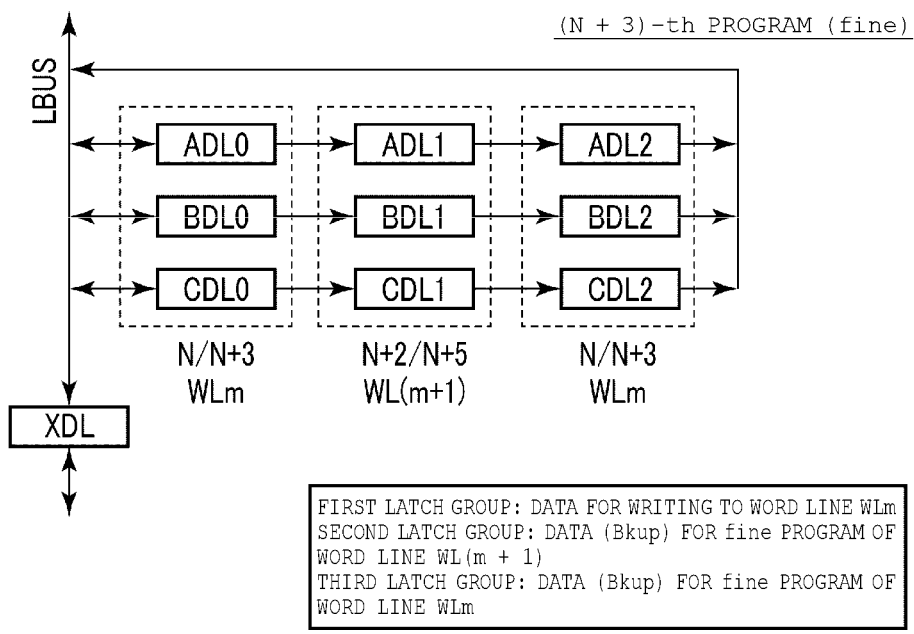
FIG. 57 is a diagram for showing the operation of the data latch circuit in an (N+3)-th program.

FIG. 57 is a diagram for showing the operation of the data latch circuit in the (N+3)-th program (fine). The first latch group stores data for writing to the word line WLm transferred from the third latch group. The state machine 28 executes the (N+3)-th program using the data stored in the first latch group. The second latch group stores data for the fine program (backup data) of the word line WL(m+1). The third latch group stores data for the fine program (backup data) of the word line WLm.

Figure 58:
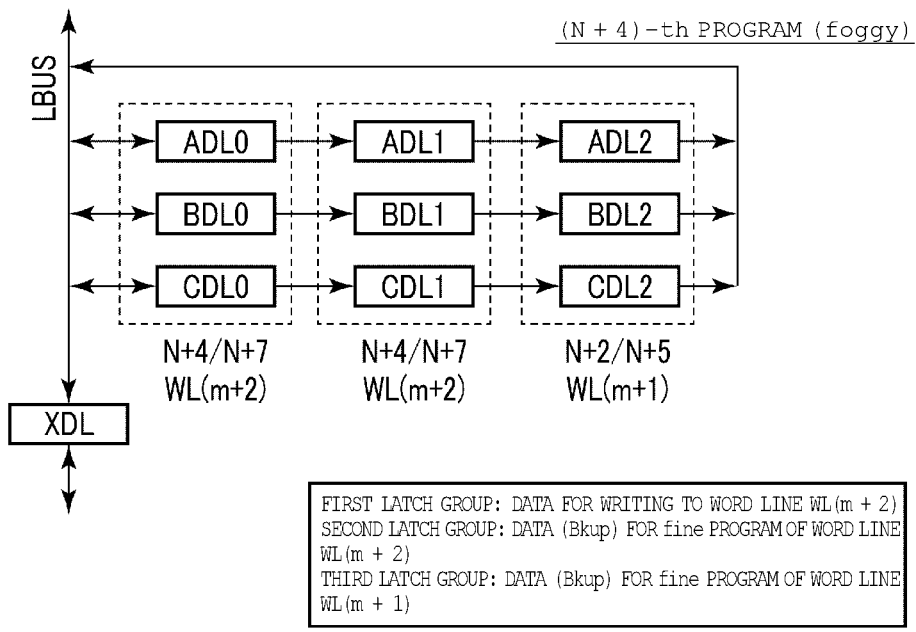
FIG. 58 is a diagram for showing the operation of the data latch circuit in an (N+4)-th program.

FIG. 58 is a diagram for showing the operation of the data latch circuit in the (N+4)-th program (foggy). The first latch group stores data for writing to the word line WL(m+2), which is temporarily stored in the data latch circuit XDL via the bidirectional bus IO from the memory controller 200 and then transferred via the bus LBUS. The state machine 28 executes the (N+4)-th program using the data stored in the first latch group. The second latch group stores data (backup data) for the fine program of the word line WL(m+2). The third latch group stores data (backup data) for the fine program of the word line WL(m+1).

As described above, data may be transferred in the order of the bus LBUS, the first latch group, the second latch group, the third latch group, and the bus LBUS, and the write operation may be executed in the order illustrated in FIG. 53.

8-3. Operation of Sense Unit 13

Figure 59:
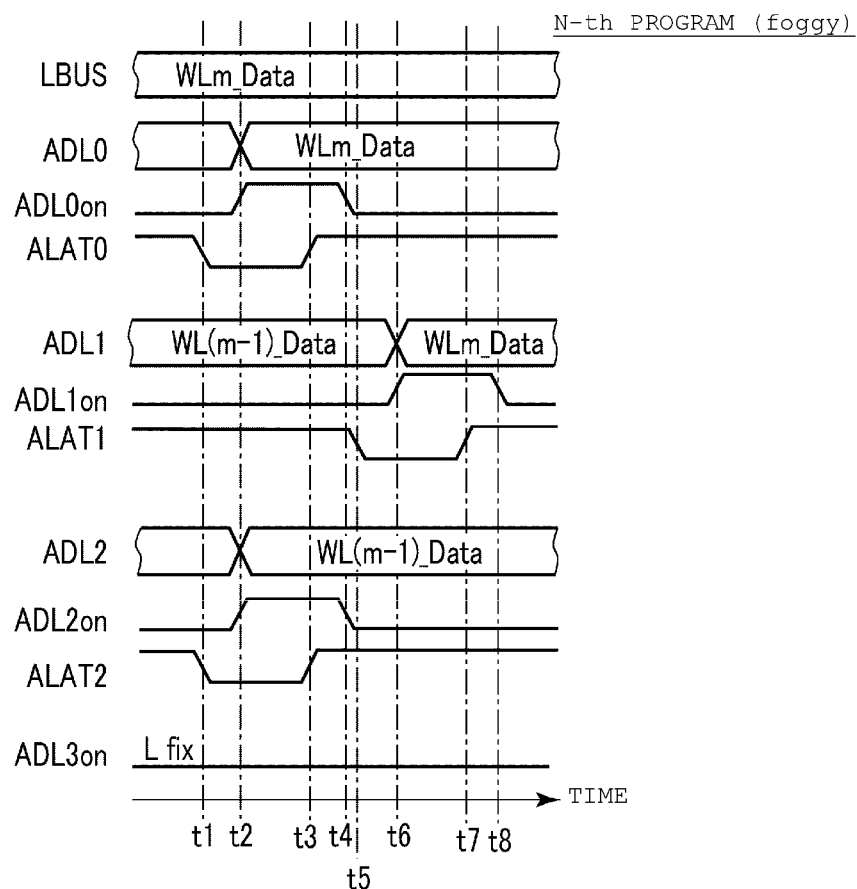
FIG. 59 is a timing diagram for showing the operation of the sense unit in the N-th program.

Next, the operation of the sense unit 13 will be described. FIG. 59 is a timing diagram for showing the operation of the sense unit 13 in the N-th program. In FIG. 59, write data for the word line WL (m−1) is denoted as "WL (m−1) Data", and write data for the word line WLm is denoted as "WLm Data".

At time t1, the logic circuit 50 sets the signal ALAT0 and the signal ALAT2 to a low level. At time t2, the logic circuit 50 sets the signal ADL0on and the signal ADL2on to a high level. With this configuration, the data latch circuit ADL0 stores the data WLm Data of the bus LBUS. The data latch circuit ADL2 stores the data WL(m−1)_Data transferred from the data latch circuit ADL1.

At time t3, the logic circuit 50 sets the signal ALAT0 and the signal ALAT2 to the high level. At time t4, the logic circuit 50 sets the signal ADL0on and the signal ADL2on to the low level.

At time t5, the logic circuit 50 sets the signal ALAT1 to the low level. At time t6, the logic circuit 50 sets the signal ADL1on to the high level. With this configuration, the data latch circuit ADL1 stores the data WLm Data transferred from the data latch circuit ADL0. At this time, the data in the N-th program is stored in the sense unit 13. The state machine 28 executes the N-th program using the data stored in the first latch group.

Figure 60:
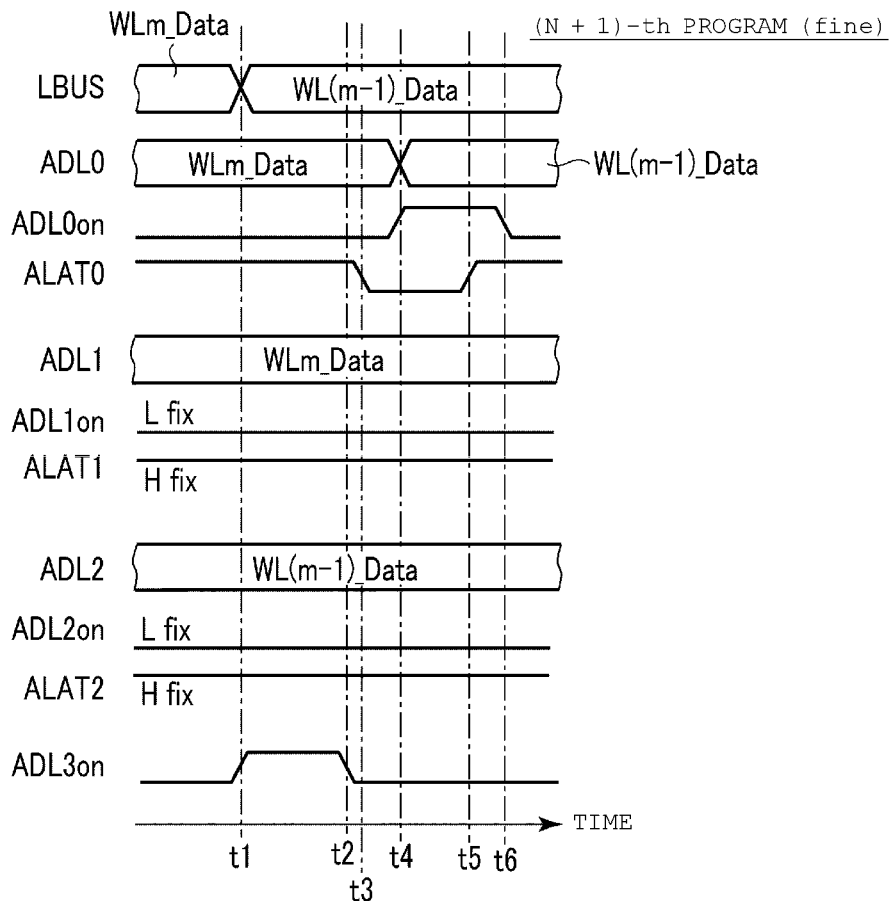
FIG. 60 is a timing diagram for showing the operation of the sense unit in the (N+1)-th program.

FIG. 60 is a timing diagram for showing the operation of the sense unit 13 in the (N+1)-th program.

At time t1, the logic circuit 50 sets the signal ADL3on to the high level. With this configuration, the data WL(m−1) _Data of the data latch circuit ADL2 is transferred to the bus LBUS. At time t2, the logic circuit 50 sets the signal ADL3on to the low level.

At time t3, the logic circuit 50 sets the signal ALAT0 to the low level. At time t4, the logic circuit 50 sets the signal ADL0on to the high level. With this configuration, the data latch circuit ADL0 stores the data WL(m−1) Data of the bus LBUS. At this time, the data in the (N+1)-th program is stored in the sense unit 13. The state machine 28 executes the (N+1)-th program using the data stored in the first latch group.

The operation of copying data between the data latch circuits may be automatically performed by the state machine 28 after the lower page, the middle page, and the upper page are stored in the data latch circuit, or may be performed based on the copy command "CP" from the memory controller 200.

8-4. Effects of Eighth Embodiment

In the eighth embodiment, the sense unit 13 includes the first latch group (data latch circuits ADL0, BDL0, and CDL0), the second latch group (data latch circuits ADL1, BDL1, and CDL1) and the third latch group (data latch circuits ADL2, BDL2, CDL2), and the first latch group, the second latch group, and the third latch group have a FIFO structure. Write data can be transferred in the order of the bus LBUS, the first latch group, the second latch group, the third latch group, and the bus LBUS. Then, the foggy program and the fine program can be executed using the write data stored in the first latch group.

In the fine program, re-input of write data is not necessary. With this configuration, when the fine program is executed after the foggy program, the write operation can be speeded up.

9. Ninth Embodiment

The ninth embodiment is an example in which soft bit information is generated by performing hard bit read and soft bit read as a read operation.

9-1. Outline of Read Operation

In the read operation according to the ninth embodiment, hard bit read and soft bit read can be performed.

In the hard bit read, a read operation is performed under normal conditions in accordance with a command. The hard bit read is the same read operation as normal read.

In the soft bit read, a read operation is performed under conditions (for example, a read voltage different from that of the hard bit read) different from normal, read in accordance with a command. In the soft bit read, a read operation is performed using a plurality of read voltages.

The state machine 28 performs a logical operation using the result of the soft bit read, and generates soft bit information as the logical operation result.

9-2. Configuration of Sense Unit 13

Figure 61:
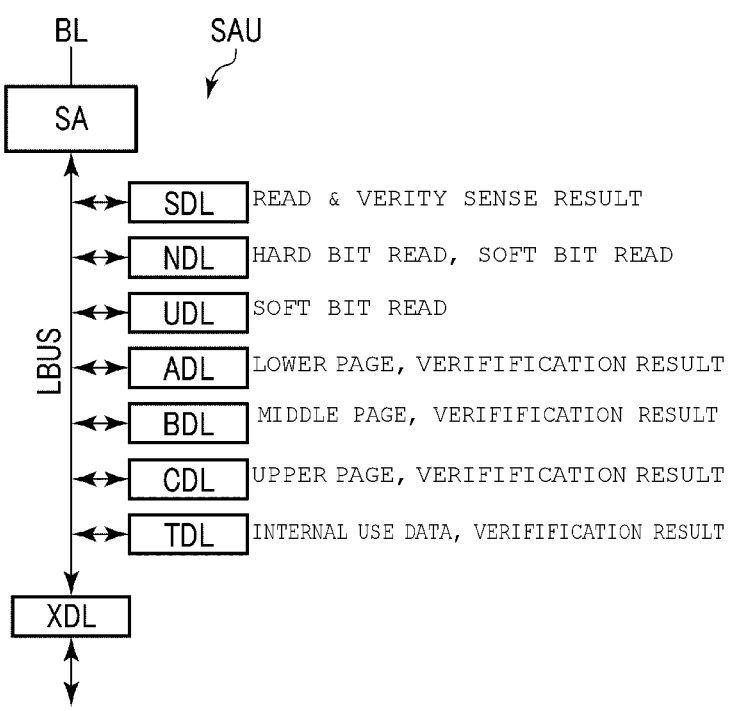
FIG. 61 is a block diagram of a sense unit according to a ninth embodiment.

FIG. 61 is a block diagram of the sense unit 13 according to the ninth embodiment. In FIG. 61, one sense amplifier unit SAU connected to any bit line BL is extracted and illustrated. All the sense amplifier units SAU in the sense unit 13 have the configuration illustrated in FIG. 61. The sense amplifier unit SAU may have other configurations without being limited to the configuration of FIG. 61.

The sense amplifier unit SAU includes a sense amplifier SA and seven data latch circuits ADL, BDL, CDL, SDL, TDL, NDL, and UDL. The sense amplifier SA and the data latch circuits ADL, BDL, CDL, SDL, TDL, NDL, and UDL are connected via a bus LBUS so that data can be transferred to each other.

The data latch circuit SDL stores, for example, a sense result in the read operation, and also stores a sense result in the verification operation. The data latch circuit ADL stores the lower page and stores the verification result. The data latch circuit BDL stores the middle page and stores the verification result. The data latch circuit CDL stores the upper page and stores the verification result. The data latch circuit TDL stores data (internal use data) for performing an operation in the sense amplifier unit SAU, and stores the verification result. The data latch circuit NDL stores data read by the hard bit read or soft bit read. The data latch circuit UDL stores data read by the soft bit read.

9-3. Operation of Memory System 1

FIG. 62 is a diagram for showing a command sequence of the hard bit read. The hard bit read is the same as the normal read operation (normal read).

In the hard bit read, the memory controller 200 issues a prefix command "Y", a preset command "PSC", a read command "00h", an address set "C1, C2, R1 to R3", and an execution command "30h" to the NAND flash memory 100.

The prefix command "Y" is a command for designating one of the data latch circuits NDL and UDL in the hard bit read and soft bit read. Details of the prefix command "Y" will be described later. The preset command "PSC" is a command for designating any of a lower page, a middle page, and an upper page.

After receiving the execution command "30h", the state machine 28 sets the ready/busy signal RBn to a low level. Then, the state machine 28 executes the hard bit read.

The prefix command "Y" may be omitted. The hard bit read without the prefix command "Y" corresponds to a normal read operation (normal read). Any of the lower page, the middle page, and the upper page may be designated by the address set "C1 and C2, and R1 to R3". In this case, the preset command "PSC" is omitted.

FIG. 63 is a diagram for showing a command sequence of the soft bit read. In the soft bit read, the memory controller 200 issues the prefix command "Y", the prefix command "SB", the preset command "PSC", the read command "00h", the address set "C1 and C2, and R1 to R3", and the execution command "30h" to the NAND flash memory 100. The prefix command "SB" is a command for designating the soft bit read.

After receiving the execution command "30h", the state machine 28 sets the ready/busy signal RBn to the low level. Then, the state machine 28 executes the soft bit read.

When the soft bit read is designated, the prefix command "Y" may be omitted.

FIG. 64 is a schematic diagram for showing the operation of the data latch circuit. In FIG. 64, five cases are illustrated. "HB" in FIG. 64 represents the hard bit read, and "SB" in FIG. 64 represents the soft bit read.

In the overall write operation, the data latch circuit ADL stores the lower page (denoted as "Program (lower)" in FIG. 64) for a program, the data latch circuit BDL stores the middle page (denoted as "Program (middle)" in FIG. 64) for the program, the data latch circuit CDL stores the upper page (denoted as "Program (upper)" in FIG. 64) for the program, and the data latch circuit TDL stores internal use data (denoted as "Program (internal)" in FIG. 64).

Case 1 is the hard bit read without the prefix command "Y" and corresponds to the normal read operation (normal read). In case 1, the read operation is performed without using the data latch circuits NDL and UDL. The result of the hard bit read is stored in the data latch circuit XDL, and is not stored in the data latch circuits other than the data latch circuit XDL. Data in the data latch circuit XDL is overwritten by the next read operation.

Case 2 is an operation in which, for example, "08h" is set as the prefix command "Y" and the hard bit read is implemented. In Case 2, the state machine 28 stores the hard bit read result in the data latch circuit NDL. The result of the hard bit read is stored in the data latch circuit NDL until the next use of the data latch circuit NDL. The result of the hard bit read may be reused as necessary, and may be output to the outside of the NAND flash memory via the data latch circuit XDL using a known command.

Case 3 is the soft bit read without the prefix command "Y". In case 3, the read operation is performed without using the data latch circuits NDL and UDL. The result of the soft bit read is stored in the data latch circuit XDL, and is not stored in the data latch circuits other than the data latch circuit XDL. Data in the data latch circuit XDL is overwritten by the next read operation.

Case 4 is an operation in which, for example, "08h" is set as the prefix command "Y" and the soft bit read is performed. In Case 4, the state machine 28 stores the result of the soft bit read in the data latch circuit NDL. The result of the soft bit read is stored in the data latch circuit NDL until the next use of the data latch circuit NDL. The result of the soft bit read may be reused as necessary, and may be output to the outside of the NAND flash memory via the data latch circuit XDL using a known command.

Case 5 is an operation in which, for example, "09h" is set as the prefix command "Y" and the soft bit read is performed. In case 5, the state machine 28 stores the result of the soft bit read in the data latch circuit UDL. The result of the soft bit read is stored in the data latch circuit UDL until the next use of the data latch circuit UDL. The result of the soft bit read may be reused as necessary, and may be output to the outside of the NAND flash memory via the data latch circuit XDL using a known command.

In case 5, it is possible to store the result of hard bit read in the data latch circuit NDL and store the result of soft bit read in the data latch circuit UDL. That is, the sense unit 13 may simultaneously store the hard bit read result and the soft bit read result.

When the hard bit read result of the data latch circuit NDL and the soft bit read result of the data latch circuit UDL performed a plurality of times are referred to after the case 5 is implemented, the same hard bit read result is always referred to. In case 1 and the like, it is necessary to acquire (read) the hard bit read result every time, but in this case, it is not necessary.

9-4. Effects of Ninth Embodiment

In the related art, there are restrictions on the number of data latch circuits, and soft bit information is generated by superimposing (calculating) the soft bit read result on the hard bit read result, and the hard bit read result does not remain in the data latch circuit, for example. When it becomes necessary to reuse the result of the hard bit read later, it is necessary to perform the hard bit read again, and the time required for the hard bit read deteriorates read performance.

In the ninth embodiment, it is possible to select a data latch circuit that stores the hard bit read result and the soft bit read result while storing the write data in the data latch circuits ADL, BDL, and CDL. It is also possible to store both the hard bit read result and the soft bit read result in the data latch circuits NDL and UDL. With this configuration, read performance can be improved.

10. Tenth Embodiment

The tenth embodiment is an example relating to a structure of the NAND flash memory 100.

10-1. Structure of NAND Flash Memory 100

Figure 65:
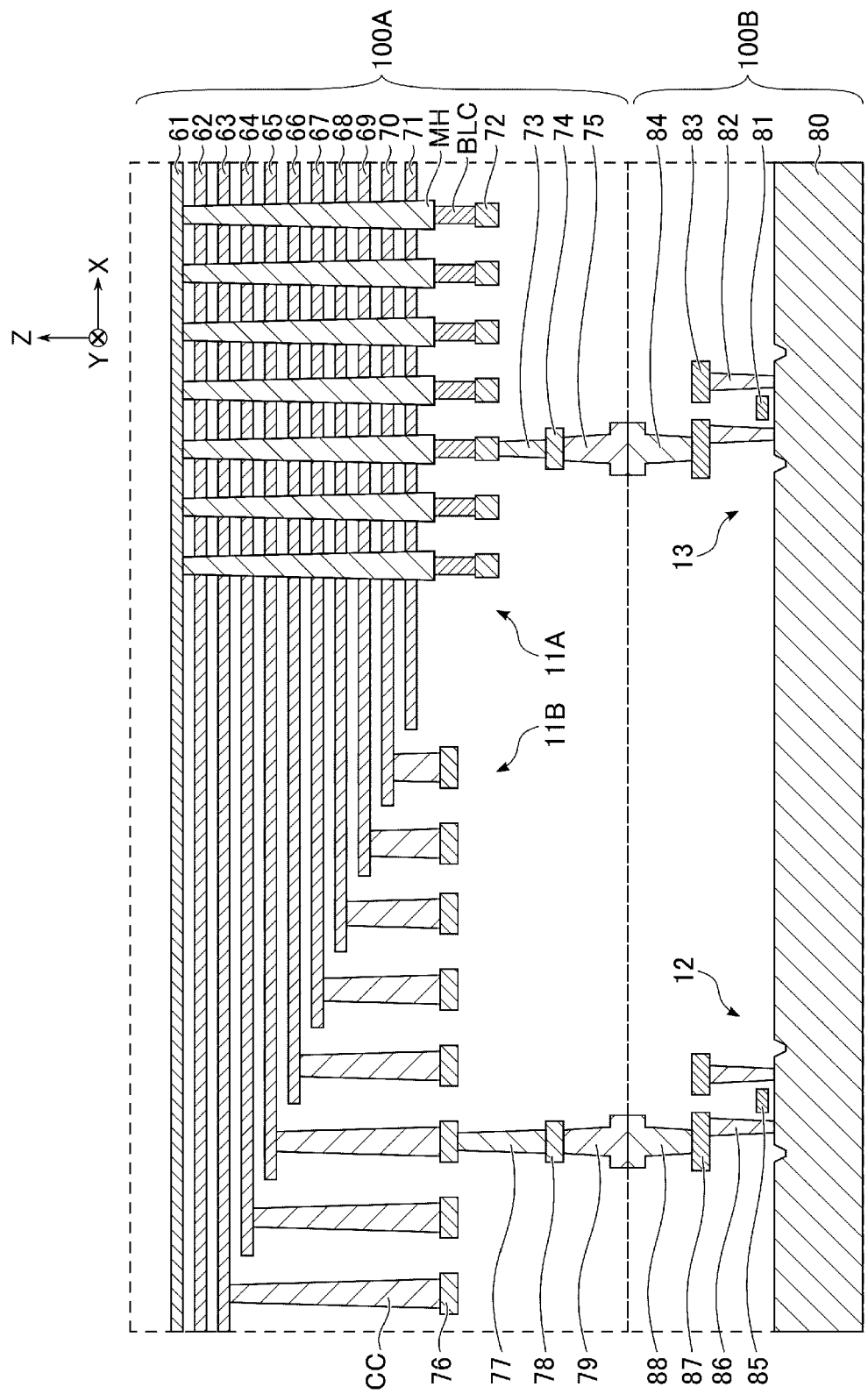
FIG. 65 is a diagram illustrating an example of a cross-sectional structure of a NAND flash memory according to a tenth embodiment.

FIG. 65 is a diagram illustrating an example of a cross-sectional structure of the NAND flash memory 100 according to the tenth embodiment. In each cross-sectional view used in the following description, hatching of an interlayer insulating film is omitted. The NAND flash memory 100 includes a memory chip 100A and a circuit chip 100B, and the memory chip 100A is provided on the circuit chip 100B.

First, a structure of the memory chip 100A will be described. The memory chip 100A includes a cell array region 11A in which a plurality of memory cells are provided, and a hookup region 11B for extracting a wiring from the cell array region 11A.

In the memory chip 100A, conductors 61 to 71 are provided via an insulator in order from the uppermost layer. The conductors 61 to 71 are each formed in a plate shape spreading in the X-direction and the Y-direction. For example, the conductors 61 to 71 each extend from the cell array region 11A to the hookup region 11B, and are formed in a staircase shape in the hookup region 11B. The conductor 61 functions as a source line SL. The conductor 62 functions as a select gate line SGS. The conductors 63 to 70 function as word lines WL0 to WL7, respectively. The conductor 71 functions as a select gate line SGD.

A plurality of memory pillars MH are provided to pass through the conductors 71 to 62 so as to reach the lower surface of the conductor 61 from the lower surface of the conductor 71. A conductive contact plug BLC is provided on the lower surface of each memory pillar MH. A conductor 72 is provided on the lower surface of each contact plug BLC. Each conductor 72 is formed in a line shape extending in the Y-direction and functions as a bit line BL. One conductor 72 is electrically connected to one memory pillar MH in each string unit SU. Details of the memory pillar MH will be described later.

When attention is focused on one bit line BL, a conductive contact plug 73 is provided on the lower surface of the conductor 72 functioning as the bit line BL. A conductor 74 is provided on the lower surface of the contact plug 73. A conductive bonding portion 75 is provided on the lower surface of the conductor 74. As the bonding portion 75, for example, copper is used.

With such a configuration, one bonding portion 75 and one bit line BL are electrically connected. The same applies to the other bit lines BL, which are connected to different sets of contact plugs 73, conductors 74, and bonding portions 75 in regions not illustrated.

In the hookup region 11B, below the conductor 61, a plurality of conductors 76 are provided, for example, corresponding to the number of contact plugs CC. For example, a contact plug CC is provided on the lower surface of the conductor 65 corresponding to the word line WL2, and a conductor 76 corresponding to the word line WL2 is provided on the lower surface of the contact plug CC. Similarly, the contact plug CC corresponding to various wirings is formed so as to be electrically connected to the corresponding conductor among the stacked conductors 62 to 71 and insulated from the other conductors.

When attention is focused on the conductor 76 corresponding to the word line WL2, a contact plug 77 is provided on the lower surface of the conductor 76. A conductor 78 is provided on the lower surface of the contact plug 77. A bonding portion 79 is provided on the lower surface of the conductor 78. As the bonding portion 79, for example, copper is used.

With such a configuration, one bonding portion 79 and one word line WL are electrically connected. The same applies to the conductors 76 corresponding to the other word lines WL, the select gate line SGS, and the select gate line SGD, and the conductors 76 are connected to different sets of contact plugs 77, conductors 78, and bonding portions 79 in regions not illustrated.

Next, a structure of the circuit chip 100B will be described. In the circuit chip 100B, the sense unit 13 is provided below the cell array region 11A, and the row decoder 12 is provided below the hookup region 11B.

The circuit chip 100B includes a semiconductor substrate 80. A conductor 81 is provided on the semiconductor substrate 80 in the sense unit 13 region via an insulating film. The conductor 81 functions as a gate electrode to form a metal oxide semiconductor field effect transistor (MOSFET) having source/drain regions and the like. The source/drain regions of the transistor are connected to different conductors 83 via contact plugs 82, respectively. On one conductor 83, a bonding portion 84 is provided. As the bonding portion 84, for example, copper is used.

One bonding portion 75 is provided on the bonding portion 84, and the bonding portion 84 and the bonding portion 75 are electrically connected. That is, one bit line BL in the memory chip 100A is connected to the corresponding transistor in the sense unit 13 via the bonding portions 75 and 84. The sense unit 13 includes a plurality of transistors in a region (not illustrated), and the plurality of transistors are electrically connected to different bit lines BL via sets of different conductors 83 and bonding portions 84, respectively.

A conductor 85 is provided on the semiconductor substrate 80 in the region of the row decoder 12 via an insulating film. The conductor 85 functions as a gate electrode, and a MOSFET having source/drain regions and the like is formed. The source/drain regions of the transistor are connected to different conductors 87 through contact plugs 86, respectively. On one conductor 87, a bonding portion 88 is provided. As the bonding portion 88, for example, copper is used.

One bonding portion 79 is provided on the bonding portion 88, and the bonding portion 88 and the bonding portion 79 are electrically connected. That is, for example, one word line WL in the memory chip 100A is connected to the corresponding transistor in the row decoder 12 via the bonding portions 79 and 88. The row decoder 12 includes a plurality of transistors in a region not illustrated, and each of the plurality of transistors is electrically connected to another word line WL, the select gate line SGS, and the select gate line SGD via a set of different conductors 87 and bonding portions 88.

Figure 66:
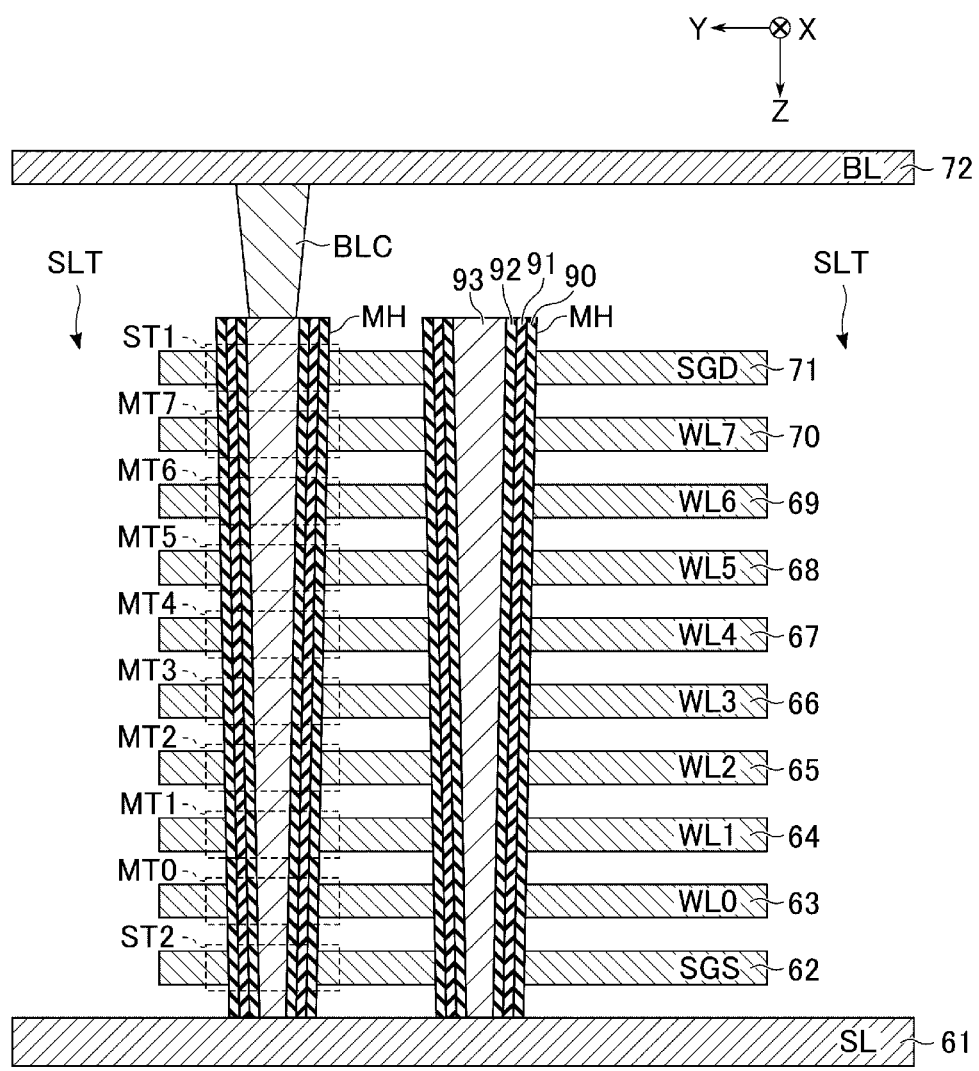
FIG. 66 is a cross-sectional view of a part of a region of the memory cell array.

Next, an example of a more detailed cross-sectional structure of the memory cell array 11 will be described. FIG. 66 is a cross-sectional view of a part of a region of the memory cell array 11. The cross-section illustrated in FIG. 66 corresponds to the cross-section along the Y-direction in FIG. 65, and is illustrated in such a way that the Z-direction is inverted with respect to FIG. 65.

A structure corresponding to one string unit SU is provided between adjacent slits SLT as illustrated in FIG. 66. The slit SLT extends in the X-direction and the Z-direction, and insulates between the conductors 62 to 71 provided in the adjacent string units SU.

The memory pillar MH includes, for example, a block insulating film 90, a charge storage layer 91, a tunnel insulating film 92, and a conductive semiconductor layer 93. Specifically, the block insulating film 90 is formed on the inner wall of the memory hole that forms the memory pillar MH. The charge storage layer 91 is formed on the inner wall of the block insulating film 90. The tunnel insulating film 92 is formed on the inner wall of the charge storage layer 91. The semiconductor layer 93 is formed inside the tunnel insulating film 92, and is embedded, for example. The semiconductor layer 93 is a region where a channel of the NAND string NS is formed. An insulating layer penetrating the semiconductor layer 93 in the Z-direction may be provided in the middle of the semiconductor layer 93.

As the tunnel insulating film 92, for example, silicon oxide ($SiO_2$) is used. As the charge storage layer 91, for example, silicon nitride (SiN) is used. As the block insulating film 90, for example, silicon oxide is used. As the semiconductor layer 93, for example, polycrystalline silicon is used.

A portion where the memory pillar MH and the conductor 62 intersect functions as a select transistor ST2. The portions where the memory pillars MH and the conductors 63 to 70 intersect function as memory cell transistors MT0 to MT7, respectively. A portion where the memory pillar MH and the conductor 71 intersect functions as the select transistor ST1.

10-2. Effects of Tenth Embodiment

In the tenth embodiment, the memory cell array 11 and peripheral circuits thereof can be formed by individual chips. That is, the NAND flash memory 100 includes the memory chip 100A and the circuit chip 100B. The memory chip 100A includes the memory cell array 11. The circuit chip 100B includes peripheral circuits, specifically, the row decoder 12, the sense unit 13, and the like.

With this configuration, a circuit area of the sense unit 13 can be increased. Therefore, the sense unit 13 may include more latch circuits.

11. Modification Example

The number of data latch circuits (excluding data latch circuits SDL and XDL) is not limited to those of the embodiments described above, and may be changed as appropriate. When the number of data latch circuits is larger, the number of prefix commands corresponding to the number of data latch circuits may be set so that the data latch circuits can be identified. The above methods for implementing the embodiments are non-limiting examples. In short, it is only necessary to change the data latch circuit to be used by various commands given by the memory controller and to freely designate the data latch circuit to be used appropriately in the corresponding operation as needed.

In the embodiments described above, the case where one memory cell stores 3-bit data has been described as an example, but is not limited thereto. The embodiments described above may be applied to a system in which one memory cell stores one bit. The embodiments may also be applied to a method in which one memory cell stores a plurality of bits other than three bits.

The embodiments described above may be applied to both a planar NAND flash memory in which memory cells are arranged two-dimensionally and a three-dimensional stacked NAND flash memory in which memory cells are arranged two-dimensionally.

In the embodiments described above, the structure of the memory cell array may be other structures. Other configurations of the memory cell array are described, for example, in U.S. patent application Ser. No. 12/407,403, filed Mar. 19, 2009, entitled "Three-dimensionally stacked nonvolatile semiconductor memory." Other configurations of the memory cell array are described, for example, in U.S. patent application Ser. No. 12/406,524, filed Mar. 18, 2009, entitled "Three-dimensionally stacked nonvolatile semiconductor memory," and U.S. patent application Ser. No. 12/679,991, filed Mar. 25, 2010, entitled "Nonvolatile semiconductor memory device and method of manufacturing the same." Other configurations of the memory cell array are described, for example, in U.S. patent application Ser. No. 12/532,030, filed Mar. 23, 2009, entitled "Semiconductor memory and its manufacturing method." These patent applications are hereby incorporated by reference in their entirety.

In the embodiments described above, the block BLK may not be an erase unit. Other erasing operations are described in each of U.S. patent application Ser. No. 13/235,389, filed on Sep. 18, 2011, entitled "Nonvolatile Semiconductor Memory Device," and U.S. patent application Ser. No. 12/694,690, filed on Jan. 27, 2010, entitled "Nonvolatile Semiconductor Memory Device." These patent applications are hereby incorporated by reference in their entirety.

In this specification, "connection" indicates that the elements are electrically connected, and does not exclude, for example, that another element is interposed therebetween.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device including:
a memory string;
a sense amplifier connected to the memory string through a bit line;
a signal line connected to the sense amplifier;
a first latch including a first input and a first output, the first input of the first latch connected to the signal line;
a second latch including a second input and a second output, the second input of the second latch connected to the first output of the first latch; and
a third latch including a third input and a third output, the third input of the third latch connected to the second output of the second latch, the third output of the third latch connected to the signal line.

2. The memory device of claim 1, further comprising:
a controller configured to:
cause the first latch to store, during a first time period, a first page of first data that is being written in a first memory cell of the memory string through a foggy write operation,
cause the second latch to store, during the first time period, the first page of the first data to be written in the first memory cell of the memory string through a fine write operation, and
cause the third latch to store, during the first time period, a first page of second data to be written in a second memory cell of the memory string through the fine write operation.

3. The memory device of claim 2, wherein the controller is further configured to:
cause the first latch to store, during a second time period after the first time period, the first page of the second data that is being written in the second memory cell of the memory string through the fine write operation.

4. The memory device of claim 3, wherein the controller is further configured to:
cause the first latch to receive, after the first time period, the first page of the second data from the third latch to store the first page of the second data therein during the second time period.

5. The memory device of claim 3, wherein the controller is further configured to:
cause the second latch to store, during the second time period, the first page of the first data to be written in the first memory cell of the memory string through the fine write operation, and
cause the third latch to store, during the second time period, the first page of the second data to be written in the second memory cell of the memory string through the fine write operation.

6. The memory device of claim 2, wherein the first memory cell of the memory string and the second memory cell of the memory string are adjacent to each other.

7. The memory device of claim 1, further comprising:
a fourth latch including a fourth input and a fourth output, the fourth input of the fourth latch connected to the signal line;
a fifth latch including a fifth input and a fifth output, the fifth input of the fifth latch connected to the fourth output of the fourth latch; and
a sixth latch including a sixth input and a sixth output, the sixth input of the sixth latch connected to the fifth output of the fifth latch, the sixth output of the sixth latch connected to the signal line.

8. The memory device of claim 7, further comprising:
a controller configured to:
cause the first latch to store, during a first time period, a first page of first data that is being written in a first memory cell of the memory string through a foggy write operation,
cause the second latch to store, during the first time period, the first page of the first data to be written in the first memory cell of the memory string through a fine write operation,
cause the third latch to store, during the first time period, a first page of second data to be written in a second memory cell of the memory string through the fine write operation,
cause the fourth latch to store, during the first time period, a second page of the first data that is being written in the first memory cell of the memory string through the foggy write operation,
cause the fifth latch to store, during the first time period, the second page of the first data to be written in the first memory cell of the memory string through the fine write operation, and
cause the sixth latch to store, during the first time period, a second page of the second data to be written in the second memory cell of the memory string through the fine write operation.

9. The memory device of claim 8, wherein the controller is further configured to:
cause the first latch to store, during a second time period after the first time period, the first page of the second data that is being written in the second memory cell of the memory string through the fine write operation,
cause the second latch to store, during the second time period, the first page of the first data to be written in the first memory cell of the memory string through the fine write operation,
cause the third latch to store, during the second time period, the first page of the second data to be written in the second memory cell of the memory string through the fine write operation,
cause the fourth latch to store, during the second time period, the second page of the second data that is being written in the second memory cell of the memory string through the fine write operation, cause the fifth latch to store, during the second time period, the second page of the first data to be written in the first memory cell of the memory string through the fine write operation, and
cause the sixth latch to store, during the second time period, the second page of the second data to be written in the second memory cell of the memory string through the fine write operation.
10. The memory device of claim 9, wherein the controller is further configured to:
cause the first latch to receive, during the second time period, the first page of the second data from the third latch, and
cause the fourth latch to receive, during the second time period, the second page of the second data from the sixth latch.
11. The memory device of claim 1,
wherein the sense amplifier, the first latch, the second latch, and the third latch are disposed in a first integrated circuit, and
wherein the memory string is disposed in a second integrated circuit above the first integrated circuit.
12. The memory device of claim 1,
wherein the second input of the second latch is directly connected to the first output of the first latch, and
wherein the third input of the third latch is directly connected to the second output of the second latch.
13. A device including:
a sense amplifier to apply a voltage to a bit line to store data in one or more memory cells in a memory string coupled to the bit line;
a signal line connected to the sense amplifier;
a first latch including a first input and a first output, the first input of the first latch connected to the signal line;
a second latch including a second input and a second output, the second input of the second latch connected to the first output of the first latch; and
a third latch including a third input and a third output, the third input of the third latch connected to the second output of the second latch, the third output of the third latch connected to the signal line.
14. The device of claim 13, further comprising:
a controller configured to:
cause the first latch to store, during a first time period, a first page of first data that is being written in a first memory cell of the memory string through a foggy write operation,
cause the second latch to store, during the first time period, the first page of the first data to be written in the first memory cell of the memory string through a fine write operation, and
cause the third latch to store, during the first time period, a first page of second data to be written in a second memory cell of the memory string through the fine write operation.
15. The device of claim 14, wherein the controller is further configured to:
cause the first latch to store, during a second time period after the first time period, the first page of the second data that is being written in the second memory cell of the memory string through the fine write operation.
16. The device of claim 15, wherein the controller is further configured to:
cause the second latch to store, during the second time period, the first page of the first data to be written in the first memory cell of the memory string through the fine write operation, and
cause the third latch to store, during the second time period, the first page of the second data to be written in the second memory cell of the memory string through the fine write operation.
17. The device of claim 14, wherein the first memory cell of the memory string and the second memory cell of the memory string are adjacent to each other.
18. The device of claim 13, further comprising:
a fourth latch including a fourth input and a fourth output, the fourth input of the fourth latch connected to the signal line;
a fifth latch including a fifth input and a fifth output, the fifth input of the fifth latch connected to the fourth output of the fourth latch; and
a sixth latch including a sixth input and a sixth output, the sixth input of the sixth latch connected to the fifth output of the fifth latch, the sixth output of the sixth latch connected to the signal line.
19. The device of claim 18, further comprising:
a controller configured to:
cause the first latch to store, during a first time period, a first page of first data that is being written in a first memory cell of the memory string through a foggy write operation,
cause the second latch to store, during the first time period, the first page of the first data to be written in the first memory cell of the memory string through a fine write operation,
cause the third latch to store, during the first time period, a first page of second data to be written in a second memory cell of the memory string through the fine write operation,
cause the fourth latch to store, during the first time period, a second page of the first data that is being written in the first memory cell of the memory string through the foggy write operation,
cause the fifth latch to store, during the first time period, the second page of the first data to be written in the first memory cell of the memory string through the fine write operation, and
cause the sixth latch to store, during the first time period, a second page of the second data to be written in the second memory cell of the memory string through the fine write operation.
20. The device of claim 19, wherein the controller is further configured to:
cause the first latch to store, during a second time period after the first time period, the first page of the second data that is being written in the second memory cell of the memory string through the fine write operation,
cause the second latch to store, during the second time period, the first page of the first data to be written in the first memory cell of the memory string through the fine write operation,
cause the third latch to store, during the second time period, the first page of the second data to be written in the second memory cell of the memory string through the fine write operation,
cause the fourth latch to store, during the second time period, the second page of the second data that is being written in the second memory cell of the memory string through the fine write operation,
cause the fifth latch to store, during the second time period, the second page of the first data to be written in the first memory cell of the memory string through the fine write operation, and cause the sixth latch to store, during the second time period, the second page of the second data to be written in the second memory cell of the memory string through the fine write operation.

* * * * *